United States Patent [19]

Ishikawa et al.

[11] Patent Number: 4,888,808
[45] Date of Patent: Dec. 19, 1989

[54] DIGITAL EQUALIZER APPARATUS ENABLING SEPARATE PHASE AND AMPLITUDE CHARACTERISTIC MODIFICATION

[75] Inventors: Seiichi Ishikawa; Masaharu Matsumoto; Katsuaki Satoh; Akihisa Kawamura, all of Osaka, Japan

[73] Assignee: Matsushita Electric Industrial Co., Ltd., Osaka, Japan

[21] Appl. No.: 171,713

[22] Filed: Mar. 22, 1988

[30] Foreign Application Priority Data

| Mar. 23, 1987 | [JP] | Japan | 62-68410 |
| Mar. 23, 1987 | [JP] | Japan | 62-68413 |
| May 8, 1987 | [JP] | Japan | 62-113049 |
| May 8, 1987 | [JP] | Japan | 62-113054 |
| May 14, 1987 | [JP] | Japan | 62-117375 |
| May 14, 1987 | [JP] | Japan | 62-117376 |
| May 14, 1987 | [JP] | Japan | 62-117377 |
| May 14, 1987 | [JP] | Japan | 62-117378 |
| Dec. 17, 1987 | [JP] | Japan | 62-319452 |

[51] Int. Cl.$^4$ ............................................. H03G 5/00
[52] U.S. Cl. .................................... 351/103; 333/28 T
[58] Field of Search .................. 381/83, 93, 98, 103; 333/28 R, 28 T

[56] References Cited

U.S. PATENT DOCUMENTS 4,683,590 7/1987 Miyoshi et al. ..................... 381/83
4,751,739 6/1988 Serikawa et al. .................. 381/103

Primary Examiner—Forester W. Isen
Attorney, Agent, or Firm—Pollock, Vande Sande & Priddy

[57] ABSTRACT

A digital equalizer for audio system applications is based on a FIR (finite impulse response) digital filter whose amplitude and phase/frequency characteristics can be respectively independently established in accordance with input data representing an arbitrary amplitude/frequency characteristic and input phase data from which an arbitrary phase/frequency characteristic for the filter can be derived. In addition to audio frequency response equalization, the apparatus can be provided with a microphone howl suppression function.

31 Claims, 53 Drawing Sheets

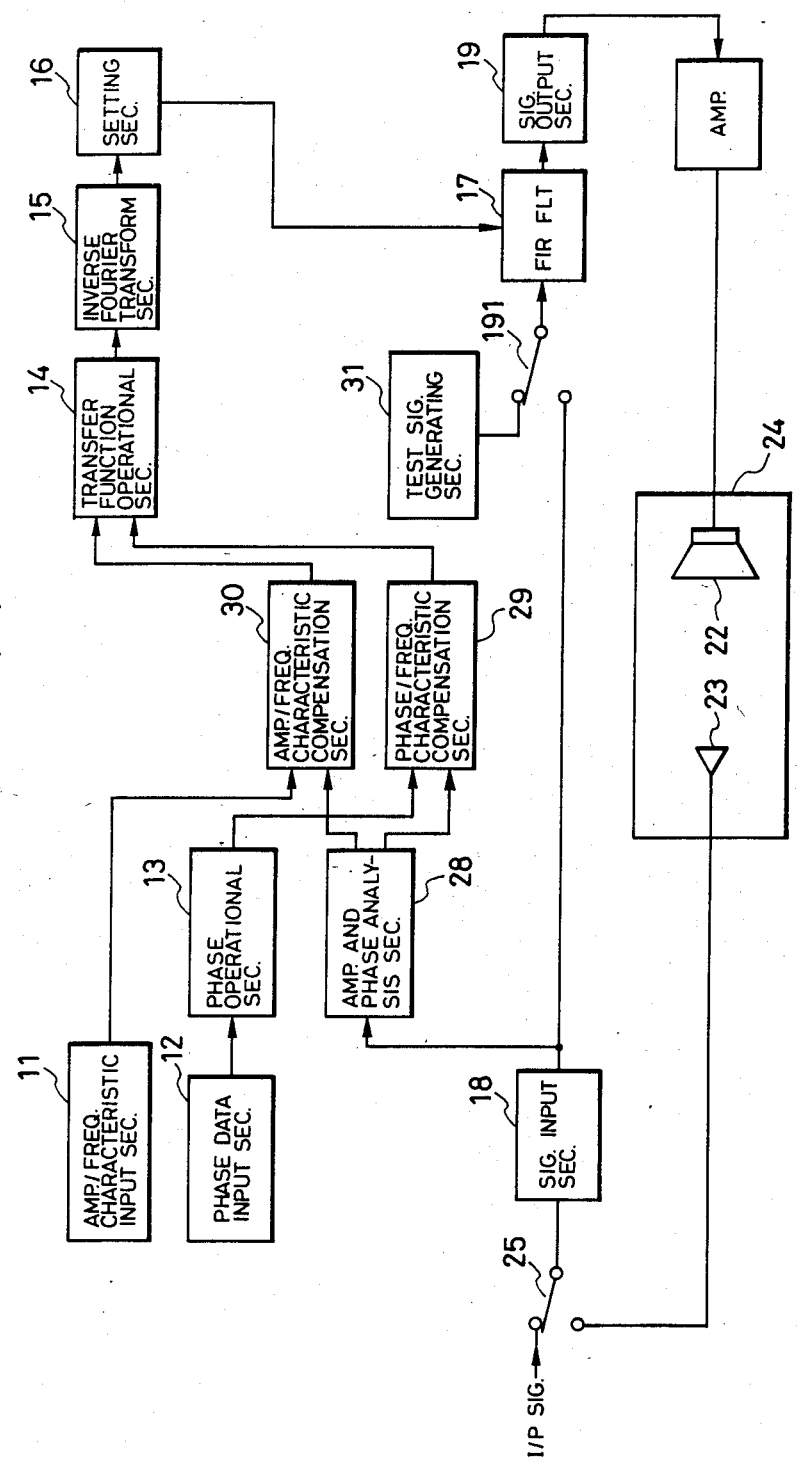
F I G. 16(A)

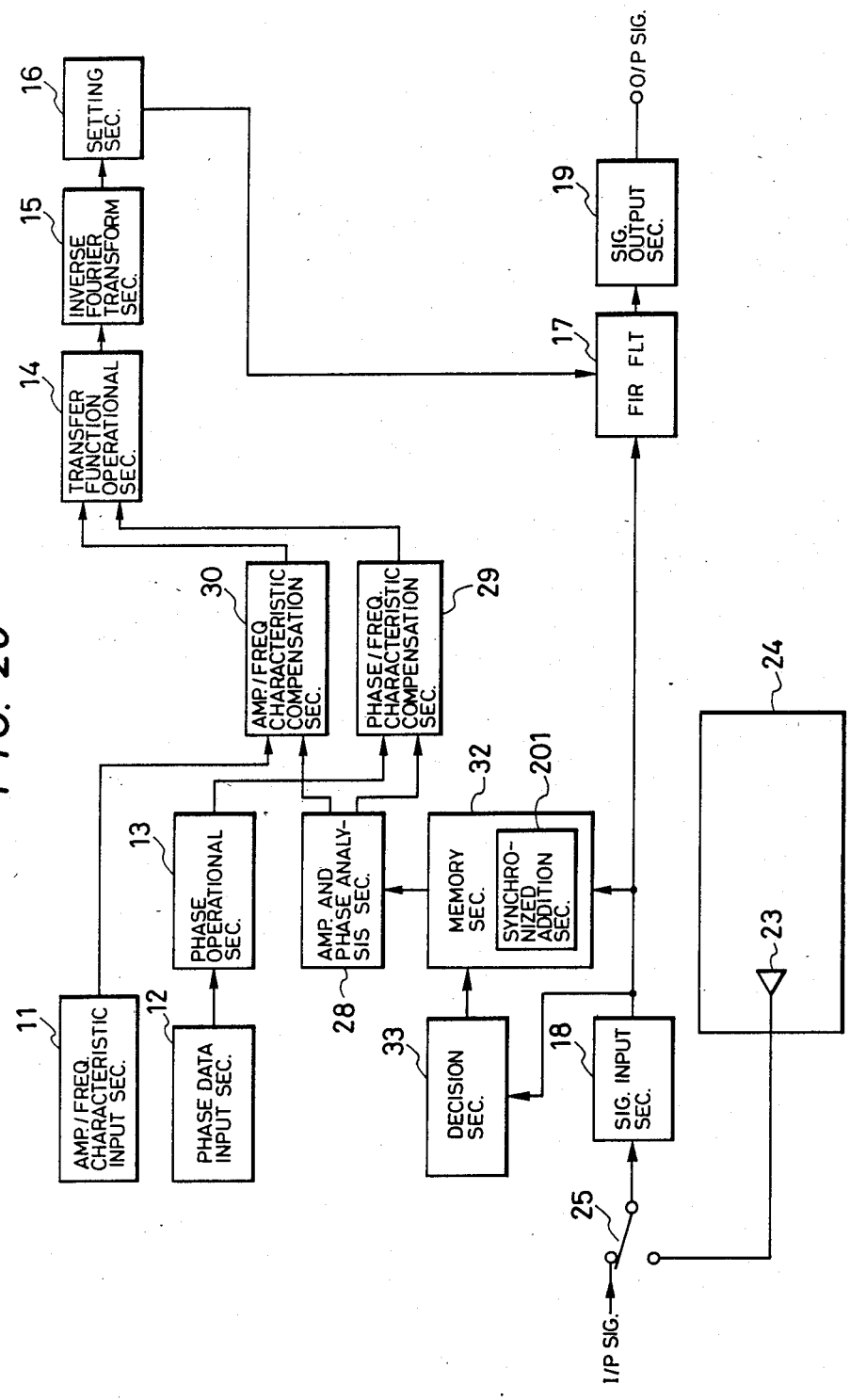

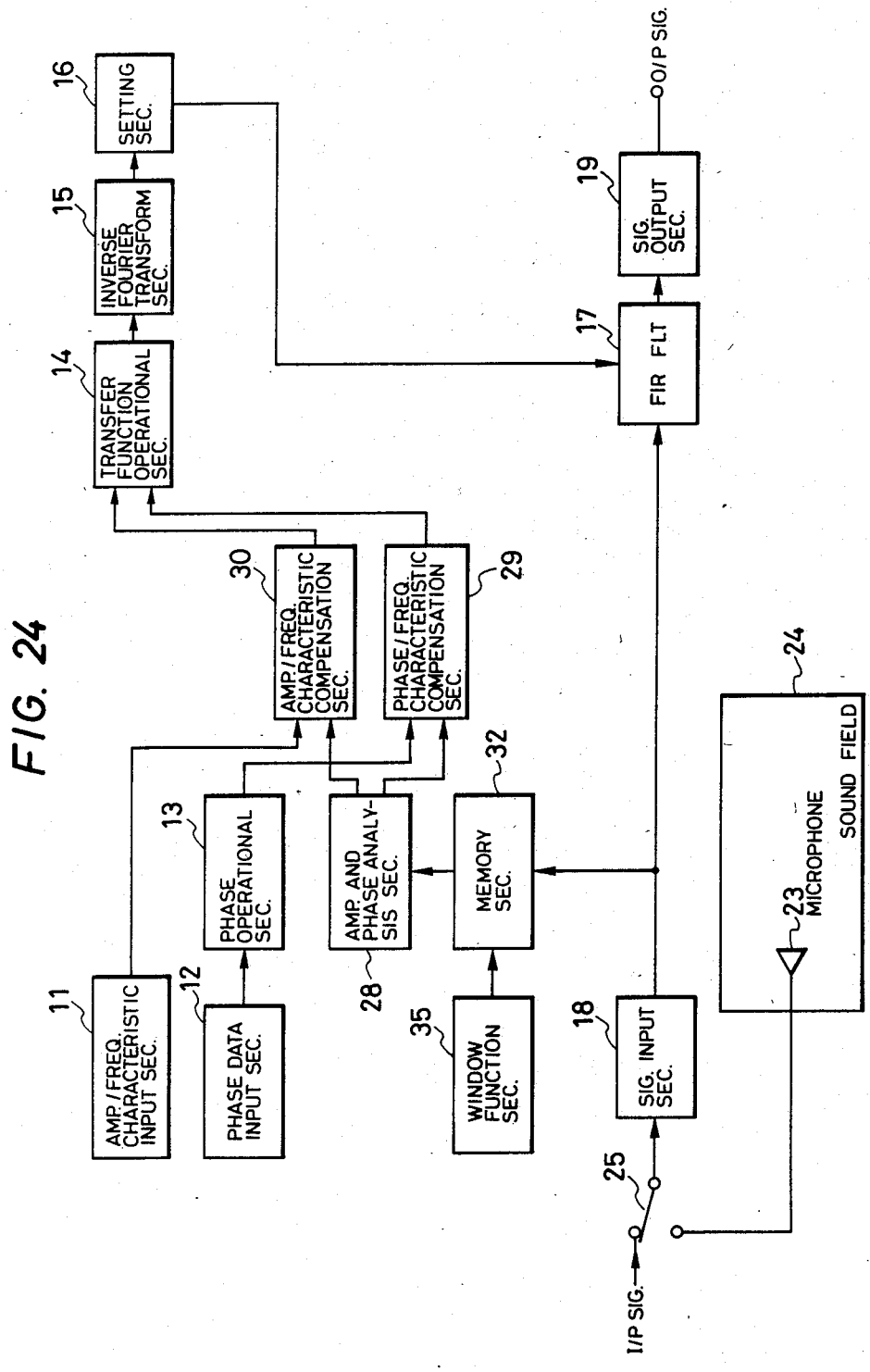

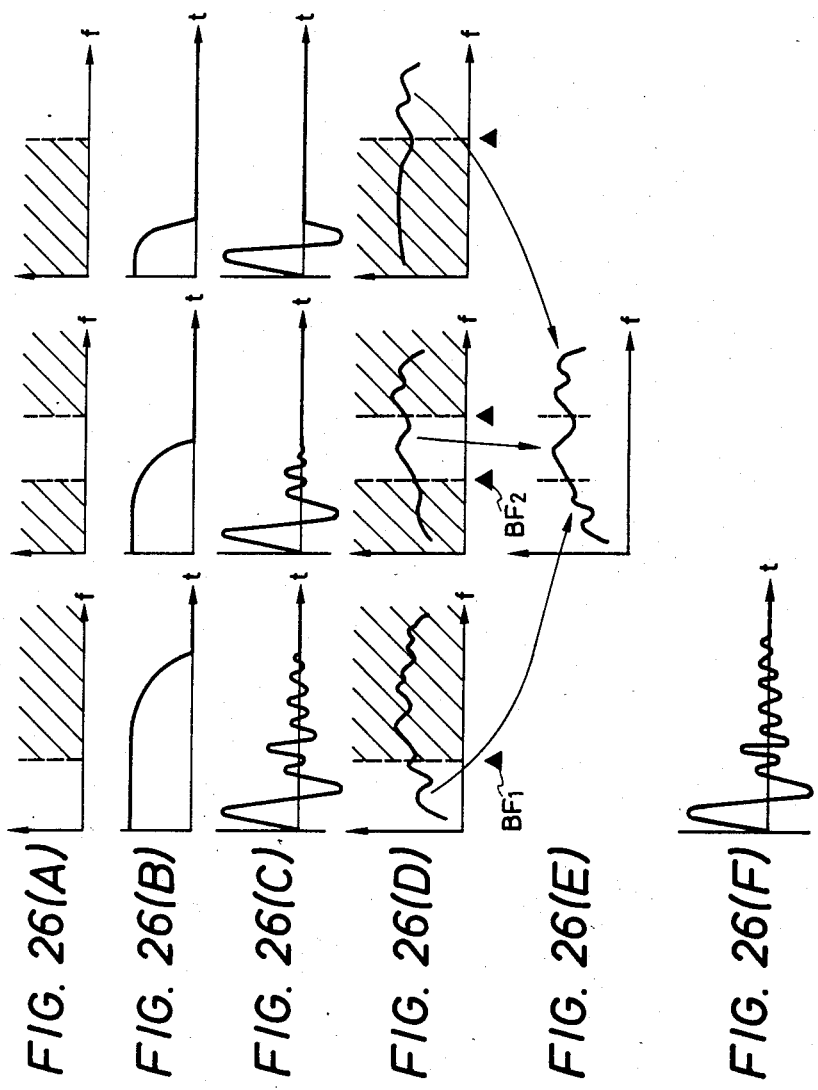

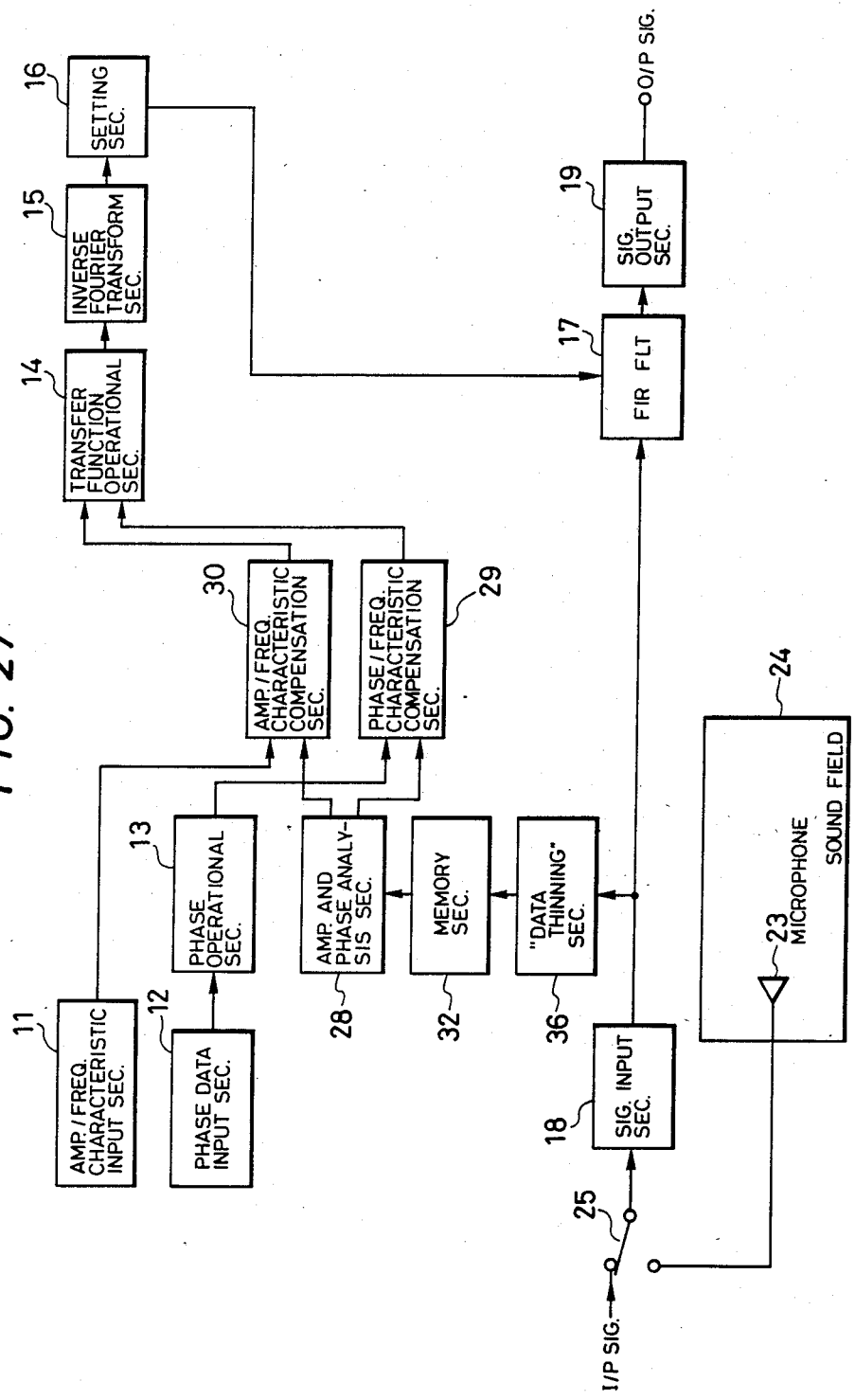

TRANSFER CHARACTERISTIC

INPULSE RESPONSE t

⊗ CONVOLUTION t

= t

DIGITAL EQUALIZER APPARATUS ENABLING SEPARATE PHASE AND AMPLITUDE CHARACTERISTIC MODIFICATION

BACKGROUND OF THE INVENTION

The present invention relates to a digital equalizer apparatus incorporating a digital filter for frequency compensation of an audio signal which has been converted to digital code sample form. In particular, the invention relates to such an apparatus which employs a FIR (finite impulse response) digital filter, and enables mutually independent adjustment of the amplitude/frequency and phase/frequency response characteristics of the filter.

With the equivalent of audio apparatus utilizing digital signals in recent years, digital equalizers have been developed based upon FIR filters. In the following, it will be assumed that a FIR filter is a transversal filter, i.e. a tapped delay line filter. However it should be noted that the present invention is not limited to such an FIR filter, and that other filter configurations can be utilized. The transfer function of such a digital transversal filter, determined by the amplitude/frequency characteristic and phase/frequency characteristic of the filter, is determined by the respective values of a plurality of filter coefficients (sometimes referred to as tap coefficients). Such an FIR filter has been utilized in the prior art for audio digital equalizer. However in the prior art it has not been possible to execute mutually independent control of the phase and amplitude response characteristics of such an audio equalizer by using a single FIR filter, i.e. for thereby independently modifying the amplitude/frequency characteristic and phase/frequency characteristic of a digital audio signal by transferring the signal through the FIR filter.

In addition to such audio equalizer applications, a digital equalizer apparatus based on a FIR filter can be adapted to various other functions, for example suppression of "howl" caused by acoustic feedback between a microphone and a loudspeaker.

FIG. 1 is a system block diagram of an example of a prior art digital equalizer apparatus based on a FIR filter. Numeral 1 denotes an amplitude/frequency characteristic input section, for input of data which represent an arbitrary amplitude/frequency characteristic that will be designated as $|H(\omega)|$. Numeral 5 denotes an inverse Fourier transform section which operates on the input amplitude/frequency characteristic as a transfer function, and derives the inverse Fourier transform of this transfer function. This inverse Fourier transform is an impulse response characteristic corresponding to the transfer function, as described hereinafter, and a set of values of filter coefficients respectively determined by that impulse response characteristic is thereby obtained. Numeral 6 denotes setting means for establishing these values of filter coefficients for a FIR filter 7, to thereby determine the desired amplitude/frequency characteristic for the filter. Numeral 8 denotes a signal input section for converting an input signal to suitable digital signal form to be processed by the FIR filter 7, and 9 denotes a signal output section for converting a digital output signal produced from the FIR filter 7 to a suitable form for transfer to external circuits.

Data representing the desired amplitude/frequency characteristic $|H(\omega)|$ are inputted through the amplitude/frequency characteristic data input section 1, as a set of amplitude values corresponding to respective frequencies, referred to in the following as sample frequencies. FIG. 2(A) shows an example of such an amplitude/frequency characteristic, in which these input amplitude values are indicated as black dots, with data being inputted only within a frequency range designated as 0 to $\pi$. As shown in FIG. 2(B), the desired amplitude/frequency characteristic in the range 0 to 2 can be derived by "folding over" the portion of the characteristic from 0 to $\pi$ and thereby obtaining the characteristic in the range $\pi$ to $2\pi$.

The amplitude/frequency characteristic in the range 0 to 2 thus obtained is applied to the inverse Fourier transform section 5, where the inverse Fourier transform is derived. More specifically, the amplitude/frequency characteristic $|H(\omega)|$ is treated as if it were the absolute amplitude portion of a transfer function $H(\omega)$, i.e.

$$H(\omega)=|H(\omega)| \qquad (1)$$

As is well known, the inverse Fourier transform of a transfer function (which is a complex function in the frequency domain) is a time domain function which represents the impulse response of the circuit having that transfer function. Thus, the inverse Fourier transform of the transfer function $H(\omega)$ is derived by the inverse Fourier transform section 5, to thereby obtain a desired impulse response for the FIR filter 7 corresponding to the input amplitude/frequency characteristic from input section 1. Since the respective values of filter coefficients of a transversal filter are inherently defined by corresponding values of the impulse response of the filter, the appropriate filter coefficient values for the FIR filter 7 are thereby determined. These values are then set in the FIR filter 7 by the setting section 6 (e.g. by control signals applied from section 6), so that the amplitude/frequency characteristic of the FIR filter 7 is thereby made identical to that inputted from input section 1.

The inverse Fourier transform is executed in accordance with the following equation:

$$h(n)=1/N\times\Sigma H(\omega)\times e^{j\omega h} \qquad (2)$$

In the above, $\omega=2\times\pi/N\times k$  $0\leq n\leq(N-1)$

The values h(n) obtained from equation (2) are the filter coefficients that are established for the FIR filter 7 by the setting section 6. The FIR filter 7 thereby realizes the specified amplitude/frequency characteristic. However the phase/frequency characteristic of the FIR filter 7 is determined by the transfer function of equation (1) above, and so is fixed as an inherently linear characteristic.

Thus with the prior art example of FIG. 1, although it is possible to realize an arbitrary shape of amplitude/frequency characteristic for the FIR filter 7, the phase/frequency characteristic of the filter is inherently defined by the filter coefficients to be linear. It is thus a disadvantage of such a prior art apparatus that it is not possible to mutually independently establish an arbitrary shape of phase/frequency characteristic and an arbitrary shape of amplitude/frequency characteristic, using a single FIR filter.

In addition to the above, problems also arise even if an equalizer apparatus is implemented which is capable of being adjusted to produce such arbitrary phase and amplitude responses (e.g. by using separate FIR filters for these responses). For example if it is desired that the FIR filter will realize the amplitude/frequency characteristic and phase/frequency characteristic of a specific circuit or system, then it is necessary to first measure that amplitude/frequency characteristic and phase/frequency characteristic of the circuit or system and to then input measured data representing the amplitude/frequency characteristic and the phase/frequency characteristic respectively to respective amplitude and phase input means. Moreover if it is desired to realize, using such a FIR filter apparatus, an amplitude/frequency characteristic and phase/frequency characteristic that have been computed, then there is no simple way of inputting that amplitude/frequency characteristic and phase/frequency characteristic for establishing the desired FIR filter response.

SUMMARY OF THE INVENTION

It is an objective of the present invention to provide a digital equalizer apparatus utilizing a FIR filter, whereby an arbitrary amplitude/frequency characteristic and an arbitrary phase/frequency characteristic for the filter can be established mutually independently.

It is a further objective of the present invention to provide a digital equalizer apparatus utilizing a FIR filter, whereby the amplitude/frequency characteristic and phase/frequency characteristic of the FIR filter can be easily modified to achieve compensation for frequency response characteristics of one or more components of an audio system.

It is a further objective of the present invention to provide a digital equalizer apparatus utilizing a FIR filter, whereby data representing a desired amplitude/frequency characteristic and phase/frequency characteristic for the FIR filter can be inputted to the digital equalizer apparatus in the form of parameters of a specific circuit having an amplitude/frequency characteristic and phase/frequency characteristic each of which is controlled by these parameters in a known manner, such as resonance-related parameters of a circuit exhibiting resonance at a single frequency.

It is a further objective of the present invention to provide a digital equalizer apparatus whereby an improved degree of frequency resolution for equalization is achieved over a frequency range extending down to substantially low values of frequency, while maintaining a high level of processing speed for operation of a FIR filter within the digital equalizer apparatus.

To achieve the above objectives, a digital equalizer apparatus according to the present invention comprises:

amplitude/frequency input means for inputting amplitude/frequency characteristic data representing an arbitrary amplitude/frequency characteristic;

phase data input means for inputting data for establishing a phase/frequency characteristic, said data being in a category selected from a group of categories of data which includes phase/frequency characteristic data group delay characteristic data, amplitude/frequency characteristic data, and data expressing a resonance condition of a predetermined type of electrical circuit;

phase/frequency operational means for computing phase/frequency characteristic data based upon said data from said phase data input means;

transfer function operational means for operating on said amplitude/frequency characteristic and phase/frequency characteristic data to derive transfer function data representing a transfer function;

inverse Fourier transform means for operating on said transfer function data to derive impulse response characteristic data representing an impulse response characteristic determined by said transfer function;

finite impulse response filter means signal input means for transferring to said finite impulse response filter means an input audio signal as a train of digital samples;

signal output means for receiving said audio signal after frequency characteristic modification of said audio signal by said finite impulse response filter means, and for transferring the modified audio signal to an external system; and, setting means operable for establishing a set of filter coefficients for said finite impulse response filter means having respective values determined by said impulse response characteristic.

In another aspect, with a digital equalizer apparatus according to the present invention as set out above, said data from said phase data input means represent a group delay characteristic, and said phase/frequency operational means comprises integrator means for integrating said group delay characteristic data with respect to frequency, for thereby deriving said phase/frequency characteristic to be supplied to said transfer function operational means.

In another aspect, with a digital equalizer apparatus according to the present invention as set out above, said finite impulse response filter means comprises a plurality of finite impulse response filters, and the apparatus further comprises:

a plurality of digital band-pass filters for dividing said digital sample signal from said signal input means into a plurality of frequency bands:

a plurality of down-sampling sections for receiving respective band-divided output signals from said band-pass filters for reducing the sampling frequency of said band-divided output signals by respectively differing reduction factors, and supplying resultant digital sample signals to respective ones of said plurality of finite impulse response filters.

BRIEF DESCRIPTION OF THE DRAWINGS

FIG. 16(A) is a system block diagram of an 11th embodiment of the present invention, which enables generation of test signals to drive a loudspeaker and sound field, and analysis of the resultant frequency response for executing equalization;

FIGS. 17, 18, 20, 22, 24, 27 and 28 are system block diagrams of 12th, 13th, 14th, 15th and 16th embodiments of the present invention respectively, enabling equalization for the acoustic characteristics of a sound field by analyzing a stored measurement signal waveform and modifying a FIR filter phase/frequency characteristic and amplitude/frequency characteristic accordingly;

DESCRIPTION OF PREFERRED EMBODIMENTS

Figure 1:
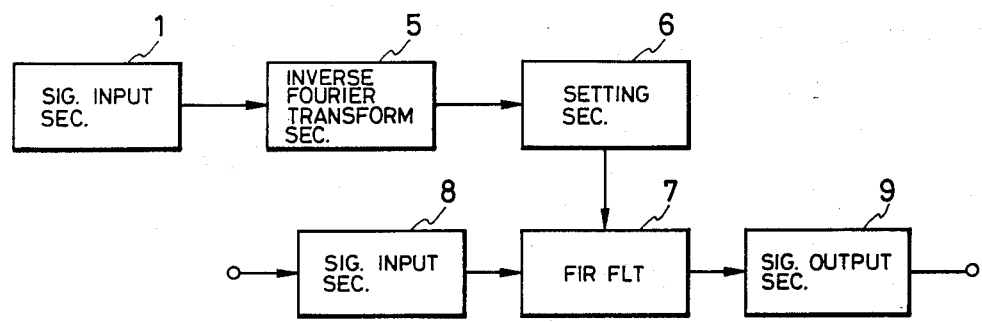
FIG. 1 is a system block diagram of a prior art digital equalizer utilizing a FIR filter.
Figure 3A:
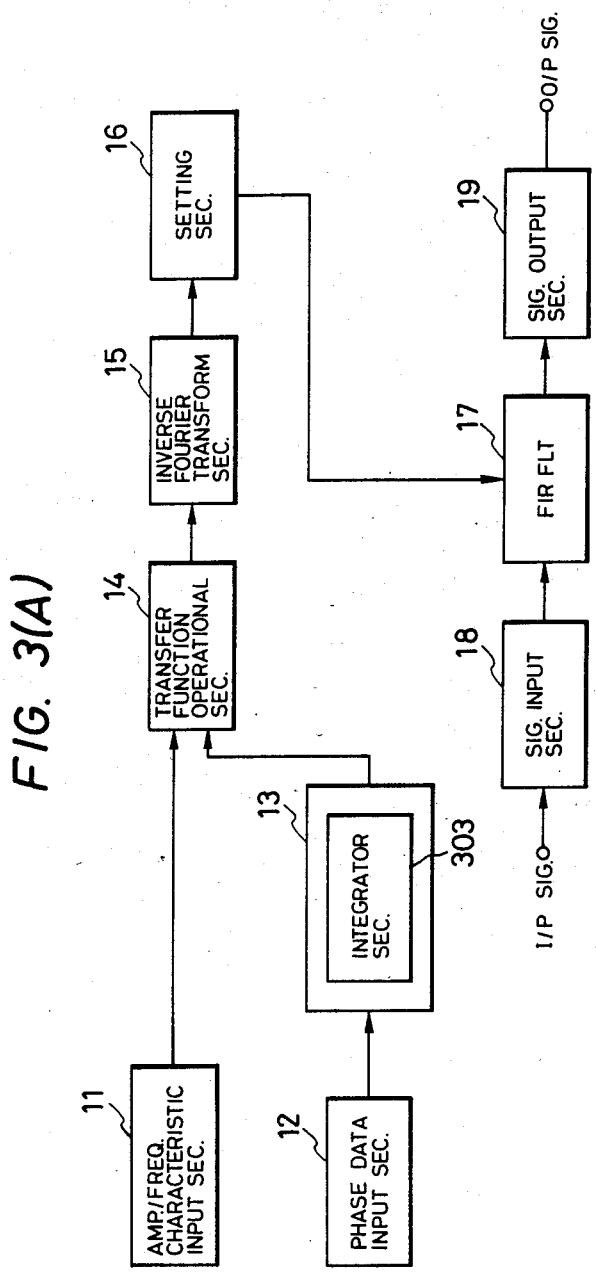
FIG. 3(A) is a system block diagram of a first embodiment of a digital equalizer according to the present invention, in which group delay characteristic data are used to define a phase/frequency characteristic.

Referring first to FIG. 3(A), a system block diagram is shown of a first embodiment of a digital equalizer apparatus according to the present invention, which is a digital audio equalizer enabling independent adjustment of the phase/frequency characteristic and amplitude/frequency characteristic of a FIR filter, for applying phase and amplitude correction to a digital audio signal that is transferred through the filter. In FIG. 3(A), numeral 11 denotes an amplitude/frequency characteristic input section, for supplying to the digital equalizer apparatus data representing a desired amplitude/frequency characteristic. As described for the prior art example of FIG. 1, these data are inputted as a set of amplitude values for respective ones of a set of sample frequencies within a fixed frequency range. Numeral 12 denotes a phase data input section, for inputting data which are utilized by the digital equalizer apparatus to compute a desired phase/frequency characteristic. In the various embodiments of the present invention described hereinafter, various different types of data are supplied by the phase data input section 12, e.g. data representing a phase/frequency characteristic, a group delay characteristic, a resonance characteristic, an amplitude/frequency characteristic, etc. However the same reference numeral will be used to designate the phase data input section of each embodiment. In the embodiment of FIG. 3(a), group delay characteristic data for a loudspeaker are inputted from the phase data input section 12. Numeral 13 denotes a phase operational section for computing a desired phase/frequency characteristic based upon data supplied from the phase data input section 12, which in this embodiment contains an integration section 303 for integrating with respect to frequency the group delay characteristic that is supplied from the phase data input section 12. A phase/frequency characteristic is obtained as the integration results. Numeral 14 denotes a transfer function operational section, for computing a transfer function corresponding to the phase/frequency characteristic that has been derived by the phase computation section 13 combined with the amplitude/frequency characteristic supplied from the amplitude/frequency characteristic input section 11. Numeral 15 denotes an inverse Fourier transform section for deriving the inverse Fourier transform of the transfer function that is obtained from the transfer function operational section 14, to thereby obtain an impulse response characteristic corresponding to that transfer function. Numeral 16 denotes a coefficient setting section, for setting filter coefficients into a FIR filter (described in the following) which are respectively defined by the impulse response produced as described above. More specifically, the coefficient setting section 16 generates control signals in accordance with the impulse response characteristic derived by the inverse Fourier transform section 15, and these control signals establish the filter coefficients of the FIR filter 17, to thereby determine the amplitude/frequency characteristic and phase/frequency characteristic of the filter. Numeral 17 denotes an FIR filter for realizing the desired phase/frequency characteristic and amplitude/frequency characteristic that have been inputted from the phase data input section 12 and amplitude/frequency characteristic input section 11, as a result of the filter coefficients established as described above. Numeral 18 denotes a signal input section, for inputting a digital audio signal to be transferred through the FIR filter 17 to a signal output section 19, to be supplied to an external system.

The input signal that is to be processed by transfer through the FIR filter 17 can be of either analog or digital signal form (where the term "digital signal" signifies a succession of digital values representing signal samples. If the input signal supplied to the signal input section 18 is of analog form, then the signal input section 18 must include an A/D converter for converting the input signal to a digital signal that is suitable for processing by the FIR filter. If the input signal supplied to the signal input section 18 is of digital form, but is not of a suitable format for processing by the FIR filter 17, then the signal input section 18 must include means for converting the input signal to suitable digital signal form. Otherwise, the input digital signal can of course be transferred directly by the signal input section 18 to the FIR filter 17. Similar considerations apply to the signal output section 19. That is to say, if the output signal from the FIR filter 17 is to be supplied to external analog circuits, then the signal output section 19 must include a D/A converter. Otherwise, the signal output section 19 may either execute modification of the digital signal from the FIR filter 17, or may transfer that signal directly to an external system, depending upon the requirements of that system.

Figure 2A:
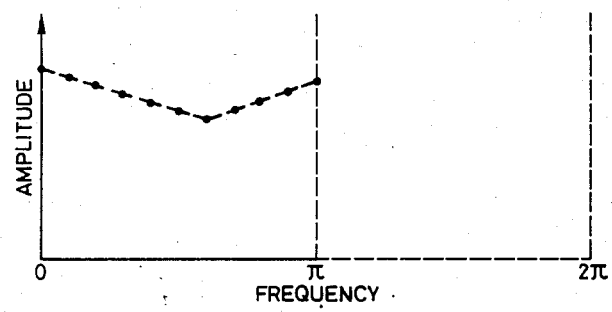
FIGS. 2(A) and 2(B) are diagrams for illustrating input of amplitude/frequency characteristic data to a digital equalizer and derivation of extended amplitude/frequency characteristic data therefrom.
Figure 2B:
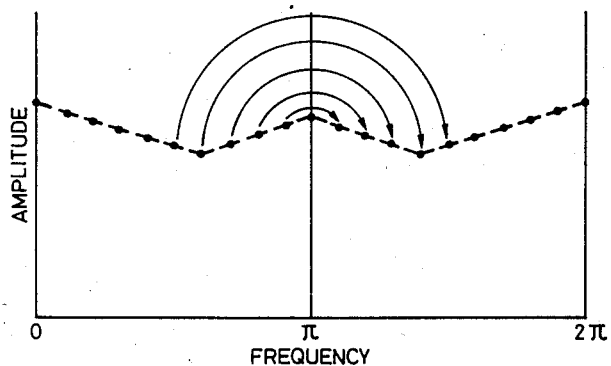

The operation of this embodiment is as follows. Data representing a desired amplitude/frequency characteristic $|H(\omega)|$ in the frequency range $\omega=0\sim 2\pi$ are supplied by the amplitude/frequency characteristic input section 11 to the transfer function operational section 14. The transfer function operational section 14 operates on this data in the manner illustrated in FIG. 2(B), to "fold over" that portion of the amplitude/frequency characteristic and hence derive the amplitude/frequency characteristic within the range $\pi$ to $2\pi$. The amplitude/frequency characteristic is thereby obtained in the range 0 to $2\pi$. The phase data input section 12 supplies group delay characteristic data for the frequency range 0 to $\pi$ to the phase computation section 13, which thereby derives a phase/frequency characteristic in the range 0 to $\pi$, by integration with respect to frequency as described above. The phase computation section 13 then executes a similar "fold over" operation to that described above (with $\omega=\pi$ as a center frequency about which the "folding over" is performed), but with polarity inversion, to derive a phase/frequency characteristic in the range $\pi$ to $2\pi$. In this way a phase/frequency characteristic is obtained which covers the frequency range $\omega=0$ to $2\pi$.

This phase/frequency characteristic, and the amplitude/frequency characteristic input section 11, are then applied to the transfer function operational section 14, which computes a corresponding transfer function for the frequency range $\omega=0$ to $2\pi$. The inverse Fourier transform of this transfer function is then derived by the inverse Fourier transform section 15, as an impulse response, and filter coefficients corresponding to this impulse response are established for the FIR filter 17 by the coefficient setting section 16.

In this way, filter coefficients are established for the FIR filter 17 which satisfy both the desired amplitude/frequency characteristic (supplied via the amplitude/ frequency characteristic input section 11) and the phase/frequency characteristic computed by the phase computation section 13. This amplitude/frequency characteristic and phase/frequency characteristic can thus be realized for the input signal applied to the signal input section 18, by transferring that signal through the FIR filter 17. In this way, the embodiment enables compensation of the phase/frequency characteristic and amplitude/frequency characteristic of a signal to be independently set as desired.

The operation of the first embodiment of the present invention described above (and of each of the following embodiments) is controlled by a suitably programmed digital microprocessor, which is not shown in the drawings, i.e. all of the functions executed by the system sections shown in FIG. 3(a) are based on digital processing which is controlled by a microprocessor. Thus the system section themselves are only shown for the purposes of description, and in practice are implemented by operations of the microprocessor, in conjunction with devices such as A/D converters, D/A converters, sampling circuits, etc. where necessary.

Figure 3B:
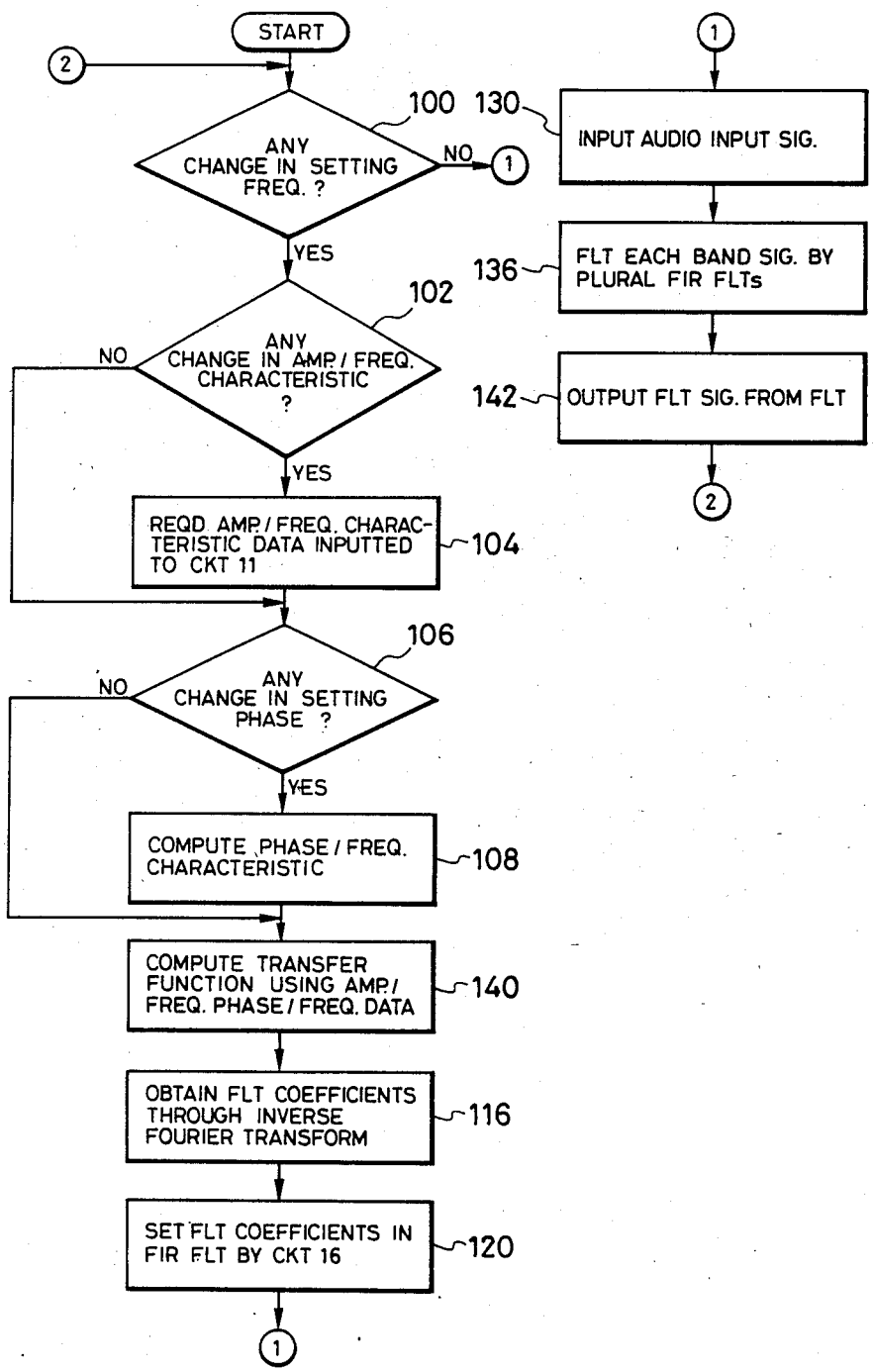
FIG. 3(B) is a flow chart for use in describing the operation of the first embodiment.

The basic operating sequence of this microprocessor is illustrated in the flow chart of FIG. 3(b), which can be readily understood from the description of the operation of the first embodiment given above.

From the above it can be understood that with the first embodiment of the invention, a group delay characteristic that is supplied as data from the phase data input section 12 to the phase computation section 13 is integrated with respect to frequency by the integrator section 303, to derive a phase/frequency characteristic that is set as the phase/frequency characteristic of a FIR filter. In this way, phase correction can be applied to an input audio signal that is transferred through the FIR filter 17 to be supplied to an audio system, to compensate the frequency response characteristics of that audio system (e.g., which includes a loudspeaker, microphone, amplifiers etc.,) for the effects of the group delay characteristic of components in that system, such as a loudspeaker.

Figure 4:
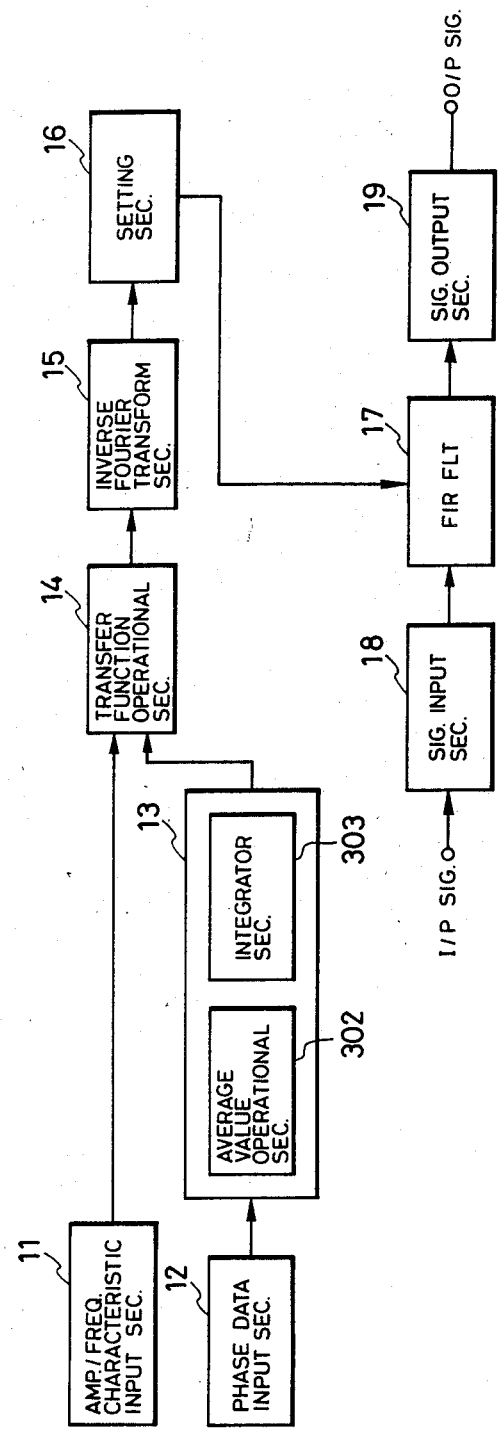
FIG. 4 is a system block diagram of a second embodiment of a digital equalizer according to the present invention, in which input group delay characteristic data are redefined with respect to an average group delay, to derive a phase/frequency characteristic.

A second embodiment of a digital equalizer apparatus according to the present invention will be described referring to the system block diagram of FIG. 4. Sections corresponding to sections in the first embodiment of FIG. 3 are designated by identical reference numerals. This embodiment is essentially similar to the first embodiment, with a group delay characteristic being applied through the phase data input section 12 to the phase computation section 13. A problem which arises with the first embodiment is that since the group delay characteristic that is supplied by the phase data input section 12 to the phase computation section 13 is an arbitrary characteristic, the average value of the group delay characteristic will not be zero, and will be superimposed on the group delay characteristic data that are supplied to the phase computation section 13. This non-zero average value for the group delay characteristic data results in a lowering of the precision with which a phase/frequency characteristic can be computed by the phase computation section 13. With the second embodiment, however, the group delay characteristic data from the phase data input section 12 are first supplied to an average value operational section 302 within the phase computation section 13, which computes the average value of group delay over the entire range of the group delay characteristic data, and then redefines the group delay characteristic in the form of a set of deviations from that average value. The resultant amended group delay characteristic is then integrated with respect to frequency by the integrator section 303 to obtain a phase/frequency characteristic, which is supplied to the transfer function operational section 14. The remaining operation of this embodiment is identical to that of the first embodiment described above.

In this way, a more accurate phase/frequency characteristic can be derived by the phase computation section 13 of the second embodiment.

Figure 5:
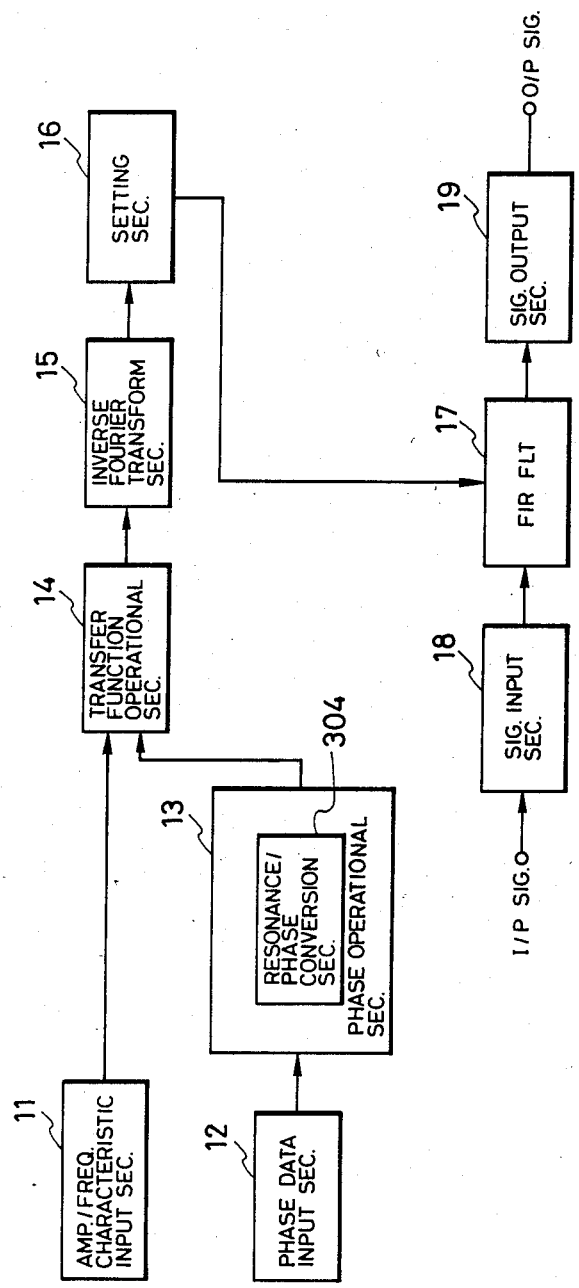
FIG. 5 is a system block diagram of a third embodiment of a digital equalizer according to the present invention, in which resonance data for a low pass filter circuit are inputted to define a phase/frequency characteristic.

FIG. 5 is a system block diagram of a third embodiment of a digital equalizer apparatus according to the present invention, which differs from the first embodiment of FIG. 3 in that data for deriving a desired phase/frequency characteristic of FIR filter 17 are supplied from the phase data input section 12 to the phase computation section 13 in the form of data representing the resonance characteristic of an electrical circuit. It will be assumed in the following that the resonance characteristic of a second-order active low pass filter is utilized. In FIG. 5, the phase data input section 12 supplies to the phase computation section 13 data representing the resonance frequency of the low pass filter, designated as $F_c$, and a quantity designated as $\zeta$ which is the degree of peak sharpness at resonance of the low pass filter, where $f_c$ and $\zeta$ are respectively defined by the following equations (3) and (4):

$$f_c = \tfrac{1}{2}\pi\sqrt{C_1 C_2 R_1 R_2} \tag{3}$$

$$\zeta = C_2(R_1 + R_2)/2\sqrt{C_1 C_2 R_1 R_2} \tag{4}$$

Figure 6A:
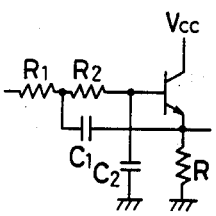
FIGS. 6(A) and 6(B) are circuit diagrams of examples of second order active low pass filter circuits.
Figure 6B:
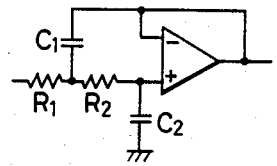

In the above, the values $R_1$, $R_2$, $C_1$ and $C_2$ are resistance and capacitance parameters of a second-order active low pass filter circuit, as illustrated in FIG. 6(A) or 6(B). In the filter example of FIG. 6(A) the active device is a transistor, while in that of FIG. 6(B) it is an operational amplifier. The phase/frequency characteristic and amplitude/frequency characteristic of such an active low pass filter are shown for various values of $\zeta$ in FIG. 6(C). The values $C_1$ and $R_1$ are preferably fixedly predetermined, so that when data representing $\zeta$ and $f_c$ are supplied from the phase data input section 12 to the phase computation section 13, the values $C_2$ and $R_2$ can be computed by resonance/phase conversion section 304 of the phase computation section 13, from equations (3) and (4) above. The resonance/phase conversion section 304 then derives a phase/frequency characteristic based on the resultant values of $C_1$, $C_2$, $R_1$, $R_2$, from the following equation:

$$Pw_r = -\tan^{-1} wC_2(R_1 + R_2)/(1 - w^2 C_1 C_2 R_1 R_2) \tag{5}$$

In the above, w denotes angular frequency, and $P_w$ denotes the value of phase derived for the angular frequency w.

Figure 6C:
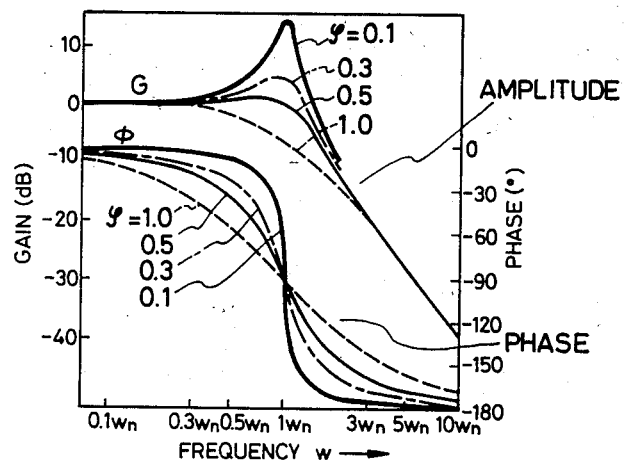
FIG. 6(C) shows amplitude/frequency characteristic and phase/frequency characteristic examples for a second order low pass filter.

It is important to note that the amplitude/frequency characteristic of the active low pass filter shown in FIG. 6(C) is in no way related to the amplitude/frequency characteristic that is supplied from the amplitude/frequency characteristic input section 11. The resonance data supplied from the phase data input section 12 are utilized only to derive a phase/frequency characteristic to be established for the FIR filter 17, while the amplitude/frequency characteristic of the filter is determined by data supplied from the amplitude/frequency characteristic input section 11, as for the previous embodiments.

The third embodiment has been described for the case in which the phase/frequency characteristic is derived as the function defined by equation (5) above. However it would be equally possible to utilize various other functions in a similar manner, so long as such a function enables a phase/frequency characteristic of a low pass filter to be computed.

Moreover, although the type of resonance which is utilized in the third embodiment described above is that of a low pass filter, it would be equally possible to derive the phase/frequency characteristic from data relating to the resonance characteristic of a high-pass filter, or a band pass filter. Furthermore, data approximately representing the resonance characteristic of a device such as a loudspeaker could also be utilized.

It can thus be understood that the third embodiment described above enables the phase/frequency characteristic of the FIR filter 17 to be set to an approximation of the phase/frequency characteristic of an audio system or audio component, to a high degree of accuracy and in a simple manner, since it is only necessary to input data representing a resonance frequency and the degree of sharpness of the resonance peak (with the type of resonance, i.e. low pass filter, high pass filter or band pass filter being predetermined) in order to derive the required phase/frequency characteristic.

Figure 7A:
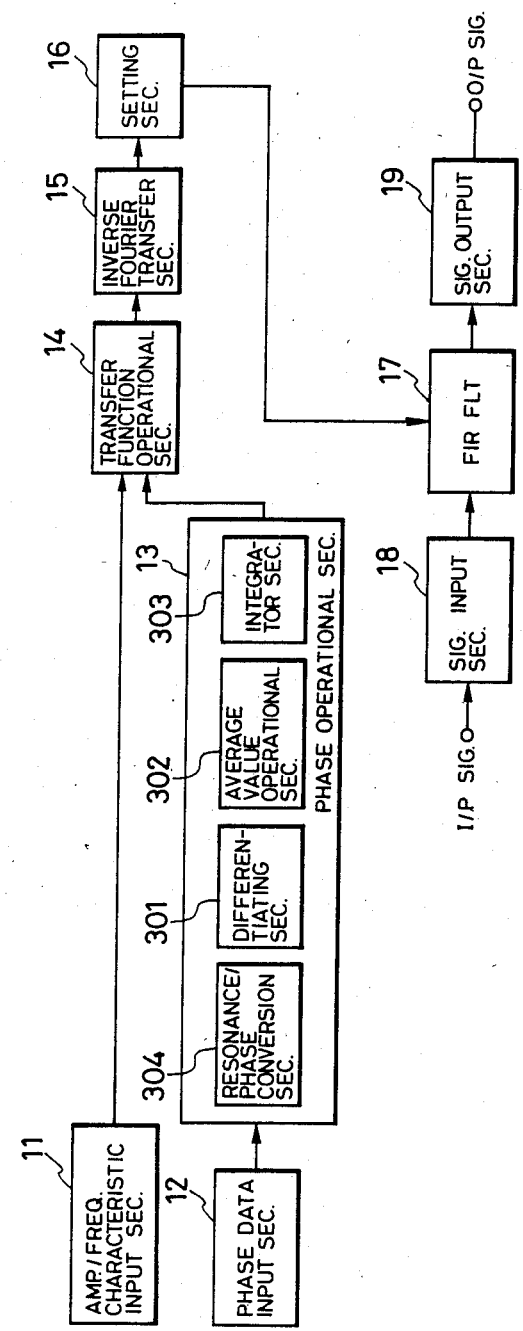
FIG. 7(A) is a system block diagram of a fourth embodiment of the present invention, in which resonance data are inputted to define a phase/frequency characteristic.

FIG. 7(A) is a system block diagram of a digital equalizer apparatus according to a fourth embodiment of the present invention, in which a phase/frequency characteristic is derived by using resonance characteristic data supplied from the phase data input section 12, as in the third embodiment described above. In FIG. 7(A) the phase computation section 13 includes a resonance/phase conversion section 304, followed by a differentiator section 301 which operates on the phase/frequency characteristic produced from the resonance/phase conversion section 304 by executing differentiation of phase with respect to frequency. The results obtained from the differentiator section 301 are supplied to an average value operational section 302 which derives average trend values of phase from these results and subtracts the average trend values from the results produced from the differentiator section 301. The results thereby obtained by the average value operational section 302 are supplied to an integrator section 303, to be integrated with respect to frequency, to thereby obtain a phase/frequency characteristic.

Figure 7B:
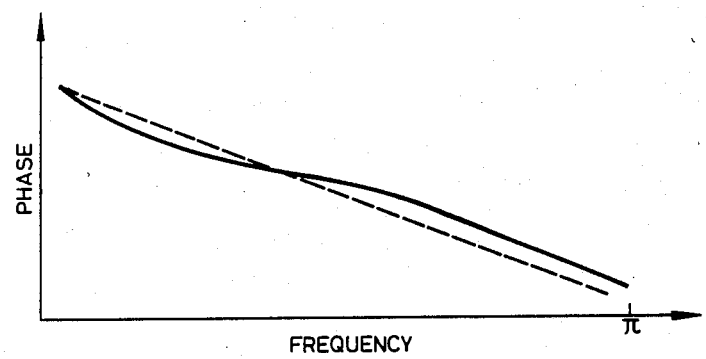
FIGS. 7(B) and 7(C) show phase/frequency characteristics for assistance in describing the operation of the fourth embodiment.
Figure 7C:
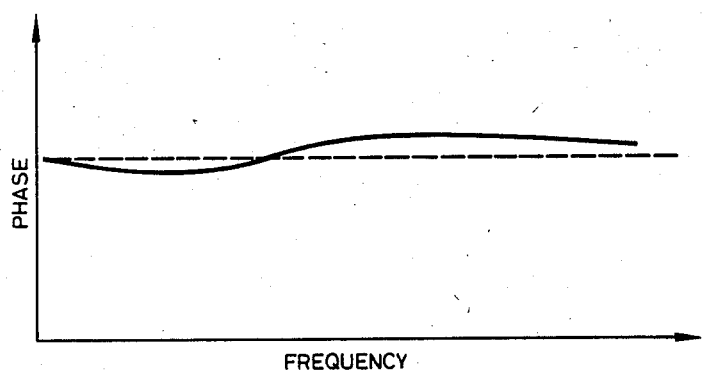

Due to the above configuration of the fourth embodiment, if the phase/frequency characteristic derived based on the input data supplied from the phase data input section 12 exhibits a large amount of variation with respect to frequency, then this can be modified by the differentiator section 301, average value operational section 302 and integrator section 303 to obtain a phase/frequency characteristic which has a smaller degree of variation with respect to frequency. This is illustrated in FIG. 7(B), in which the full-line curve is an example of a phase/frequency characteristic derived by the resonance/phase conversion section 304 of the phase computation section 13 from resonance characteristic data supplied from the phase data input section 12, and in which the broken-line portion indicates the average trend of the phase/frequency characteristic. The differentiator section 301, average value operational section 302 and integrator section 303 function in combination to convert the phase/frequency characteristic of FIG. 7(B) to that of FIG. 7(C), in which the average trend is substantially constant with respect to frequency, so that the phase/frequency characteristic which is supplied from the phase computation section 13 to the transfer function operational section 14 exhibits a more gradual amount of variation with respect to frequency than the phase/frequency characteristic which is derived by the resonance/phase conversion section 304.

Figure 8:
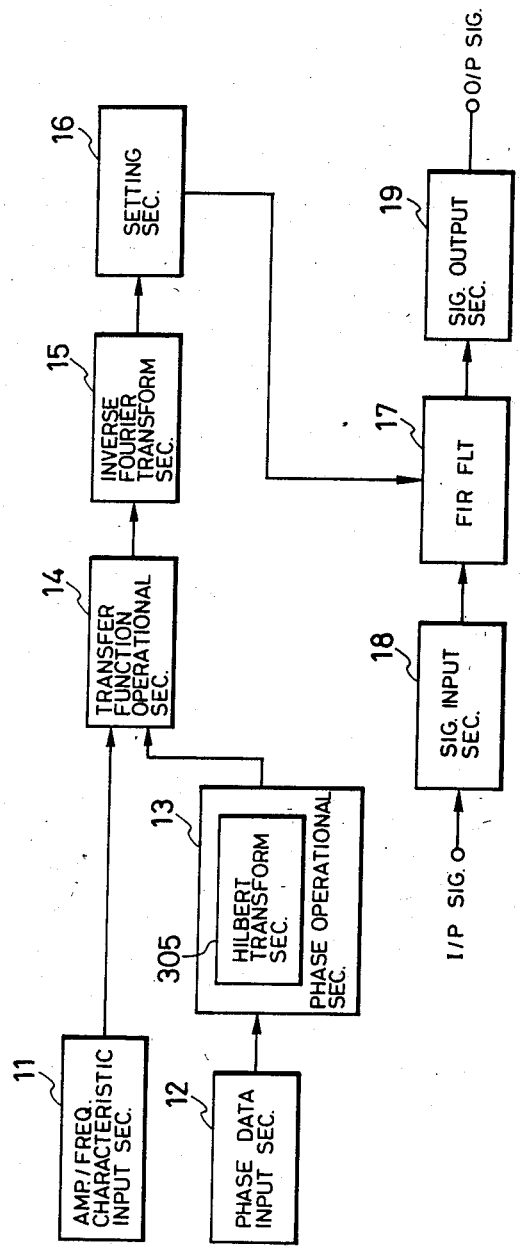
FIGS. 8 and 9 are system block diagrams of fifth and sixth embodiments of the present invention, in which amplitude/frequency characteristic data are inputted as phase data, for deriving a phase/frequency characteristic by Hilbert transform computation.

FIG. 8 is a system block diagram of a fifth embodiment of a digital equalizer apparatus according to the present invention. This embodiment differs from the first embodiment in that an amplitude/frequency characteristic is supplied from the phase data input section 12 to the phase computation section 13, as data for deriving a phase/frequency characteristic by the phase computation section 13. This amplitude/frequency characteristic, which is to be distinguished from the amplitude/frequency characteristic that is input by the amplitude/frequency characteristic input section 11 as described hereinabove for the preceding embodiments, is that of an audio system component such as a loudspeaker, microphone, or amplifier, for which phase compensation is to be executed by the FIR filter 17. In this embodiment, the phase computation section 13 includes a Hilbert transform operational section 305 which derives the Hilbert transform of the amplitude/frequency characteristic supplied from the phase data input section 12, to thereby obtain a phase/frequency characteristic which displays a minimum degree of phase displacement with respect to that amplitude/frequency characteristic.

Since the amplitude/frequency characteristic of an audio system component such as a loudspeaker is often readily available, i.e. as part of the component technical specifications, this embodiment enables the phase response of the FIR filter 17 to be very easily modified to provide compensation for the effects produced by a specific component of the audio system (e.g. containing a microphone, amplifier, loudspeaker etc.) that is driven by the output signal from the FIR filter 17. That is to say, the phase/frequency response of the inverse Fourier transform section 15 is modified such as to compensate the signal transferred through the filter against variations of phase with frequency that are caused by a component (or components) of the audio system, based on the known amplitude/frequency characteristic of that component (or components). A basically flat phase/frequency characteristic for the overall system can thereby be realized, while the overall amplitude/frequency characteristic can be determined by the input data supplied from the amplitude/frequency characteristic input section 11.

Figure 9:
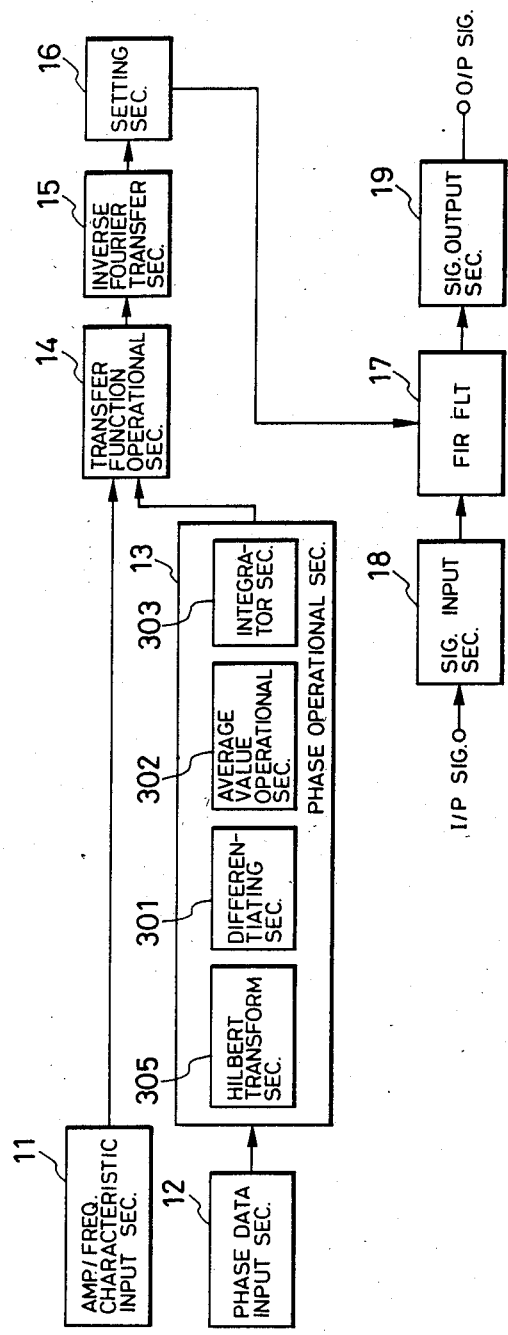

FIG. 9 is a system block diagram of a sixth embodiment of a digital equalizer apparatus according to the invention. As for the fifth embodiment described above, the data used for deriving a desired phase/frequency characteristic for the FIR filter 17 represent an amplitude/frequency characteristic, which is supplied to a Hilbert transform operational section 305 in the phase computation section 13 to derive a phase/frequency characteristic. However this embodiment differs from the fifth embodiment in that the phase computation section 13 further includes a differentiator section 301 which receives the phase/frequency characteristic derived by the Hilbert transform operational section 305, as well as an average value operational section 302 for processing the results produced by the differentiator section 301, with the results thereby obtained being supplied to an integrator section 303. A phase/frequency characteristic is thereby derived by the integrator section 303 which has a more gradual amount of variation with respect to frequency than the phase/frequency characteristic derived by the resonance/phase conversion section 304, as described hereinabove for the fourth embodiment. It can thus be understood that the sixth embodiment enables input data for use in deriving a desired phase/frequency characteristic for the FIR filter 17 to be applied in the same manner as for the fifth embodiment, i.e. in the form of a known amplitude/frequency characteristic of a component of the audio system in which the FIR filter 17 is inserted, while in addition providing the advantage of modification to provide a more gradually varying phase/frequency characteristic as described for the fifth embodiment.

It can be understood from the above that the first through sixth embodiments of the invention each consist of a digital audio equalizer whereby various types of phase compensation can be executed by modifying the phase/frequency characteristic of a FIR filter in accordance with data inputted through the phase data input section 12.

The embodiments in which group delay characteristic data (e.g. of a loudspeaker) are used to determine the phase/frequency characteristic of the FIR filter are advantageous for compensating an audio system against the effects of such a group delay characteristic.

In addition, the embodiments in which resonance-related data are utilized to determine the phase/frequency characteristic of the FIR filter can be utilized to produce a phase/frequency characteristic which accurately approximates to the phase/frequency characteristic of an audio system, and enable this to be done in a very simple manner.

The embodiments in which a known amplitude/frequency characteristic (e.g. of a loudspeaker) is applied as data for deriving a phase/frequency characteristic of the FIR filter, by the Hilbert transform technique, have the advantage of enabling phase compensation of an audio system to be executed with a minimum amount of phase displacement.

Figure 10A:
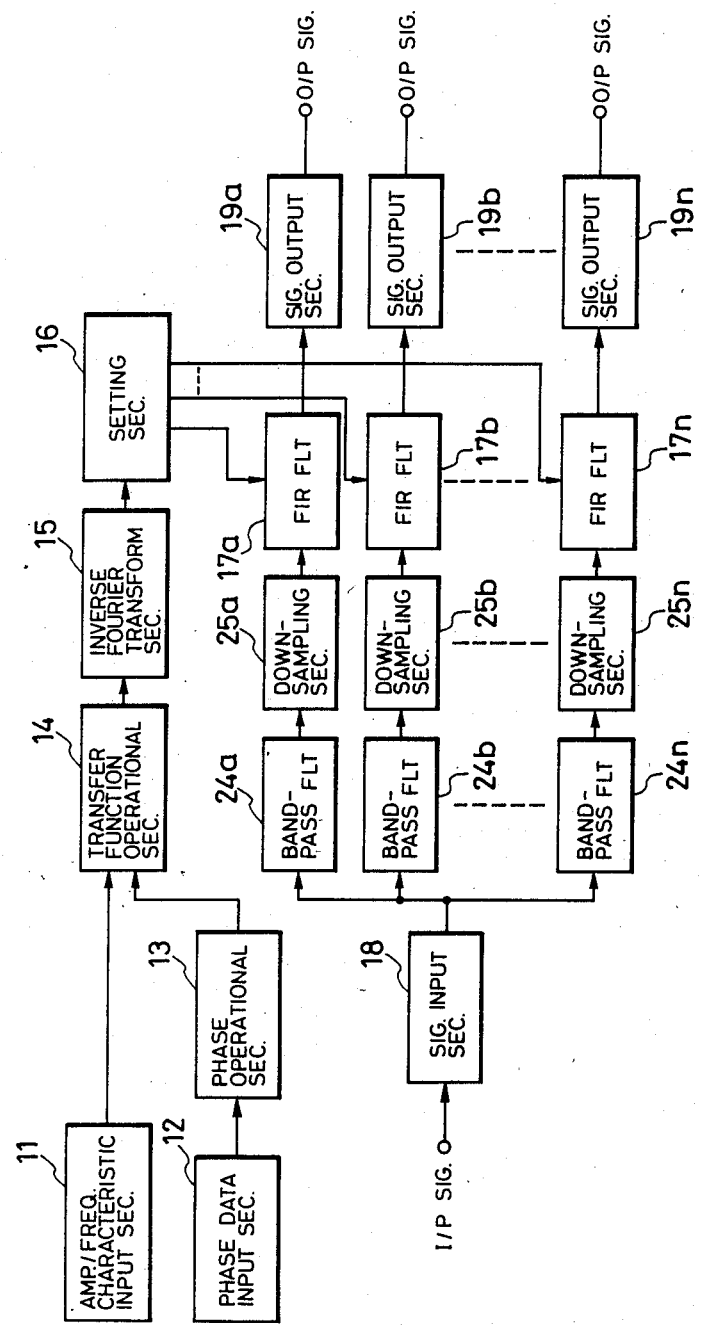
FIG. 10(A) is a system block diagram of a seventh embodiment of the present invention, in which different frequency bands of a digital audio signal are subjected to down-sampling and are processed in parallel by a plurality of FIR filter channels.
Figure 10B:
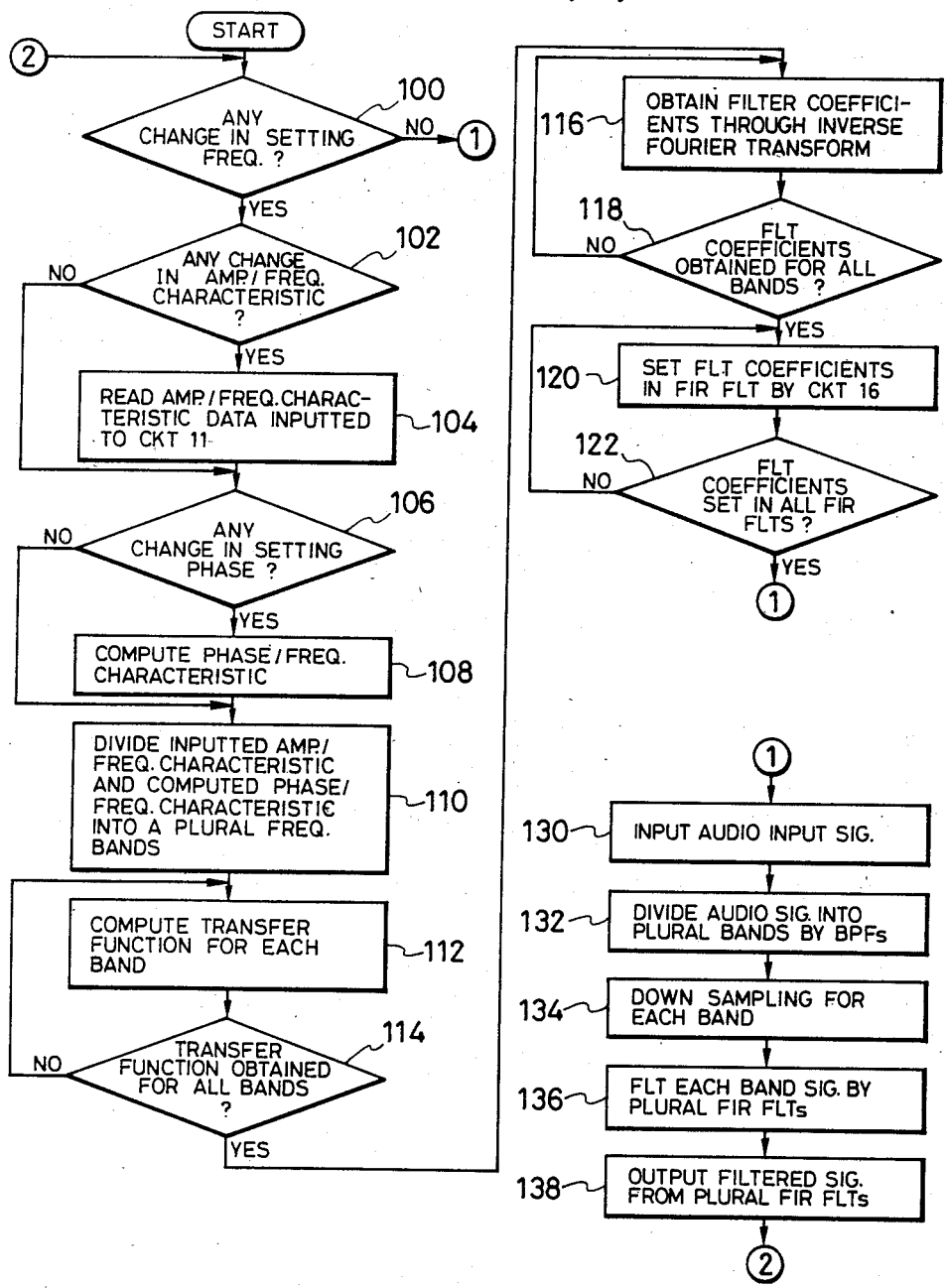
FIG. 10(B) is a flow chart for describing the operation of the seventh embodiment.

FIG. 10 is a system block diagram of a seventh embodiment of a digital equalizer apparatus according to the present invention. As for the previous embodiments this has an amplitude/frequency characteristic input section 11 for input of a desired amplitude/frequency characteristic, a phase data input section 12 for input of data for use in deriving a desired phase/frequency characteristic and a phase computation section 13 for deriving that phase/frequency characteristic, a transfer function operational section 14 for producing a transfer function based on the phase/frequency characteristic and amplitude/frequency characteristic, an inverse Fourier transform section 15 for deriving the inverse Fourier transform of the transfer function from the transfer function operational section 14 to thereby obtain values of FIR filter coefficients in accordance with the transfer function, and a coefficient setting section 16 for setting these values as FIR filter coefficients. However this embodiment differs from the preceding embodiments in that a plurality of FIR filters, designated as 17a, 17b, ... 17n are utilized to handle respectively different frequency bands of an overall frequency range.

As in the previous embodiments the signal input section 18 will include an A/D converter if the input signal applied thereto to be processed by the FIR filters is an analog signal, or may be a digital converter circuit if a digital audio signal is applied as input. A digital audio signal is thus produced from the signal input section 18, and is supplied to respective inputs of a set of digital band pass filters 24a, 24b, ... 24n, having respectively different pass bands, e.g. from 0 to 400 Hz, from 400 to 800 Hz, 800 to 1600 Hz, ..., to cover the audio frequency range (e.g. from 0 to 20 kHz). The filtered output signal from each of these digital band pass filters is applied to a corresponding one of a set of down-sampling sections 25a, 25b, ... 25n. Each of these down-sampling sections functions to "thin-out" the sample rate of the digital audio signal applied thereto, i.e. to periodically eliminate samples from that signal. For example, such a down-sampling section may transfer only every second one of the samples contained in the input signal applied thereto. The resultant signals produced from the down-sampling sections 25a to 25n are applied to respective ones of the FIR filters 17a to 17n and transferred therethrough.

The purpose of processing the input audio signal applied to the signal input section 18 in a plurality of different frequency bands with this embodiment is as follows. As described above, a digital FIR filter is generally configured as a transversal filter, having a series of delay stages. Respective taps, each connecting to a multiplier, are coupled to the input of the first delay stage, the output from the final delay stage, and each junction between successive delay stages. The outputs from the multipliers are summed to obtain the filter output signal, and the multiplication factors are respectively determined by the filter coefficients. The delay of each delay stage is made equal to the sampling period. The frequency resolution of such a filter is defined as the ratio of the sampling frequency $f_s$ to number of taps M ($f_s$ being a number of digital samples/second). In order to obtain a sufficiently smooth equalization characteristic by such a filter, it is necessary to make the frequency resolution sufficiently high for the lowest frequency region of the frequency range in which equalization is to be performed. Since as is well known the sampling frequency must be at least twice the highest frequency component of a sampled signal, the resolution obtainable with a conventional FIR filter equalizer is determined by the number of taps. However if the number of taps is increased, to obtain improved resolution, then the operating speed of the filter will be reduced, i.e. a greater number of multiplication operations must be executed per unit time. Thus, only a limited improvement in frequency resolution can be attained in that way, with a practical microprocess or controlled digital equalizer.

With a prior art digital equalizer utilizing a FIR filter, the sampling rate utilized for all of the frequency components of the original signal must be at least twice the highest frequency of the signal frequency range, and hence an unnecessarily high sampling rate is utilized for the low frequency components of the original signal. The 7th embodiment makes use of the fact set out above to provide a digital audio equalizer whereby an increased degree of FIR filter frequency resolution can be attained with a smaller number of tape than is possible with a conventional FIR filter arrangement, so that sufficient frequency resolution is attained while the delay in processing an input signal by the filter is minimized. This is achieved by dividing the output signal from the signal input section 18 into a plurality of frequency bands (preferably two bands, i.e. a high-frequency band and a low-frequency band) by respective digital band pass filters, 24a to 24n. The output signals from these band pass filters are then applied to respective ones of down-sampling sections 25a to 25n, in which the data rate of each signal is reduced, by a "thinning out" operation which eliminates a certain proportion of the data samples. Such data "thinning out" might be executed by a factor of 8 by the down-sampling section 25a for the FIR filter 17a which handles the lowest frequency band, so that the number of data samples per unit time supplied to the FIR filter 17a, i.e. the effective sampling frequency, will be ⅛ of that of the signal produced from the signal input section 18. Similar data "thinning out" is executed by the other down-sampling sections 25b to 25n, with a minimum degree of "thinning out" being executed by the down-sampling section 25n which handles the highest frequency band of the input signal. For example, the down-sampling section 25n might execute data "thinning out" by omitting every other data sample in the output signal from band pass filter 24n.

As described for the preceding embodiments, the phase data input section 12 can input data representing a group delay characteristic (e.g. of a loudspeaker), which is integrated with respect to frequency in the phase computation section 13 to thereby obtain a phase/frequency characteristic which is applied together with the desired amplitude/frequency characteristic from the amplitude/frequency characteristic input section 11 to the transfer function operational section 14. Alternatively, the phase data input section 12 can input resonance-related data, whereby a desired phase/frequency characteristic can be computed by the phase computation section 13, or data representing a known amplitude/frequency characteristic can be supplied from the phase data input section 12 and subjected to Hilbert transform in the phase computation section 13, to thereby obtain a phase/frequency characteristic which exhibits a minimum degree of phase displacement for that particular amplitude/frequency characteristic.

However in this embodiment, the transfer function operational section 14 operates on the amplitude/frequency characteristic and phase/frequency characteristic data supplied from the amplitude/frequency characteristic input section 11 and transfer function operational section 14 to derive a plurality of respectively different transfer functions. These are computed such that each transfer function realizes an amplitude/frequency characteristic and a phase/frequency characteristic from zero frequency to a specific frequency value, e.g. from zero frequency to 400 Hz, from zero frequency to 800 Hz, from zero frequency to 1600 Hz, and so on, to be established as the respective transfer functions of the FIR filters 17a, 17b, . . . etc. The inverse Fourier transform section 15 operates on these transfer functions to produce corresponding sets of filter coefficient values for the FIR filters 17a to 17n, and these respective sets of filter coefficients are established for the FIR filters by control signals generated by the coefficient setting section 16.

The output signals from the FIR filters 17a to 17n are supplied to respective signal output sections 19a to 19n, each of which can for example consist of a D/A converter, and output signals thereby obtained for each of the frequency bands selected by the band pass filters 24a to 24n. If for example three FIR filters are utilized, i.e. three-channel processing, then the output signals from each signal output section might be supplied to respective appropriate amplifier and speaker systems for each frequency range selected by the band pass filters, i.e. low, mid-range and high frequency range systems.

It can be seen from the above that the sampling frequencies of the input signals applied to respective ones of the FIR filters 17a, 17b, . . . are determined in accordance with the highest frequency component of the input audio signal that is to be handled by the filter, and that each FIR filter handles a limited band of input signal frequency components. Thus, the frequency resolution of each FIR filter can be increased while maintaining a high speed of operation (i.e. low delay in signal transfer through the filter), by comparison with a single FIR filter being utilized for the entire frequency range.

Figure 11:
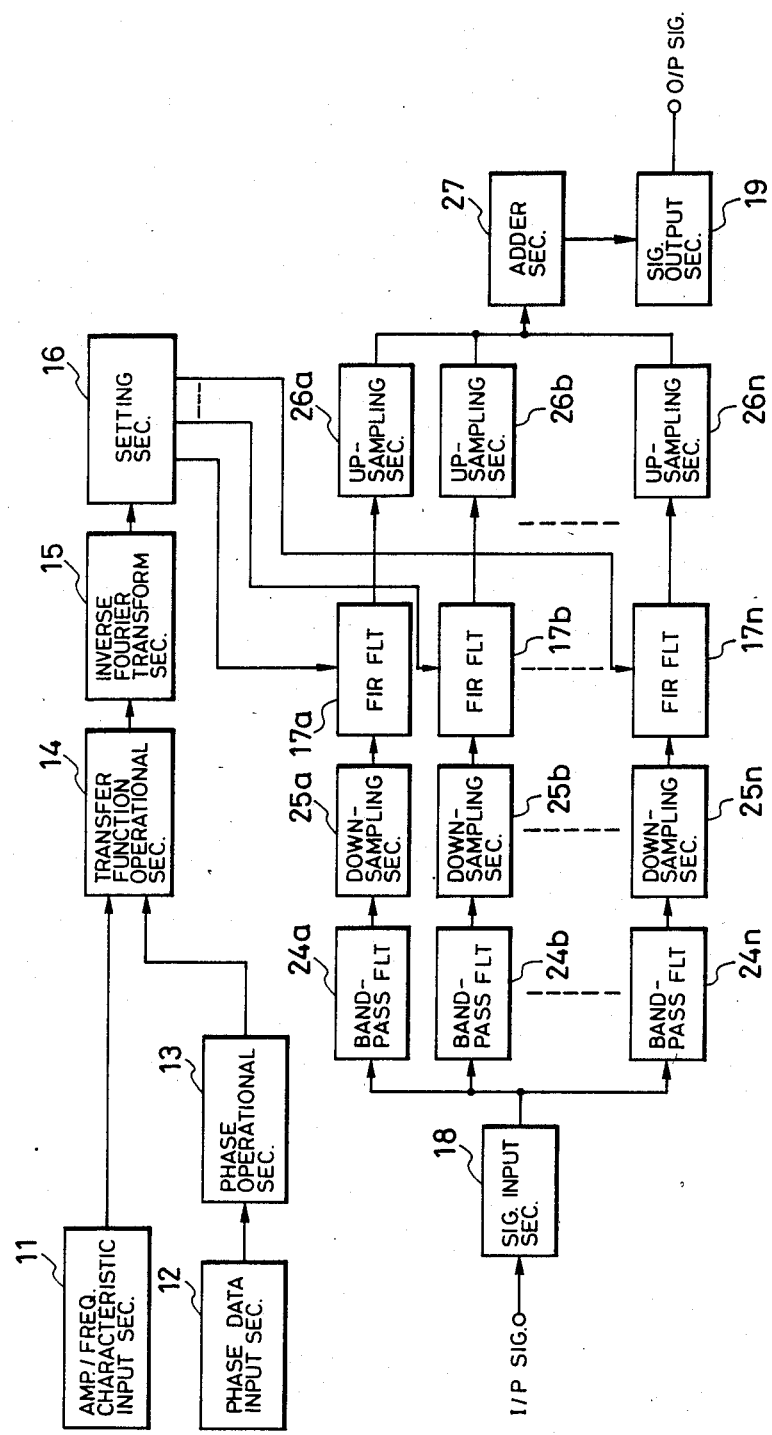
FIGS. 11 and 12 are system block diagrams of eighth and ninth embodiments of the invention in which different frequency bands of a digital audio signal are subjected to down-sampling and are processed in parallel by a plurality of FIR filter channels.

FIG. 11 is a system block diagram of an eighth embodiment of a digital equalizer apparatus according to the present invention. This is similar to the 7th embodiment described above. However as shown in FIG. 11, the respectively output signals produced from the FIR filters 17a to 17n are transferred through corresponding ones of a set of up-sampling sections 26a to 26n, in which interpolation of data samples is executed to increase the data sample rate of the output signal from each up-sampling section to that of the input signal which was applied to the corresponding one of the down-sampling sections 25a to 25n. The restored signals thus produced from the up-sampling sections 26a to 26d are then combined by an adder 27 to produce an output digital audio signal having the same data sample rate as that of the digital signal supplied from the signal input section 18.

The 8th embodiment, as well as the 7th embodiment described previously, provides the advantage of high FIR filter frequency resolution and rapid processing of the input audio signal, i.e. ensuring a minimum delay in transferring that signal between the signal input section 18 and the signal output section 19. In addition as for the previous embodiment, since the amplitude/frequency characteristic and phase/frequency characteristic of the respective FIR filters 17a to 17n can be set independently for each of the filters, accurate phase and amplitude compensation of the input audio signal can be realized.

Figure 12:
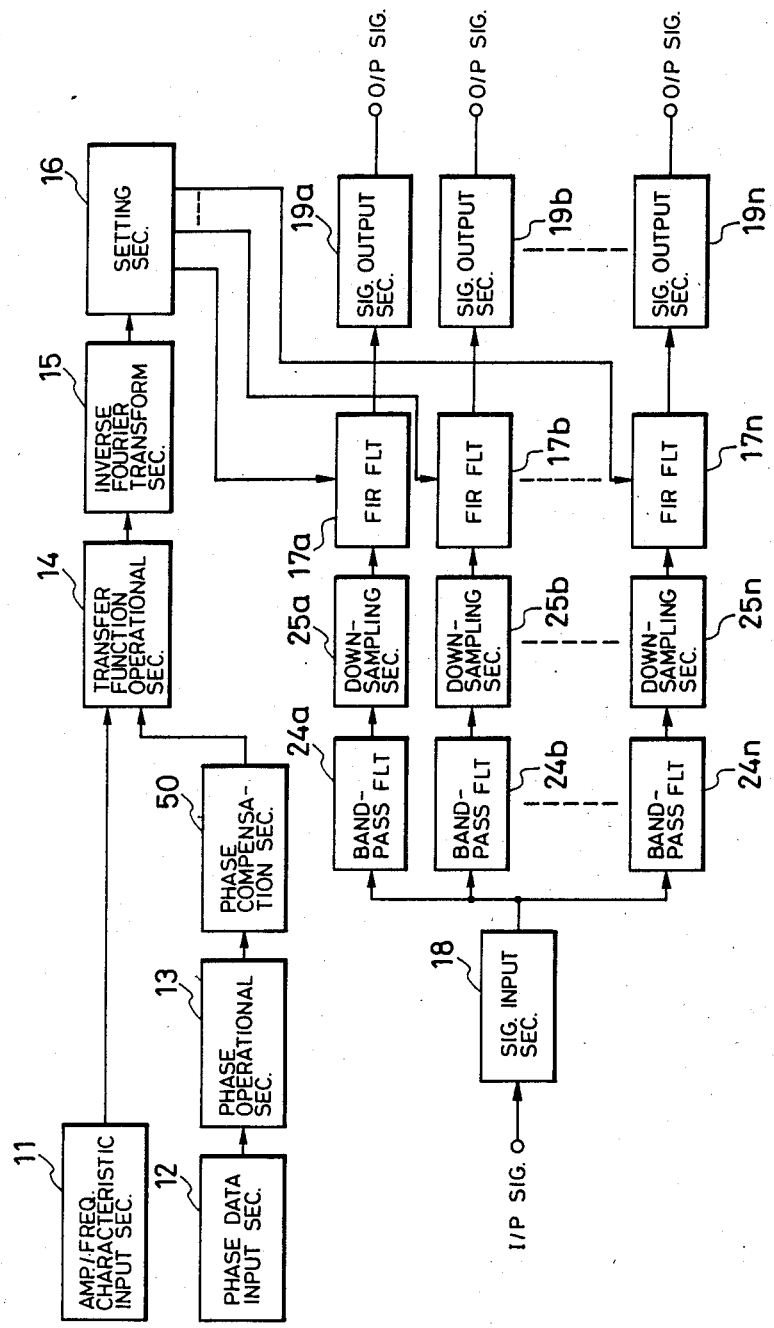

FIG. 12 is a system block diagram of a 9th embodiment of a digital equalizer apparatus according to the invention, utilizing multi-channel FIR filter processing and having a basically similar configuration to the 7th embodiment described above. However in the 9th embodiment, group delay characteristic data (e.g. of a loudspeaker) are supplied from the phase data input section 12 for deriving phase/frequency characteristic data, and these group delay characteristic data are divided into respective frequency bands corresponding to the pass bands of the band pass filters 24a to 24n by the phase computation section 13 and respective phase/frequency characteristics derived for these frequency bands. A phase compensation section 50 receives the phase/frequency characteristic data thus derived by the phase computation section 13, and functions to establish an identical value of phase for each of respective guard band frequencies existing between adjacent ones of the frequency bands corresponding to the respective phase/frequency characteristics from the phase computation section 13. The compensated set of phase/frequency characteristics thus obtained is then supplied to the transfer function operational section 14 together with the desired amplitude/frequency characteristic supplied from the amplitude/frequency characteristic input section 11, whereby the transfer function operational section 14 derives a plurality of transfer functions respectively based on the plurality of phase/frequency characteristics and the amplitude/frequency characteristic. The remainder of the operation of this embodiment is identical to that of the 7th embodiment.

When audio signals are produced by a loudspeaker within a sound field formed for example by an enclosed room, then even if flat frequency response characteristics have been achieved for the audio system formed of the loudspeaker and amplifiers etc. which drive the speaker, the sound which is actually heard by a listener within that sound field will be affected by the acoustic properties of the sound field. That is to say, the effective amplitude/frequency characteristic and phase/frequency characteristic of the audio system, with respect to the listening position, will be affected to some degree by the configuration of the room, concert hall, etc. within which sound is generated by that audio system. With each of the embodiments of the present invention described above, a digital audio equalizer is provided whereby the amplitude/frequency characteristic and phase/frequency characteristic of an audio signal can be mutually independently adjusted to desired shapes. However as described above, the degree of frequency response control which is actually achieved when the output audio signal from the digital audio equalizer is applied to drive a loudspeaker will be affected by the sound field in which the loudspeaker is placed. Embodiments of the present invention will be described in the following whereby automatic compensation for the acoustic characteristics of such a sound field can be attained.

Figure 13:
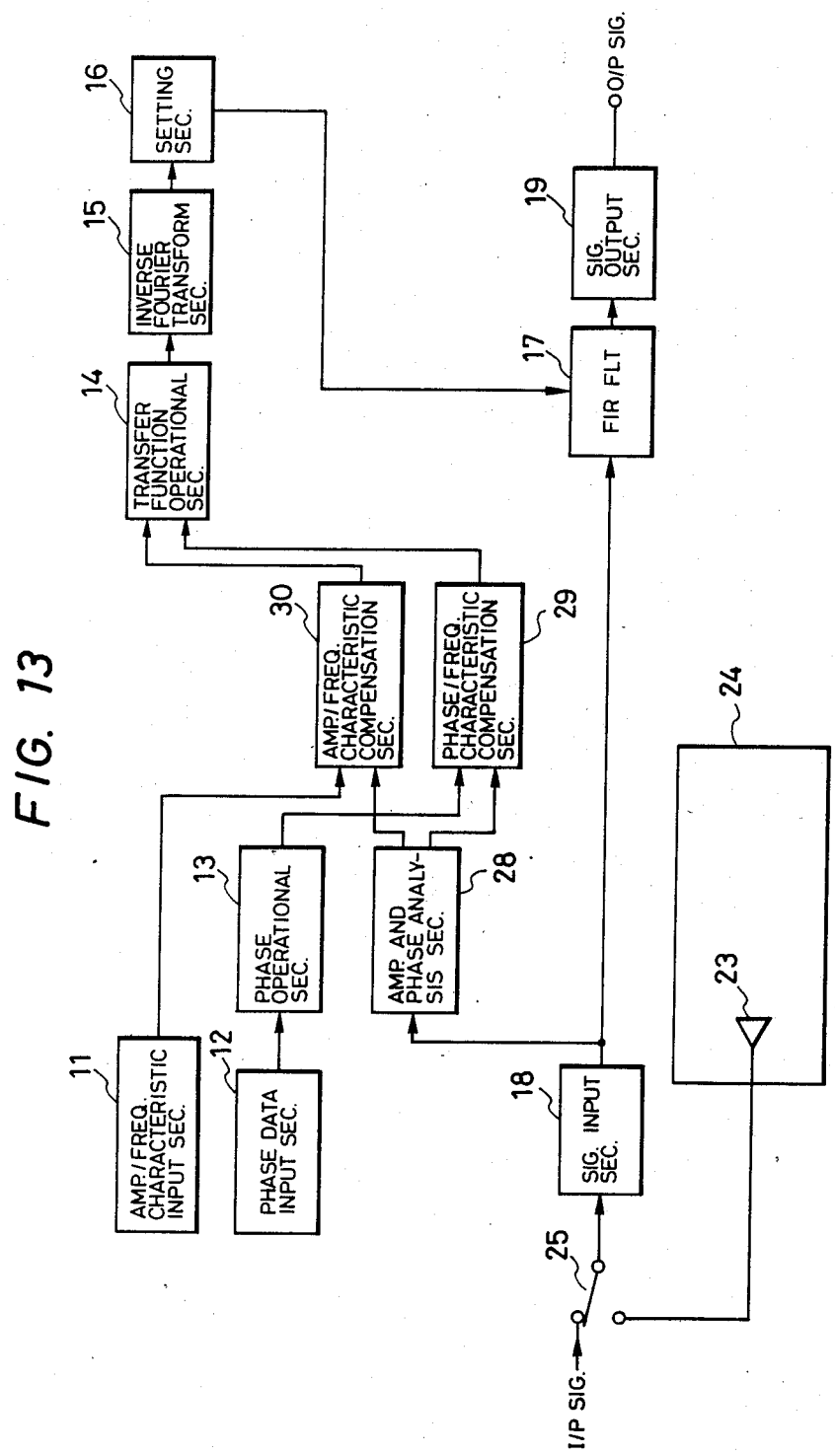
FIG. 13 is a system block diagram of a tenth embodiment of the present invention, enabling equalization for the acoustic characteristics of a sound field.

Referring first to FIG. 13, a 10th embodiment of the present invention is shown, which is a digital audio equalizer for implementing automatic compensation for sound field acoustic characteristics as outlined above. Sections corresponding to those of the preceding embodiments are designated by identical reference numerals. As in the previous embodiments, data representing a desired amplitude/frequency characteristic are inputted from amplitude/frequency characteristic input section 11, which data for use in deriving a phase/frequency characteristic (such as group delay characteristic data) are supplied from phase data input section 12 to the phase computation section 13, which computes the requisite phase/frequency characteristic. However the amplitude/frequency characteristic data from the amplitude/frequency characteristic input section 11 are applied to one input of an amplitude/frequency characteristic computation section 30, while the phase/frequency characteristic data from the phase computation section 13 are applied to one input of a phase/frequency characteristic computation section 29. An amplitude and phase analysis section 28 functions to analyze an amplitude deviation/frequency characteristic and a phase deviation/frequency characteristic of an input signal supplied through the signal input section 18, when that input signal is obtained by generating a large-amplitude impulse noise within a sound field whose acoustic characteristics are to be analyzed, as described in the following. An amplitude deviation/frequency characteristic obtained from the amplitude and phase analysis section 28 is supplied to the other input of the amplitude/frequency characteristic computation section 30, while a phase deviation/frequency characteristic obtained is supplied to the other input of the phase/frequency characteristic computation section 29. The amplitude/frequency characteristic computation section 30 adds together the desired amplitude/frequency characteristic supplied from the amplitude/frequency characteristic input section 11 to the phase deviation/frequency characteristic (or subtracts the phase deviation/frequency characteristic from the desired amplitude/frequency characteristic, with either addition or subtraction being utilized as required for achieving compensation of acoustic characteristics of a sound field as described hereinafter) compensation, to thereby obtain a compensated amplitude/frequency characteristic that is supplied to the transfer function operational section 14. The phase/frequency characteristic computation section 29 similarly adds the phase/frequency characteristic from the phase computation section 13 to the phase deviation/frequency characteristic (or subtracts one from the other), to derive a compensated phase/frequency characteristic that is supplied to the transfer function operational section 14. Filter coefficients for the FIR filter 17 are thereby derived by the inverse Fourier transform section 15 and are applied by the coefficient setting section 16 to the FIR filter 17.

Figure 14:
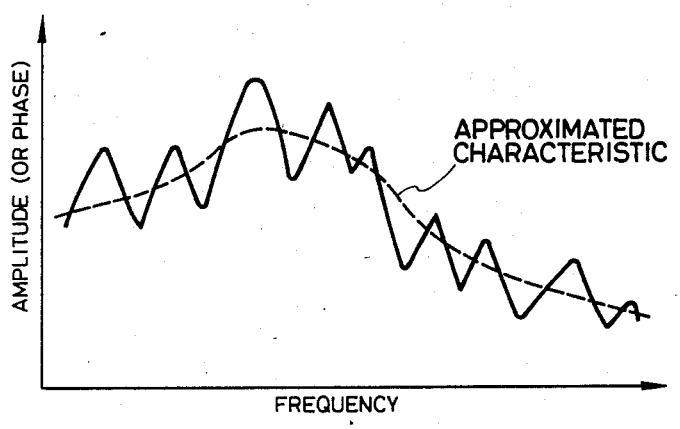
FIG. 14 is a diagram for illustrating the derivation of an amplitude deviation/frequency characteristic of the tenth embodiment.

Numeral 25 denotes an input switch which can be set to a normal position A, in which an analog audio signal is supplied to the signal input section 18 (which in this embodiment is an A/D converter) and a measurement position B in which a measurement signal produced from a microphone 23 positioned within a sound field 24 is supplied to the signal input section 18, to be converted to a sampled digital signal. The measurement signal is produced by generating a large-amplitude impulse sound within the sound field 24, for example by firing a cap pistol. The amplitude and phase analysis section 28 may employ various methods of analyzing the frequency characteristics of the measurement signal, for example by utilizing a plurality of band pass filters having differing center frequencies, utilizing a circuit which derives the Fourier transform of the measurement signal waveform, utilizing phase comparators and amplitude measurement circuits, etc. The amplitude and phase analysis section 28 first analyzes the measurement signal to obtain the amplitude/frequency characteristic and phase/frequency characteristic of that signal. The overall amplitude of the measurement signal is then derived, and the amplitude deviation/frequency characteristic is then obtained as a set of values each of which is the difference between the amplitude of the measurement signal at a specific frequency and the overall amplitude of that signal. For example, if the overall amplitude of the measurement signal is found to be 75 dB (i.e. as measured without frequency analysis being performed), and the frequency components of the signal have amplitudes of 65 dB at 400 Hz, 68 dB at 800 Hz, and so on, then the amplitude deviation/frequency characteristic will consist of the set of values (75–65) dB at 400 Hz, (75–68) dB at 800 Hz, and so on. When the amplitude deviation/frequency characteristic has thus been derived, it is subjected to smoothing as illustrated in FIG. 14, to eliminate rapid variations in amplitude with respect to frequency.

The resultant amplitude deviation/frequency characteristic is added to the desired amplitude/frequency characteristic in the amplitude/frequency characteristic computation section 30, and the result transferred to the transfer function operational section 14.

Figure 15A:
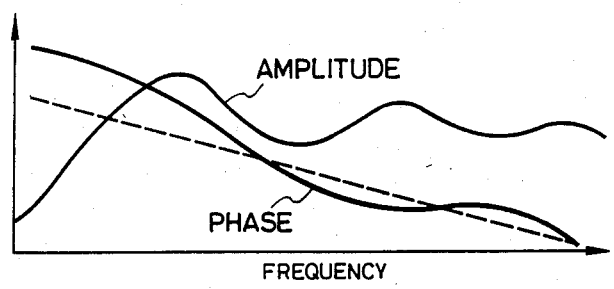
FIGS. 15(A) to (D) are amplitude/frequency characteristic and phase/frequency characteristic diagrams for describing the operation of the tenth embodiment.
Figure 15B:
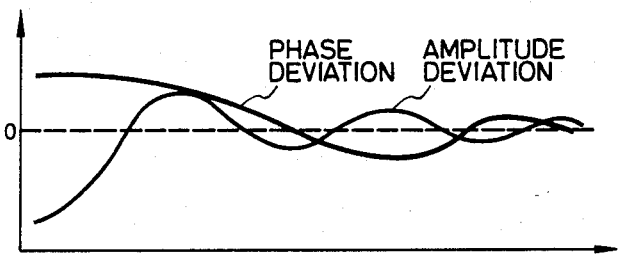

In the case of the phase/frequency characteristic of the measurement signal, the amplitude and phase analysis section 28 first analyzes the measurement signal to obtain that phase/frequency characteristic, then derives a linear phase/frequency characteristic representing the average trend of the phase/frequency characteristic. This is illustrated in FIG. 15(A), in which the broken line portion is the average trend which is derived from the phase/frequency characteristic of the measurement signal. The amplitude and phase analysis section 28 then functions to convert the phase/frequency characteristic of the measurement signal to a phase deviation/frequency characteristic having an average trend which is constant with respect to frequency, as shown in FIG. 15(B). In addition, smoothing of rapid variations in the resultant phase deviation/frequency characteristic is executed, as for the amplitude deviation/frequency characteristic as described above, and the resultant phase deviation/frequency characteristic is applied to the transfer function operational section 14. It has been found that such smoothing of the amplitude deviation/frequency characteristic and phase deviation/frequency characteristic results in increased accuracy of compensation being attained.

Figure 15C:
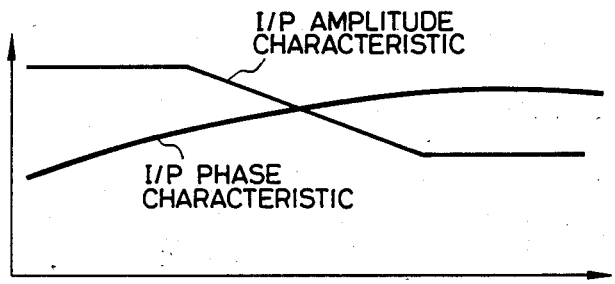
Figure 15D:
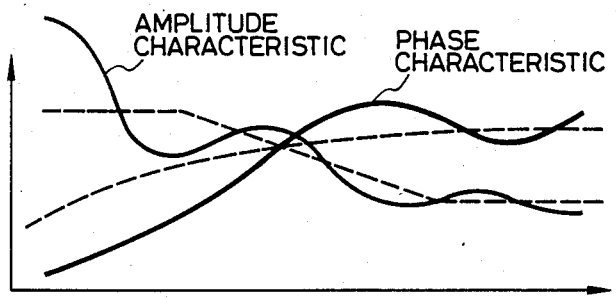

If now for example the desired amplitude/frequency characteristic and the phase/frequency characteristic that are respectively inputted from the amplitude/frequency characteristic input section 11 and derived by the phase computation section 13 are as shown in FIG. 15(C), then data representing the amplitude/frequency characteristic and phase/frequency characteristic respectively shown as full-line curves in FIG. 15(D) will be produced from the amplitude/frequency characteristic computation section 30 and phase/frequency characteristic computation section 29 respectively (with the input amplitude/frequency characteristic and phase/frequency characteristic being shown as broken-line curves). It will be apparent that these data can be applied, utilizing the transfer function operational section 14, inverse Fourier transform section 15 and coefficient setting section 16 as described for the previous embodiments, to set the filter coefficients of the FIR filter 17 such that the amplitude/frequency characteristic and phase/frequency characteristic of the FIR filter 17 will compensate for the undulations of the amplitude and phase/frequency characteristics of the sound field 24, i.e. to compensate for the effects upon sound reproduction of the acoustic characteristics of that sound field.

Upon completion of deriving and setting the coefficients of the FIR filter 17 as described above, the input switch 25 is set to its "A" position, to apply an input audio signal to the signal input section 18 for transfer in digital signal form through the FIR filter 17, and from the signal output section 19 to an external audio system, e.g. an amplifier driving a loudspeaker which is disposed within the sound field 24. Automatic compensation can thereby be applied for the acoustic characteristics of a room or hall in which the output audio signal from the digital audio equalizer is reproduced by a loudspeaker, i.e. such as to ensure that the frequency characteristics of the audio output from the loudspeaker will be perceived by a listener as being substantially unaffected by the acoustic characteristics of that room or hall.

In the embodiment described above, compensation for the acoustic characteristics of a sound field is applied to both the desired amplitude/frequency characteristic that is inputted from the amplitude/frequency characteristic input section 11 and the phase/frequency characteristic that is derived from the inputted data from the phase data input section 12. However it would be equally possible to apply such compensation to only the amplitude/frequency characteristic, or to only the phase/frequency characteristic.

Also, in the embodiment described above the microphone 23 is shown as being selectively connectable to the signal input section 18 by means of an input switch 25. However it would of course be equally possible to simply provide a socket which is coupled to the input of the signal input section 18, for selectively inserting plugs with connecting leads for coupling the signal input section 18 to either the microphone 23 or to an input audio signal source. It is thus not essential to have a microphone 23 permanently connected to the digital audio equalizer of this embodiment.

FIG. 16(A) is a system block diagram of an 11th embodiment of the present invention, which is a digital audio equalizer provided with means for automatically compensating for the acousting characteristics of a sound field, by modification of the amplitude/frequency characteristic and phase/frequency characteristic of a FIR filter in a similar manner to that of the 10th embodiment described above. Sections in FIG. 16 corresponding to sections in FIG. 13 are designated by identical reference numerals. The 11th embodiment differs from the 10th embodiment in that an impulse noise is generated within the sound field by means of a loudspeaker which is driven by an impulse signal transferred from the signal output section 19 through an amplifier to the loudspeaker. As shown in FIG. 16, the embodiment includes a test signal generating section 31 which can be actuated to generate a test signal, such as an impulse signal, in digital signal form. A selector switch 191 is provided for selectively applying either this impulse signal or the output signal from the signal input section 18 to the input of the FIR filter 17. A microphone 23 for producing a measurement signal, or a normal audio signal, can be selected for input to the signal input section 18 by means of the input switch 25, as in the previous embodiment. During both measurement operation (for analyzing the frequency characteristics of the sound field 24) and during normal audio signal reproduction operation, an audio amplifier 20 is coupled to receive the output signal produced from the signal output section 19, to drive a loudspeaker 22 that is disposed within the sound field 24 together with the microphone 23.

Figure 16B:
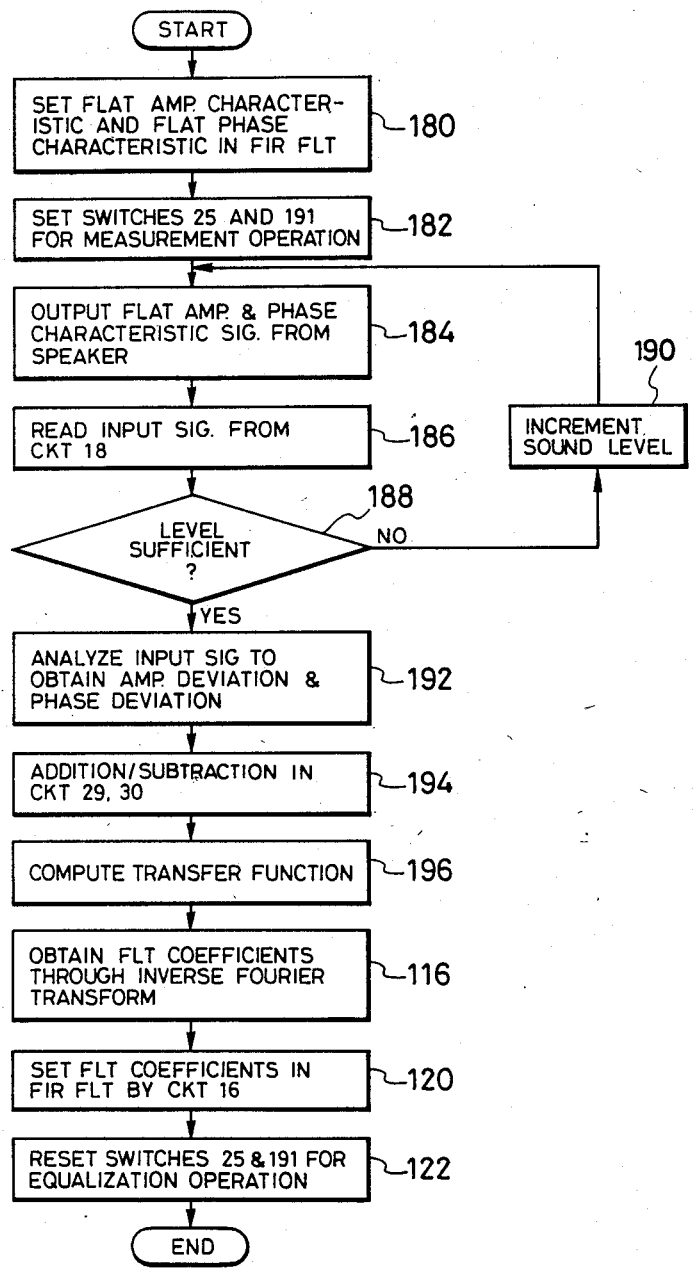
FIG. 16(B) is a flow chart for describing the operation of the 11th embodiment.

As for the previous embodiments, this embodiment preferably operates under the control of a programmed microprocessor, having an operating sequence of the form shown in FIG. 16(B). The operation of this embodiment is as follows, referring to FIGS. 16(A) and 16(B). First, the filter coefficients of the FIR filter 17 are set such as to ensure a flat amplitude/frequency characteristic and phase/frequency characteristic for the FIR filter 17, and the switches 191 and 25 are set for connecting the output signal from the impulse signal generating section 31 to the input of the FIR filter 17 and for connecting the output signal from the microphones 23 to the input of the signal input section 18 (which as in the previous embodiment is an A/D converter). The test signal generating section 31 is then operated such as to produce a signal impulse or burst signal, and a resultant acoustic test signal is emitted from the loudspeaker 22, and received by the microphone 23. The microphone 23 thereby produces a measurement signal, as for the previous embodiment, which is analyzed and the analysis results utilized (in combination with the input data from the amplitude/frequency characteristic input section 11 and phase data input section 12) to determine appropriate values of filter coefficients for the FIR filter 17. Upon completion of deriving these filter coefficient values, they are set as filter coefficients of the FIR filter 17 by the coefficient setting section 16. Tee switches 191 and 25 are then changed over to respective positions whereby an audio input signal is supplied to the signal input section 18 and thereby transferred through the FIR filter 17 to be amplified and reproduced by the loudspeaker 22.

The embodiment of FIG. 16 provides the advantage over the 10th embodiment described above, that the level of acoustic test signal generated within the sound field 24 can be readily controlled. It has been found that this enables greater accuracy of compensation to be attained. Furthermore since the measurement signal which is analyzed by the amplitude and phase analysis section 28 in this embodiment has been generated by driving the loudspeaker 22 by the amplifier 20, the amplitude/frequency characteristic and phase/frequency characteristic that are determined for the FIR filter 17 will provide automatic compensation for undulations in the frequency response characteristics of the amplifier 20 and loudspeaker 22, in addition to compensation for the acoustic response characteristics of the sound field 24. In this way, the overall frequency response characteristics of such an audio system, as perceived by a listener within the sound field 24, can be automatically made substantially flat, or can be set to desired shapes by varying the data supplied from the amplitude/frequency characteristic input section 11 and phase data input section 12.

Although the 11th embodiment has been described in the above for the case in which the test signal from the test signal generating section 31 is transferred through the FIR filter 17 to be supplied via the amplifier 20 to the loudspeaker 22, it should be noted that it would be equally possible to supply this test signal directly to the signal output section 19, for transfer through the amplifier to the loudspeaker.

Figure 17:
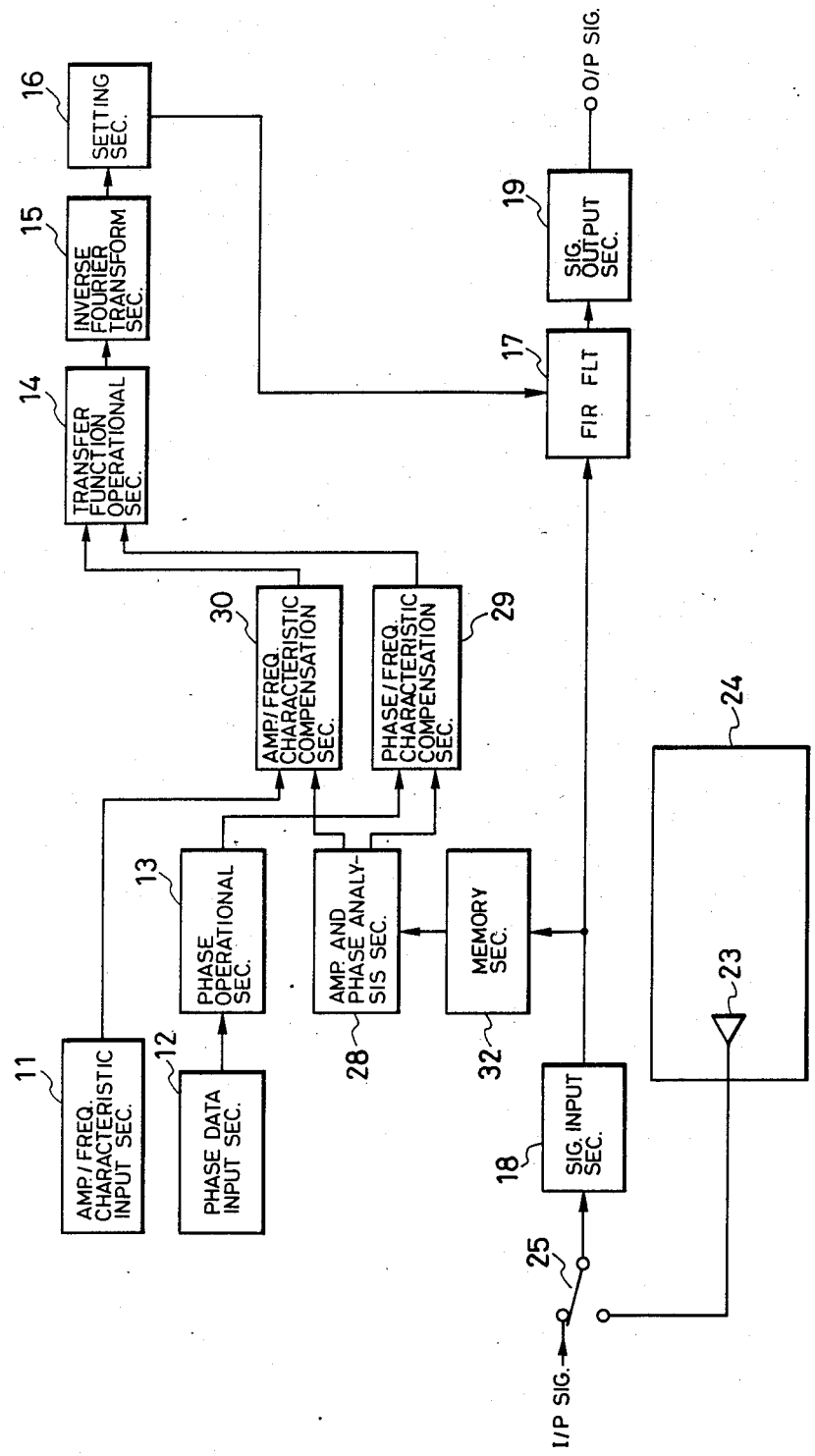

The 10th and 11th embodiments of the invention described above may in some cases be disadvantageous due to the fact that the test signal, and hence the measurement signal used for analyzing the frequency characteristics of the sound field, are of very brief duration. Thus, only a limited length of time is available for the amplitude and phase analysis section 28 to analyze the measurement signal and derive an amplitude deviation/frequency characteristic and phase deviation/frequency characteristic as described above. FIG. 17 is a system block diagram of a 12th embodiment of the invention, which is a digital audio equalizer that is basically similar to the 10th embodiment of FIG. 13, but is provided with a memory section 32 which is utilized to successively store a set of converted digital samples produced from the signal input section 18, which represent the measurement signal. The stored data in the memory section 32 can then be operated upon by the amplitude and phase analysis section 28 during a substantially long time interval, for accurately deriving the amplitude deviation/frequency characteristic and phase deviation/frequency characteristic to be supplied to the amplitude/frequency characteristic computation section 30 and phase/frequency characteristic computation section 29 as described for the 10th embodiment. A greater accuracy of compensation for the acoustic characteristics of the sound field 24 can thereby be attained.

It would of course be equally possible to apply such a memory section to the 11th embodiment described above.

Figure 18:
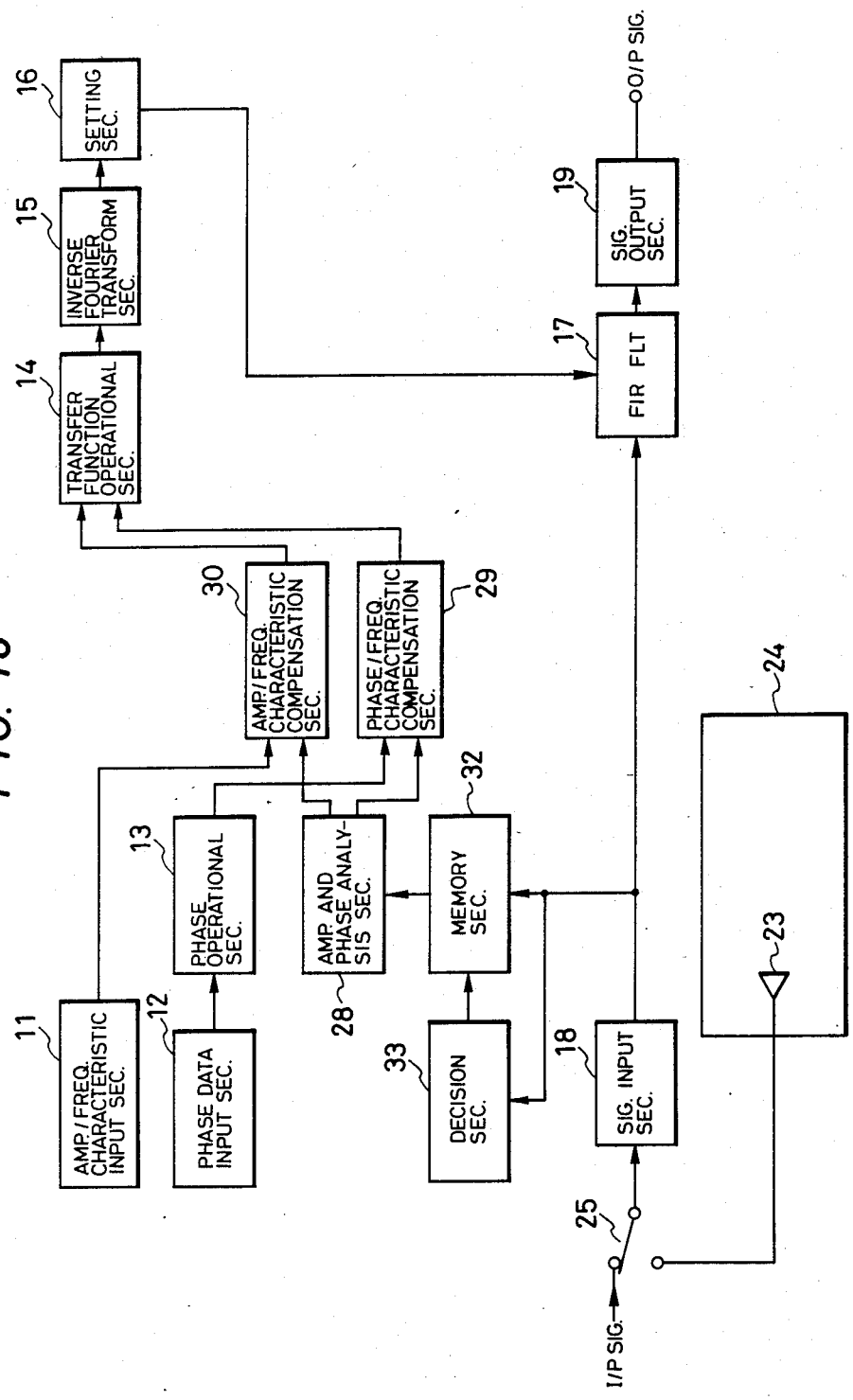
Figure 19A:
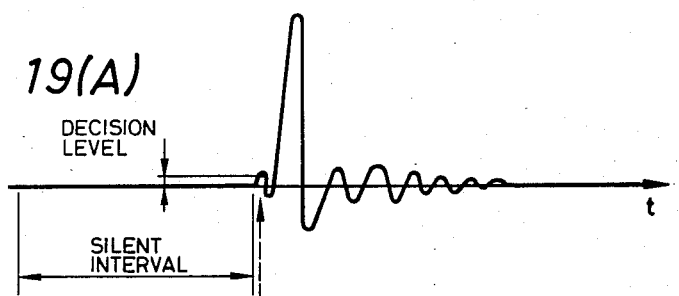
FIGS. 19 (A) and (B) are diagrams for illustrating a signal level decision operation of the 13th embodiment.
Figure 19B:
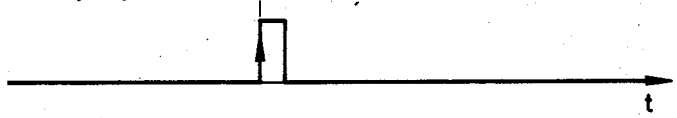

With the 12th embodiment of the invention described above, the point in time at which the memory section 32 begins to store successive digital samples from the signal input section 18 is not defined with respect to the measurement signal. That is, it is necessary to begin this memory storage operation for storing successive samples of the input signal, then to initiate generation of the impulse noise in the sound field 24 and thereby produce a measurement signal. However if this is done, then unnecessary data may be stored in the memory section 32 prior to the point in time at which the measurement signal actually begins. Thus, an unnecessarily high amount of storage capacity may be required for the memory section 32. FIG. 18 is a system block diagram of a 13th embodiment of the present invention, which is a digital equalizer apparatus having the objective of overcoming this problem. This embodiment differs from the 12th embodiment by further including a decision section 33, which is coupled to receive the output signal from the signal input section 18, and to detect the point in time at which the amplitude of that signal attains a predetermined level which indicates that a measurement signal has commenced. This operation is illustrated in FIGS. 19(A) and 19(B). When the decision level shown in FIG. 19(A) is reached, this is detected by the decision section 33 which thereby produces a control pulse as indicated in FIG. 19(B). This control pulse is applied to initiate the storage of successive samples of the input signal in the memory section 32, during a fixed time interval.

It can thus be understood that this embodiment enables storage of unnecessary data in the memory section 32 to be avoided, i.e. data which would otherwise for example be stored during an initial "silent interval" containing no useful data as shown in FIG. 19(A). The amount of memory capacity required for the memory section 32 can thereby be reduced by comparison with the embodiment of FIG. 17.

FIG. 20 shows a system block diagram of a 14th embodiment of the present invention, which is a digital equalizer apparatus basically similar to the 13th embodiment, but which has the objective of ensuring higher accuracy in analyzing sound field acoustic response characteristic. This is achieved by generating an impulse noise within a sound field several times in succession, and mutually superimposing the respective measurement signal waveforms which are thereby successively produced.

Figure 21A:
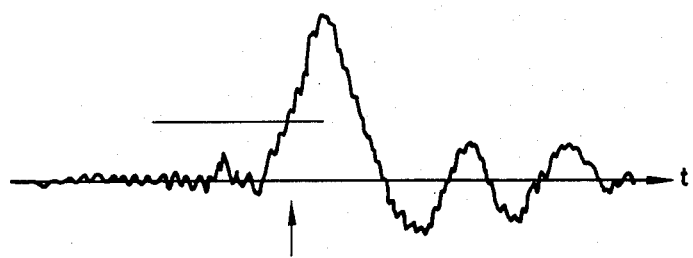
FIGS. 21(A) to (C) are diagrams for illustrating removal of uncorrelated noise components of a measurement signal in the 14th embodiment.

This superimposition is executed by means of a synchronized addition section 201, which forms part of the memory section 32 of this embodiment and functions as follows, in conjunction with the decision section 33 described hereinabove for the 13th embodiment. Referring to FIG. 21(A), the waveform of a single measurement signal (i.e. resulting from generating a single impulse noise within the sound field 24) is shown. Such a waveform includes various superimposed noise components, which reduce the accuracy that can be attained in analyzing the frequency characteristic of the measurement signal by the amplitude and phase analysis section 28. However with this embodiment, after a first measurement signal has been generated, converted to successive digital samples by the signal input section 18, and these samples successively stored in the memory section 32 (beginning at the time point determined by the decision section 33 as described above), the process is repeated. That is to say, a second noise signal is generated. In this case however, as each sample of the input signal is produced from the signal input section 18, the corresponding sample of the preceding measurement signal (i.e. corresponding with respect to the time sequence in which the samples are stored) is read out from the memory section 32 by the synchronized addition section 201, is added to the newly obtained sample, and the sum value is stored by the synchronized addition section 201 in the memory section 32 at the memory location from which read-out was performed.

Figure 21B:
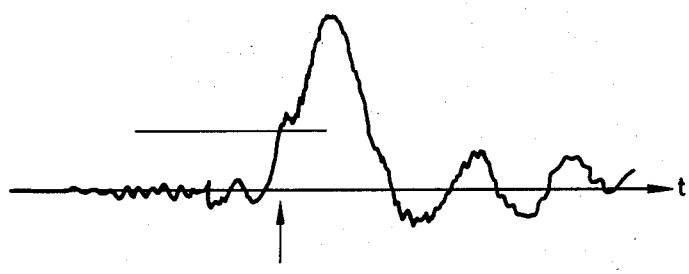
Figure 21C:
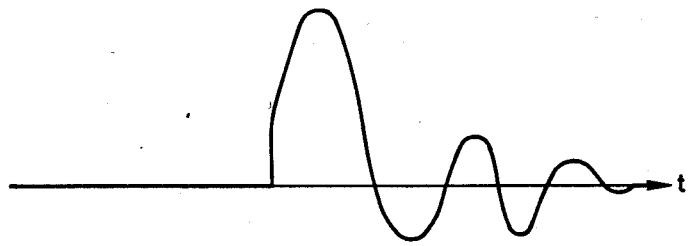

Upon completion of this process, the data which are now stored in the memory section 32 will represent a measurement signal waveform for example as shown in FIG. 21(B), in which much of the noise components have been removed. This is due to the fact that there will be no correlation between the noise components appearing in the two sequentially produced waveforms. If this procedure is repeated a further number of times, then a measurement signal waveform will remain stored in the memory section 32 which will be substantially entirely free from noise components, as illustrated in FIG. 21(C). A significant improvement can thereby be attained in the accuracy of analyzing the acoustic characteristic of the sound field 24.

Figure 22:
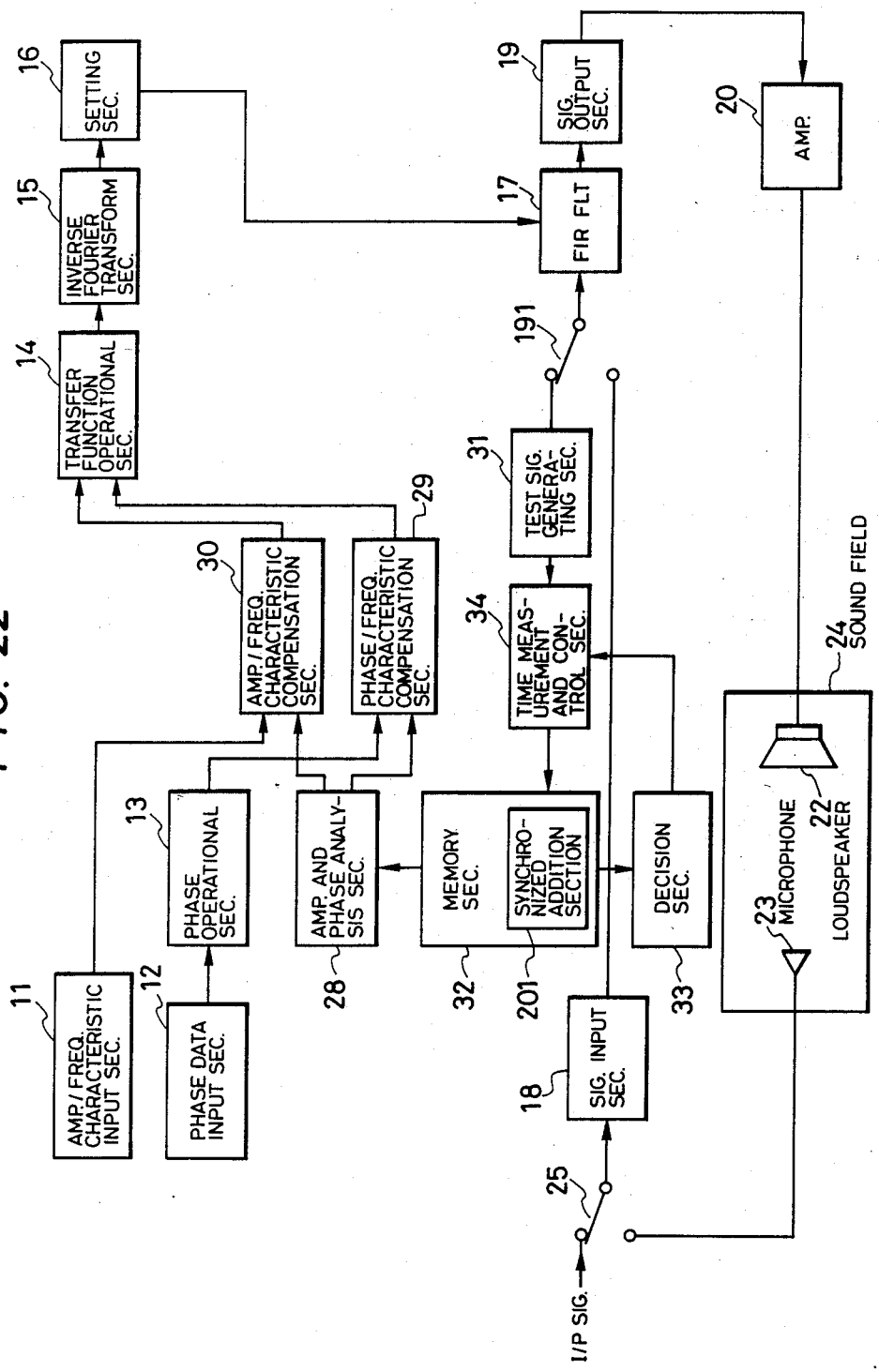
Figure 23A:
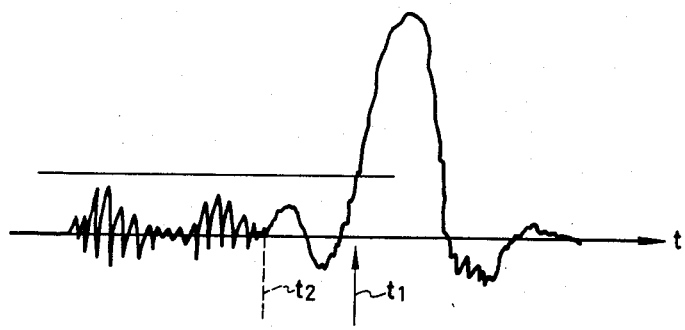
FIGS. 23(A) and (B) are diagrams for illustrating sampling of an initial portion of a measurement signal of the 15th embodiment.
Figure 23B:
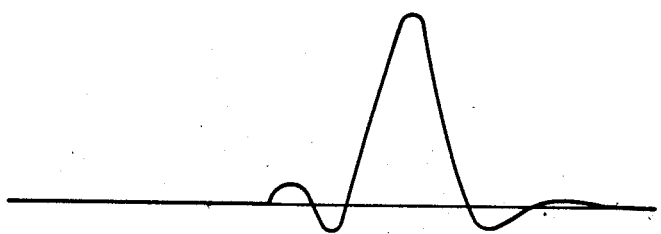
FIG. 23 (C) is a flow chart for describing the operation of the 15th embodiment.
Figure 23C:
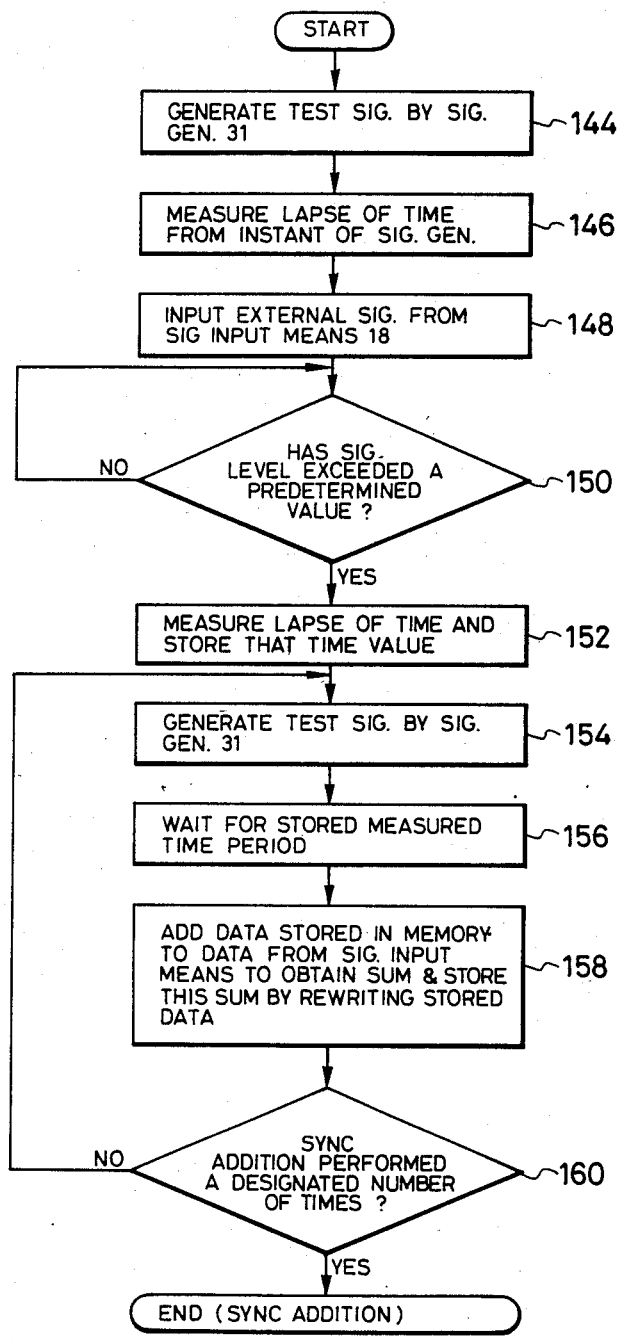

With the 14th embodiment described above, since the point in time at which the threshold level of the decision section is reached will be affected by fluctuations in the measurement signal caused by noise, etc., ideal superimposition of successive waveforms of the measurement signal will not be attained, i.e. precisely synchronized addition operation will not be achieved. FIG. 22 is a system block diagram of a 15th embodiment of the present invention which is a digital equalizer apparatus that is basically similar to the 14th embodiment described above, but in which an impulse noise is generated in the sound field 24 by driving a loudspeaker, and which includes means for overcoming the problem of synchronizing the addition operation as described above. As for the embodiment of FIG. 16 a test signal generating section 31 is operable for generating a test signal consisting of successive impulses, which can be transferred by a switch 191 through the FIR filter 17 and signal output section 19 to drive an external audio system. This system includes an amplifier 20 for driving a loudspeaker 22 located in the sound field 24. When the apparatus is set in a measurement mode of operation, i.e. with the test signal being applied by switch 191 to the FIR filter input and hence applied to drive the loudspeaker, acoustic impulse signals are generated within the sound field 24. Numeral 34 denotes an elapsed time measurement section, which controls the timing of initiating sequential addition operations by the synchronized addition section 201, during each occurrence of the measurement signal as described above. When a first impulse signal is generated by the test signal generating section 31, that signal is also applied to the elapsed time measurement section 34, to initiate elapsed time measurement. This time measurement is halted when the measurement signal is detected to have exceeded the threshold of the decision section 33, by a control signal applied from the decision section 33 to the elapsed time measurement section 34, i.e. at a time point $t_1$ shown in FIG. 23(A) that is defined with respect to the generated impulse signal from the test signal generating section 31. An elapsed time value is thereby measured and held in the elapsed time measurement section 34, and subsequently each time that an impulse signal is generated from the test signal generating section 31, a signal is applied from the elapsed time measurement section 34 to initiate operation of the synchronized addition section 201 after the value of time which has been measured and held as described above has elapsed, following the impulse signal timing. In this way the sequential addition operations are initiated at the same point in time with respect to each impulse produced from the test signal generating section 31, thereby ensuring more accurate superimposition of successive measurement signal waveforms as described hereinabove. FIG. 23(C) is a flow chart for illustrating an operation control sequence that is executed by the apparatus of FIG. 22 to function as described above. In FIG. 23(C), a first impulse is generated by test signal generating section 31 in step 144, elapsed time measurement is executed in step 146, and after it has been decided in step 150 that the decision level of the measurement signal has been reached, the value of elapsed time at that point is stored, in step 151. Thereafter, each time a test signal impulse is generated in step 154, synchronized addition is initiated in step 158 after the measured stored time interval has elapsed, and operation again returns to step 154.

As will be apparent from FIGS. 21(A) to (C), it is inevitable with the 14th embodiment described above that an initial portion of the measurement signal will not be stored in the memory section 32, i.e. a portion of the measurement signal which is below the threshold level of detection by the decision section 33 and which occurs prior to that threshold level being attained. This signal portion extends from time $t_2$ to $t_1$ in FIG. 23(A). For maximum accuracy of analyzing the measurement signal, it is desirable that such initial portions of the measurement signal be also stored in the memory section 32. The embodiment of FIG. 22 can therefore be modified such that initiation of sequential addition operations by the synchronized addition section 201 always occurs at the time $t8_2$ shown in FIG. 23(A), i.e. after a fixed time interval following generation of the impulse signal, which is shorter than the aforementioned measured elapsed time by a specific amount. In this way, each commencement of operation by the synchronized addition section 201 to derive and store updated sample values in the memory section 32, is synchronized with the generation of successive impulse signals by the test signal generating section 31, but occurs prior to the point at which the measurement signal reaches the detection threshold of the decision section 33. Thus, an initial portion of the measurement signal is utilized in deriving the final noise-free measurement signal waveform that is left stored in the memory section 32, as shown in FIG. 23(B).

In this way, the embodiment of FIG. 22 provides enhanced accuracy in analyzing the frequency characteristic of the measurement signal by the amplitude and phase analysis section 28, and hence increased accuracy of compensation for the sound field acoustic properties.

FIG. 24 is a system block diagram of a 16th embodiment of the present invention, which is a digital equalizer apparatus that is basically similar to the 12th embodiment of FIG. 17 but which further includes a window function section 35 for multiplying the measurement signal waveform stored in the memory section 32 by a window function. After a measurement signal waveform has been derived as described for the 12th embodiment above, and stored in the memory section 32, the stored data are read out from the memory section 32 and multiplied by the window function (e.g. a Hanning window function, a Hamming window function, etc.). The result is then stored in the memory section 32 to replace the previous data, and is utilized by the amplitude and phase analysis section 28 for analyzing the frequency characteristic of the measurement signal.

Figure 25A:
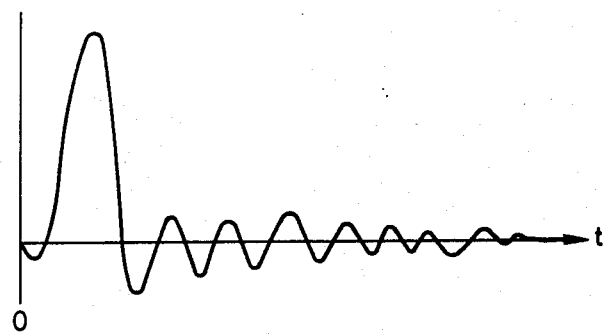
FIGS. 25 (A) to (C) and 26(A) to (F) are diagrams for assistance in describing window function operations executed by the 16th embodiment.
Figure 25B:
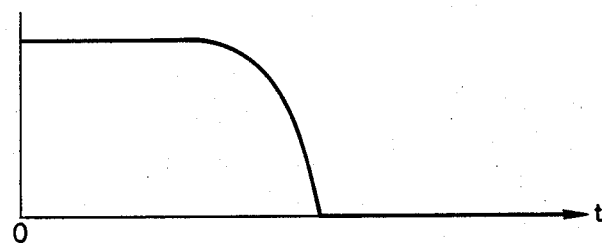
Figure 25C:
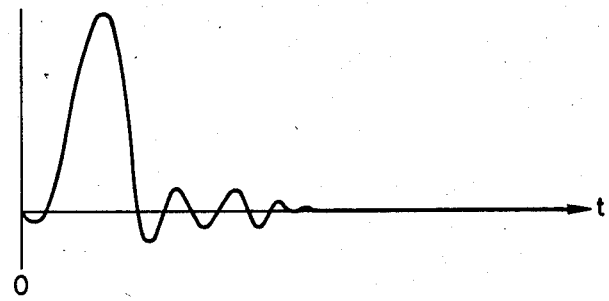

It is possible to utilize only a single window function with this embodiment, as illustrated by the waveforms of FIGS. 25(A) to (C). If the useful information of the stored measurement signal waveform is contained in an initial portion of that waveform, then multiplication by the window function enables that initial portion to be selected, and re-stored in the memory section 32. However it has been found preferable for the window function section 35 to operate such as to multiply the stored data by a plurality of different window functions, corresponding to respectively different frequency bands of the total frequency range in which the amplitude deviation/frequency characteristic and phase deviation/frequency characteristic are to be derived by the amplitude and phase analysis section 28. This operation is illustrated in FIGS. 26(A) to (F). Here, low, middle, and high frequency bands of the desired frequency range are indicated by the non-hatched portions in FIG. 26(A). By multiplying the stored measurement signal waveform, shown in FIG. 26(F), by each of the three window functions illustrated in FIG. 26(B), the resultant waveforms shown in FIG. 26(C) are respectively obtained, and these are respectively stored in the memory section 32. The lower the value of the lowest frequency in the range which is to be analyzed by the amplitude and phase analysis section 28, the greater should be the number of A/D converted samples that are used in the analysis, in order to obtain sufficient frequency resolution. With this embodiment, the window functions are selected such that a greater number of samples are utilized for deriving the low-frequency portion of the derived amplitude/frequency characteristic and phase/frequency characteristic of the measurement signal, while smaller numbers of samples are utilized the middle and upper-frequency bands of the frequency range. In this embodiment, three different amplitude/frequency characteristics are derived from the results of multiplication by the three different window functions, as shown in FIG. 26(D). The low-frequency portion of the characteristic derived using the greatest number of samples (the leftmost portion in FIG. 26(C) is utilized as the corresponding low frequency portion of the final amplitude/frequency characteristic derived by the amplitude and phase analysis section 28. Similarly, the mid-range and upper frequency band portions of the finally derived amplitude/frequency characteristic are obtained by utilizing the next-higher and the highest number of samples of the measurement signal, respectively, as shown in the central and rightmost portions of FIG. 26(D). The resultant composite amplitude/frequency characteristic derived by the amplitude and phase analysis section 28 (from which an amplitude deviation/frequency characteristic is derived as described hereinabove) is as shown in FIG. 26(E).

A similar use of multiple window functions can of course be employed to derive the phase/frequency characteristic of the measurement signal.

It can thus be understood that this embodiment, when a plurality of different window functions are utilized, enables the frequency characteristic of the measurement signal to be analyzed by utilizing a minimum amount of data, i.e. a minimum number of A/D conversion samples. Thus, a high degree of frequency resolution can be attained in the analysis processing executed by the amplitude and phase analysis section 28 together with rapid analysis operation.

The greater the frequency resolution that is required in analyzing the frequency characteristic of the measurement signal by the amplitude and phase analysis section 28, the longer must be the time for which the measurement signal is examined, i.e. the greater becomes the number of digital sample values that must be stored in the memory section 32. In order to minimize the storage capacity required for the memory section 32, it is desirable to minimize this number of samples that must be stored. FIG. 27 is a system block diagram of a 17th embodiment of the present invention, which is a digital equalizer apparatus that is basically similar to the 12th embodiment of FIG. 17 described above but which further includes means for reducing the amount of data which must be stored in the memory section 32 in order to analyze the frequency characteristic of the measurement signal. This reduction is achieved by the operation of a "data thinning-out" section 36. That is to say, since the sampling frequency of the input signal is fixedly determined (e.g. by the A/D converter of signal input section 18), a reduction in the effective number of data samples which are stored in the memory section 32 during a specific time interval (i.e. a time interval during samples of the measurement signal waveform are successively stored in the memory section 32 as described hereinabove, and which is sufficiently long to enable analysis of the lowest frequency components of the measurement signal) can only be attained by periodically omitting samples from the signal supplied to the memory section 32 from the signal input section 18. This periodic elimination of samples is executed by the "data thinning-out" section 36. In this way, the duration of the portion of the measurement signal waveform that is analyzed by the amplitude and phase analysis section 28 can be made sufficiently long for achieving accurate results, while minimizing the amount of storage capacity required for the memory section 32.

Figure 28:
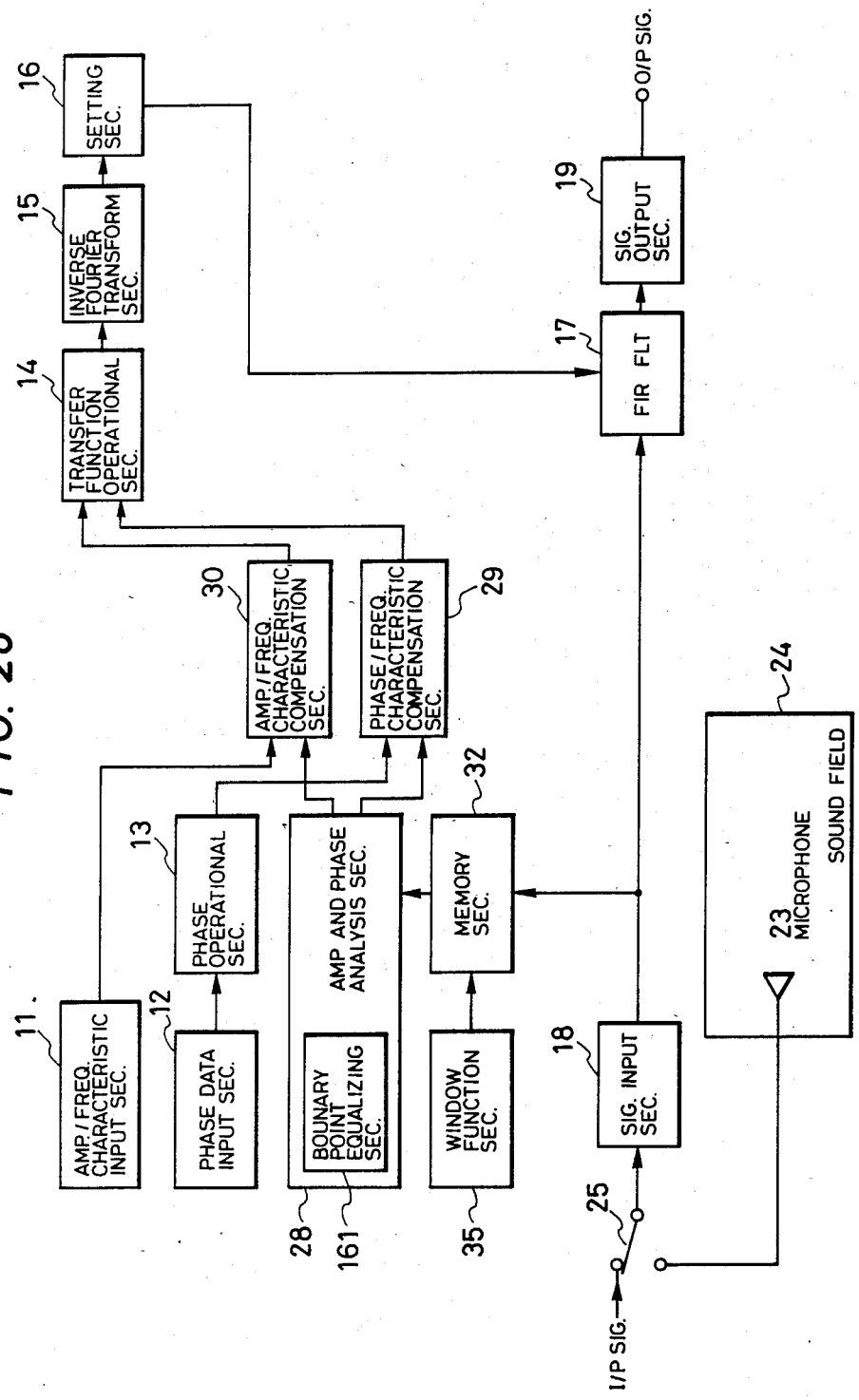

FIG. 28 is a system block diagram of an 18th embodiment of the present invention, which is a digital equalizer apparatus that is basically similar to the 16th embodiment of FIG. 24 described hereinabove in which a plurality of window functions are utilized, with sections corresponding to sections in FIG. 24 being designated by corresponding reference numerals. Referring again to FIG. 26, the black triangles shown in FIG. 26(D) indicate the boundary frequencies of the respective portions of three amplitude/frequency characteristics (or phase/frequency characteristics) which have been derived utilizing three different window functions as described hereinabove. In general, the amplitude (or phase) value at each of these boundary frequencies will not be equal to the corresponding value of an amplitude/frequency characteristic derived using a different window function. Thus for example the amplitude at the boundary frequency indicated as $BF_1$ of the low-band amplitude/frequency characteristic in FIG. 26(D) will not be identical to that at the boundary frequency $BF_2$ of the mid-band amplitude/frequency characteristic. Thus the low-band and mid-band characteristic portions may not be smoothly combined to form the overall amplitude/frequency characteristic shown in FIG. 26(E).

In the embodiment of FIG. 28 this problem is overcome by a boundary point equalizing section 161 in the amplitude and phase analysis section 28, which functions to add a constant value to at least one of the plurality of amplitude/frequency characteristics (or phase/frequency characteristics) derived using the multiple window functions, with this constant value being determined such that the amplitude (or phase) values at corresponding boundary frequencies as described above will be made identical. A satisfactory overall amplitude/frequency characteristic (or phase/frequency characteristic) can thereby be obtained by combining respective portions of the different characteristic obtained using the different window functions.

Figure 29:
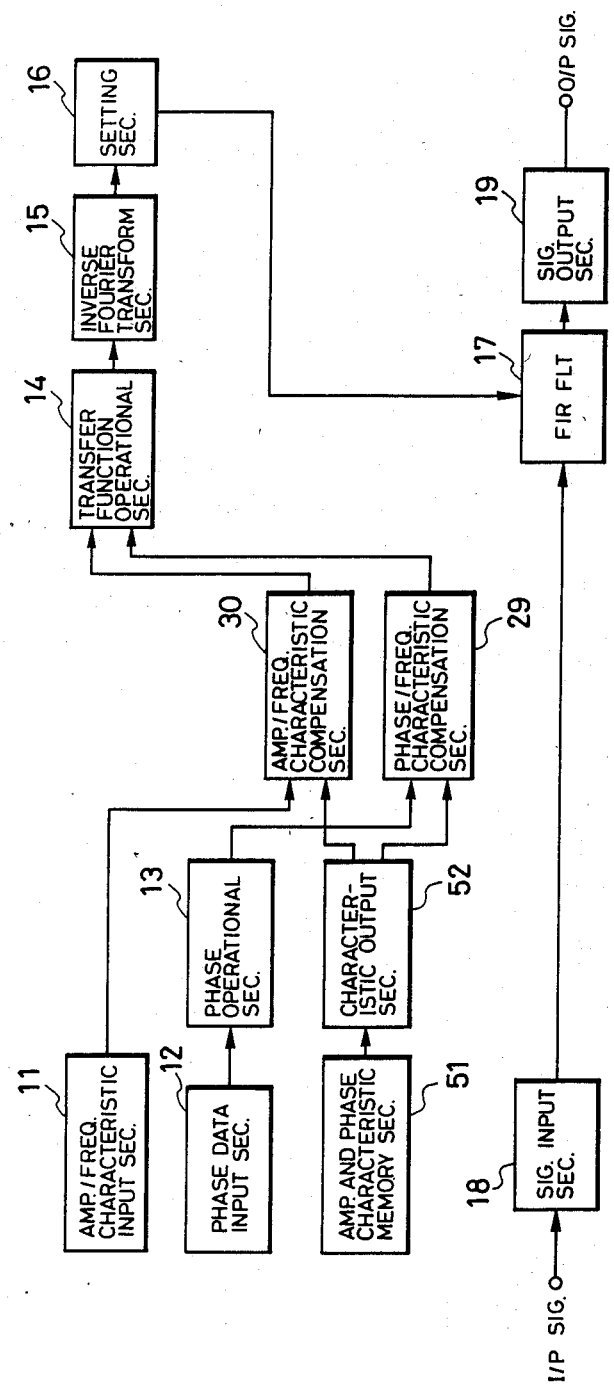
FIG. 29 is a system block diagram of a 19th embodiment of the present invention, with a memory having stored therein phase/frequency characteristics for use in compensating a loudspeaker group delay characteristic in a plurality of frequency ranges, together with related amplitude/frequency characteristic data, which are applied to modify a FIR filter transfer function.

FIG. 29 is a system block diagram of a 19th embodiment of a digital equalizer according to the present invention, whereby the phase/frequency characteristic of the FIR filter 17 can be controlled such as to automatically compensate for the group delay characteristic of a loudspeaker which is driven by an audio signal that has been transferred through the FIR filter 17. Numeral 51 denotes an amplitude and phase characteristic memory section having stored therein, mutually independently, a phase deviation/frequency characteristic for use in compensating a low frequency region of the loudspeaker group delay characteristic, a phase deviation/frequency characteristic for use in compensating low and mid-range frequency regions of the loudspeaker group delay characteristic, and a phase deviation/frequency characteristic for use in compensating the entire frequency range of the loudspeaker group delay characteristic. The amplitude and phase characteristic memory section 51 also has stored therein an amplitude deviation/frequency characteristic for use in compensating undulations which occur in the amplitude/frequency characteristic of the FIR filter 17 that is established by the filter coefficients applied to the FIR filter 17 from the setting section 16, as a result of the correction of the phase/frequency characteristic of the FIR filter 17 that is executed based on the phase deviation/frequency characteristic data from the amplitude and phase characteristic memory section 51.

More specifically, the phase deviation/frequency characteristic data stored in the amplitude and phase characteristic memory section 51 are transferred through a characteristic output section 52 to be added in a phase/frequency characteristic computation section 29 to the phase/frequency characteristic data produced from the phase operational section 13. The filter coefficients that are derived by the inverse Fourier transform section 15 and applied by the setting section 16 to the FIR filter 17 thereby produce a phase/frequency characteristic for the FIR filter 17 which provides compensation for the group delay characteristic of the loudspeaker, in each of the three frequency ranges described above (with the phase/frequency characteristic of the FIR filter 17 also of course being modified by the phase/frequency data from the phase operational section 13). However as a result of this adjustment of the phase/frequency characteristic of the FIR filter 17 to provide loudspeaker group delay characteristic compensation, some undulations or ripple will appear in the amplitude/frequency characteristic of the FIR filter 17. In order to ensure a flat amplitude/frequency characteristic for the FIR filter 17 (other than any modifications to that characteristic produced by the data inputted from the amplitude/frequency characteristic input section 11), amplitude deviation/frequency characteristic data are stored in the amplitude and phase characteristic memory section 51 in correspondence with the phase deviation/frequency characteristic data described above and are transferred by the characteristic output section 52 to the amplitude/frequency characteristic computation section 30, for thereby modifying the amplitude/frequency characteristic of the FIR filter 17 such as to compensate that amplitude/frequency characteristic for the effects of the phase/frequency data applied from the amplitude and phase characteristic memory section 51. That is to say, at each frequency for which a value of phase deviation data is stored in the amplitude and phase characteristic memory section 51, a corresponding value of amplitude deviation data is also stored. This value of amplitude deviation data is determined such as to produce a modification of the amplitude/frequency characteristic of the FIR filter 17 which will compensate for any effect upon that amplitude/frequency characteristic produced as a result of the corresponding phase deviation data value.

With this embodiment, due to the fact that separate phase deviation/frequency characteristic data are utilized for the low, low-to medium, and overall frequency range compensation for the loudspeaker group delay characteristic, highly accurate compensation can be achieved. In addition, a flat amplitude/frequency response is maintained in spite of the phase compensation thus applied by the FIR filter 17.

The amplitude and phase characteristic memory section 51 can be configured as a ROM (read-only memory), or a RAM (random access memory).

Figure 30A:
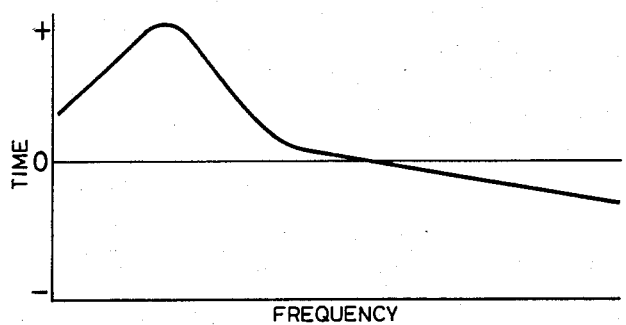
FIGS. 30(A) to (C) are diagrams for illustrating group delay characteristic compensation by the 19th embodiment.
Figure 30B:
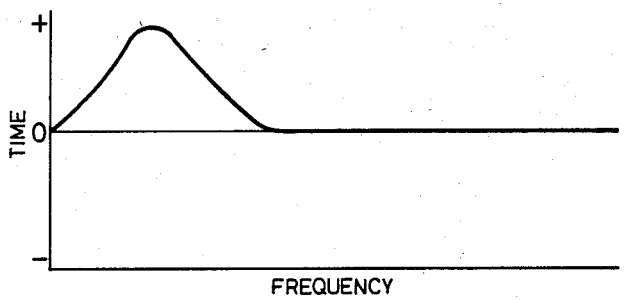
Figure 30C:
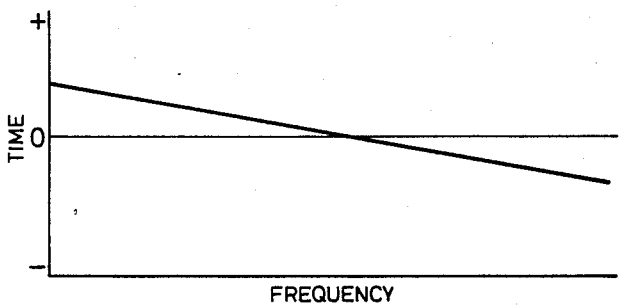

FIG. 30(A) conceptually illustrates the group delay deviation characteristic of a loudspeaker over the entire usable frequency range of the loudspeaker. Such a group delay deviation characteristic can be divided into the group delay deviation characteristic shown in FIG. 30(B) for the low end of the frequency range, and that shown in FIG. 30(C) for the middle portion of the frequency range. These three different group delay deviation characteristics have respectively different effects upon the sound quality produced by the loudspeaker. The amplitude and phase characteristic memory section 51 has stored therein the inverse phase deviation/frequency characteristics to phase deviation/frequency characteristics respectively derived from these three respectively group delay deviation characteristics for the low, middle and overall portions of the frequency range as described above, and these inverse phase deviation/frequency characteristics are added in the phase/frequency characteristic compensation section 29 to the phase/frequency characteristic produced from the phase operational section 13.

It should be noted that this embodiment is not limited to compensation for a loudspeaker group delay characteristic, and that various other effects can be achieved by storing other types of predetermined phase/frequency characteristic and amplitude/frequency characteristic data in the amplitude and phase characteristic memory section 51. For example data can be stored such as to apply compensation by the FIR filter 17 in order to render both the amplitude/frequency and phase/frequency response of a specific loudspeaker completely flat.

It can thus be understood that data for producing any arbitrary desired form of frequency characteristic to be produced by the FIR filter 17 can be stored in the amplitude and phase characteristic memory section 51, and that these frequency characteristics can be easily changed by changing the stored data.

Figure 31:
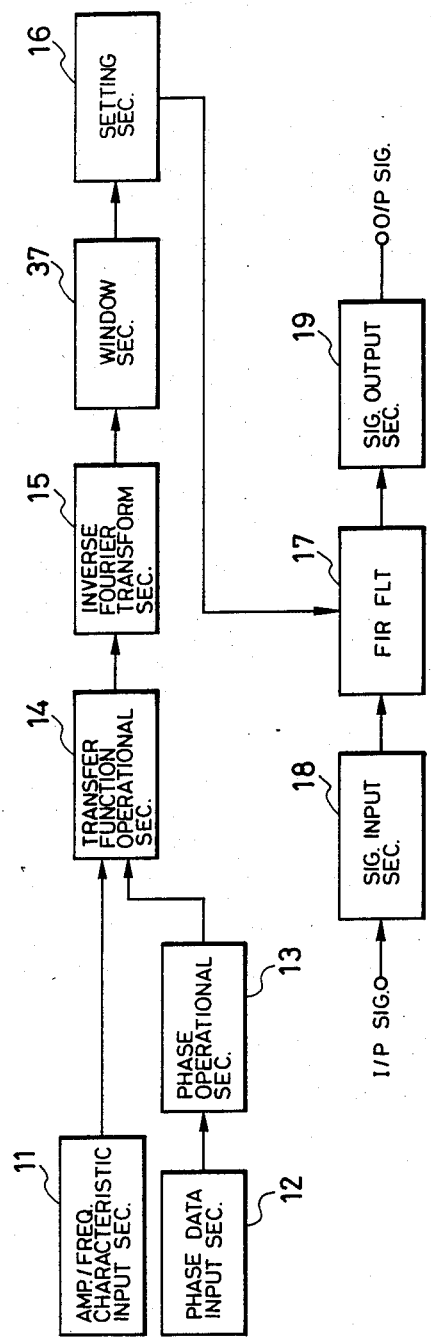
FIG. 31 is a system block diagram of a 20th embodiment of the present invention, in which an inverse Fourier transform of a transform function computed for a FIR filter is multiplied by a window function before utilization for establishing filter coefficients.

FIG. 31 is a system block diagram of a 20th embodiment of the present invention, in which sections corresponding to those of previously described embodiments are indicated by identical reference numerals. This embodiment is characterized by including a window function section 37, for multiplying the inverse Fourier transform results obtained from the inverse Fourier transform section 15 by a specific window function. If the filter coefficients (i.e. inverse Fourier transform derived by the inverse Fourier transform section 15) are applied directly to the FIR filter 17, then undulations arise in the frequency characteristic of the filter. In order to prevent this, the inverse Fourier transform results are multiplied by a window function in this embodiment, such as a Hanning window, and the results are applied as the filter coefficients of the FIR filter 17.

Figure 32:
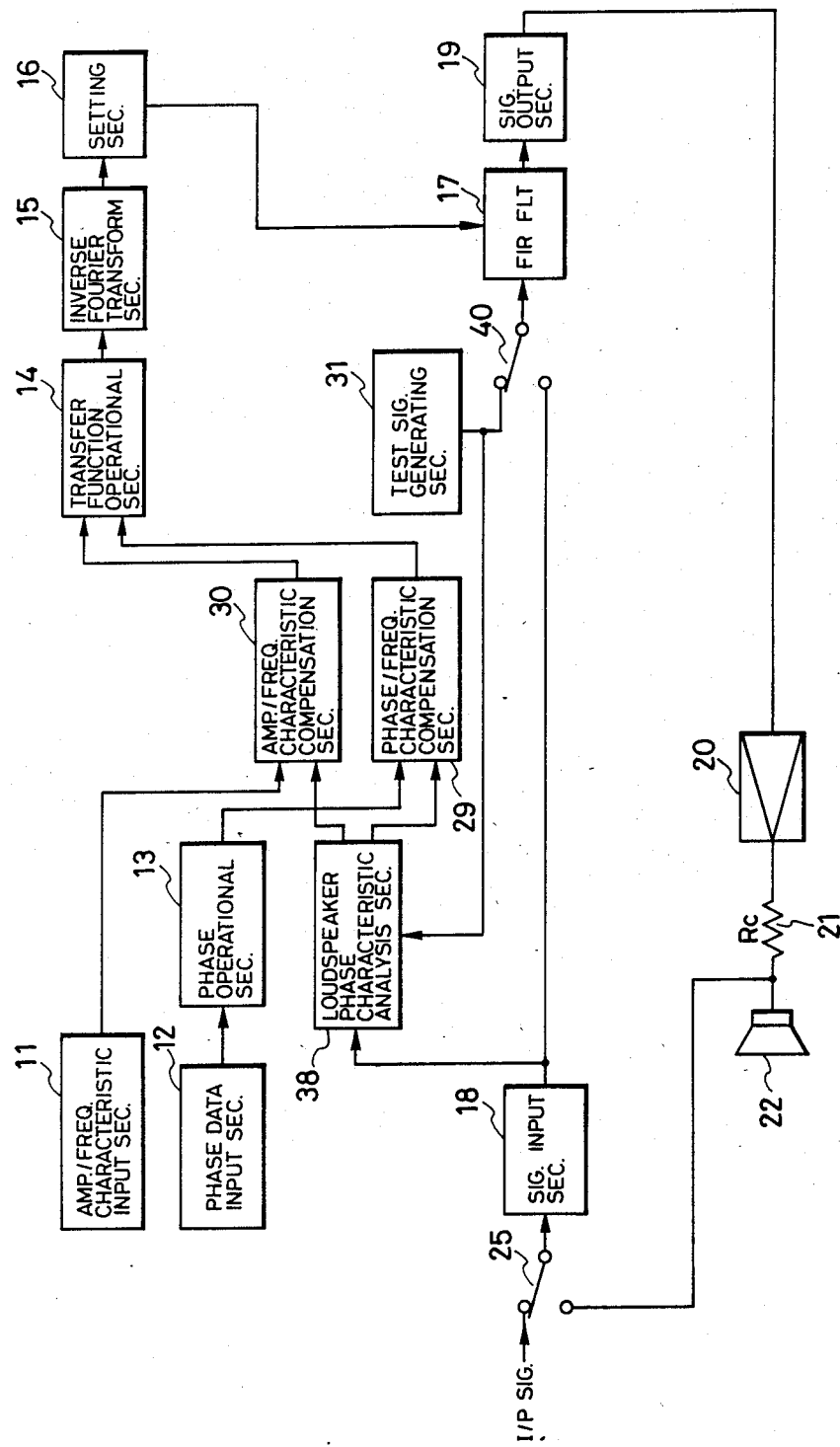
FIG. 32 is a system block diagram of a 21st embodiment of the present invention, enabling equalization for the phase/frequency characteristic of a loudspeaker.

FIG. 32 is a system block diagram of a 21st embodiment of the present invention, shown with the output signal from the signal output section 19 applied through an amplifier 20 and loudspeaker 22. A switch 19 can be set to supply to the signal input section 25 either an input audio signal (during normal operation) or a measurement signal for analyzing frequency characteristics of the loudspeaker, produced as described hereinafter (during measurement operation). A loudspeaker phase characteristic analyzing section 38 serves to analyze the measurement signal thus obtained, to derive the phase deviation/frequency characteristic and amplitude deviation/frequency characteristic of that signal. These are respectively added to the phase/frequency characteristic produced from the phase operational section 13 and the amplitude/frequency characteristic from the amplitude/frequency characteristic input section 11, in the phase/frequency characteristic compensation section 29 and amplitude/frequency characteristic compensation section 30 respectively, as described for previous embodiments, such as to establish filter coefficients for the FIR filter 17 whereby compensation is executed for variations in the loudspeaker frequency response characteristics.

Numeral 31 denotes a signal generating section which is operable for generating a test signal such as an impulse, sine wave, or random noise signal. When the system is set up for analyzing the loudspeaker frequency characteristic, the amplitude/frequency characteristic and phase/frequency characteristic of the FIR filter 17 are first set by the setting section 16 such as to be uniformly flat. The output from the test signal generating section 31 is then applied through the FIR filter 17 and signal output section 19 to the audio amplifier 20 which derives the loudspeaker 22. A signal measurement resistor 21 is coupled between the output of the amplifier 20 and the loudspeaker 22, and during loudspeaker characteristic analysis operation a measurement signal which is developed across this resistor 21 is transferred through an input switch 25 to the signal input section 18, to be converted into a digital sample signal. This signal is supplied to the loudspeaker phase characteristic analyzing section 38, together with the test signal produced from the test signal generating section 31, to analyze the measurement signal and thereby derive the amplitude deviation/frequency characteristic and phase deviation/frequency characteristic described above.

When amplitude/frequency characteristic and phase/frequency characteristic data have thereby been derived by the amplitude/frequency characteristic compensation section 30 and phase/frequency characteristic compensation section 29 respectively based upon this amplitude deviation/frequency characteristic in conjunction with the amplitude/frequency characteristic produced from the amplitude/frequency characteristic input section 11, and the phase deviation/frequency characteristic in conjunction with the phase/frequency characteristic produced from the phase operational section 13, a corresponding transfer function is derived by the transfer function operational section 14, and corresponding filter coefficients are thereby computed by the inverse Fourier transform section 15. These filter coefficients are then established for the FIR filter 17 by operation of the setting section 16. The switch 25 is then changed over to its other position to apply an audio input signal to the signal input section 18, while switch 40 is changed over to supply the digital sample signal from the signal input section 18 to the input of the FIR filter 17. The input audio signal is thereby reproduced by the loudspeaker 22, with effectively flat phase and frequency response characteristic being established for the audio system.

It can be understood from the above that the loudspeaker phase characteristic analyzing section 38 in effect analyzes the phase characteristic of the loudspeaker 22, i.e. the loudspeaker group delay characteristic, and data thus obtained are applied to modify the frequency characteristic of the FIR filter 17 such as to compensate for the loudspeaker group delay characteristic.

Figure 33:
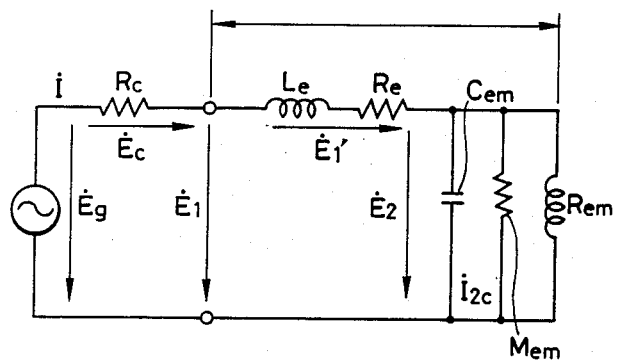
FIG. 33 is an equivalent circuit diagram of a loudspeaker.
Figure 34:
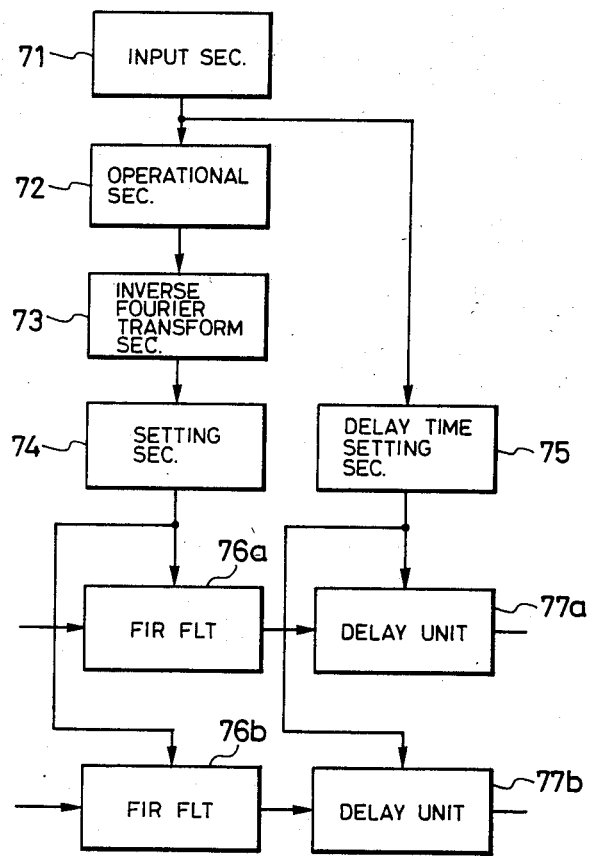
FIG. 34 is a partial system block diagram of a 22nd embodiment of the present invention, whereby either a linear transform method or Hilbert transform method can be selected for computing filter coefficients.

FIG. 33 shows an equivalent circuit for the loudspeaker 22 in combination with the output of amplifier 20 and the measurement resistor 21, whose resistance value is designated as $R_C$. In FIG. 34, $E_g$, $E_c$, $E_1$ and $E_2$ denote respective voltage vectors, I and $I_{2c}$ are current vectors.

FIG. 34 is a partial system block diagram of a 22nd embodiment of the invention. This is a digital equalizer apparatus in which, as in the 7th embodiment of FIG. 10 described above, an input audio signal transferred through the signal input section 18 is divided into a plurality of different frequency bands by respective digital band pass filters, the outputs from these band pass filters are supplied to respectively down-sampling sections which function to reduce the data rate by "thinning out" a portion of the digital data samples, and are then transferred through respectively FIR filters, to be outputted from respective output sections or recombined and outputted through a single output section as shown in FIG. 11. Further description of this process will therefore be omitted. Only the plurality of FIR filters (in this case two FIR filters 17a and 17b) are shown in FIG. 34, and processing of the input and output signals of these filters can be executed as shown in FIG. 10, 11 or 12.

In the embodiment of FIG. 34, numeral 71 denotes an input section, which is utilized to input data representing an arbitrary amplitude/frequency characteristic, in the form of a set of amplitude sample values (abbreviated in the following to "sample values") for respective ones of a set of frequencies (referred to in the following as sample frequencies) spaced throughout an audio frequency range. The "sample values" referred to in the following with reference to data which are fixedly supplied from the input section 71 are to be distinguished from the "digital sample values" (produced by A/D conversion) which are processed by the FIR filters, since these are not related. In general, if the number of these sample frequencies is N and the audio frequency range to be processed extends over F Hz, these sample frequencies will be spaced at equal intervals of F/N Hz throughout the frequency range. Numeral 72 denotes an operational sectional for deriving a transfer function based on a low-frequency band of the inputted amplitude/frequency characteristic, i.e. corresponding to a first sub-set of these sample frequencies which are within a low-frequency band of the aforementioned audio frequency range, whereby a first set of filter coefficients are derived for the FIR filter 76a by an inverse Fourier transform section 73. The operational section 72 further derives a transfer function corresponding to a high-frequency band of the input amplitude/frequency characteristic, i.e. corresponding to a second sub-set of these sample frequencies within a high-frequency band of the overall frequency range, whereby a second set of filter coefficients are derived for the FIR filter 76b by the inverse Fourier transform section 73. The low frequency band referred to above (of the first sub-set of sample frequencies) corresponds to the frequency band of the input audio signal that has been selected to be processed by the FIR filter 76a as described for the 7th embodiment of FIG. 10, and that of the second sub-set of sample frequencies corresponds to the frequency band that has been selected to be processed by the FIR filter 76b.

In general, the delay time between input of a signal to FIR filter 76a and output of the signal from FIR filter 76a will be different from the corresponding delay time of FIR filter 76b. Numeral 75 denotes a delay time setting section, which determines delay time adjustment values which are respectively applied to control values of delay which are established by first and second delay units 77a and 77b, such that an identical value of overall delay time is established between input to FIR filter 76a and output from delay unit 77a and between input to FIR filter 76b and output from delay unit 77b.

Figure 35:
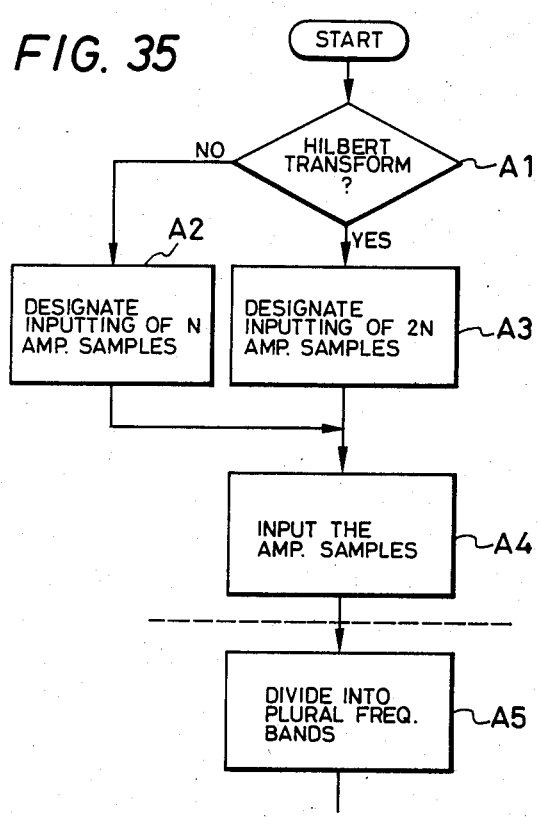
FIG. 35 is a flow chart for describing the operation of the 22nd embodiment.

This embodiment is characterized in that the transfer function operational section 72 can be controlled to derive the transform functions described above either by a linear phase transform operation or by a Hilbert transform operation upon the amplitude/frequency characteristic data supplied from the input section 71. As for the previously described embodiments of the invention, the functions of each of the sections shown in FIG. 34 are controlled by a programmed digital microprocessor. The sequence of operations thus controlled will be described referring first to the flow chart of FIG. 35. First, a decision is made (in step A1) as to which type of operation is to be executed to derive the filter coefficients, i.e. the direct phase transform method or the Hilbert transform method. One of these methods is selected beforehand by the user, i.e. by actuating a selection switch (not shown in the drawings). If the direct phase method is to be utilized, then operation moves to step A2 whereby data for the set of sample values at respective sample frequencies defining an arbitrary amplitude/frequency characteristic as described above, are selected to be inputted for transform processing in the succeeding step A4. The number of sample values in that case is indicated as N. If on the other hand the Hilbert transform method is selected, then operation moves from step A1 to step A3, in which 2N sample values, at 2N corresponding sample frequencies, are selected to be subjected to Hilbert transform for obtaining the filter coefficients of the FIR filters. In this case the number of sample values is double that for the case of the linear phase transform method. These 2N sample values are then inputted for transform processing, in step A4.

Prior to this transform processing, in step A5, the N (or 2N) sample values are divided into the two sub-sets described above, respectively within the high and low frequency bands. Transform processing of the sample values is then performed by the transfer function operational section 72, either by the linear phase method or the Hilbert transform method, in accordance with the decision made in step A1. The inverse Fourier transform of the results is then executed by the inverse Fourier transform section 73, to thereby obtain an impulse response characteristic and hence a set of filter coefficient values for the high frequency band, which are then established for FIR filter 76a by control signals applied from the setting section 74, and a set of coefficient values for the low frequency band which are similarly established for the FIR filter 76b.

With the number of sample frequencies designated as N, a periodic function h(n) (i.e. a periodic function which can be expressed as a discrete time series) can be expressed as the sum of an even function $h_e(n)$ and an odd function $h_o(n)$, i.e.:

$$h(n) = h_e(n) + h_o(n) \tag{6}$$

In the above, n=0 to (N−1)

The periodic causality can be defined by the following equations $$h(n) = 0 \quad -N/2 < n < 0 \text{ tm} \tag{7}$$

$$h(n) = h_e(n) \cdot u(n) \tag{8}$$

In the above:

$$u(n) = \begin{array}{lll} 1 & n = 0 \text{ to } N/2 \\ 2 & n = 1 \text{ to } (N/2) - 1 \\ 0 & n \neq (N/2) + 1 \text{ to } (N-1) \end{array}$$

In this way, h(n) can be obtained from $h_e(n)$

As shown above, h(n) is zero within the range n−(N/2)+1 to (N−1). With the Hilbert transform, computation is performed for the range n =1 to N, and n is assumed to be zero between n=(N+1) to (2N−1), and as a result the frequency resolution that can be obtained with the Hilbert transform method is twice that which can be obtained by the linear phase transform method.

Figure 36:
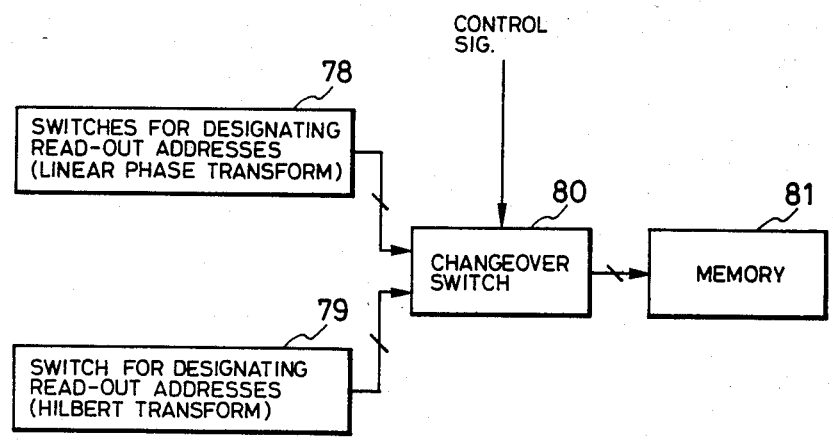
FIG. 36 is a block diagram illustrating switch selection of input data for the 22nd embodiment.

The sets of sample values for the sample frequencies described above are stored in a memory 81 shown in the system block diagram of FIG. 36. Numeral 78 denotes a set of switches which can be respectively set to produce address data for designating read-out of the N sample values for the arbitrary amplitude/frequency characteristic described above, while 79 denotes a set of switches which can be respectively set to produce address data for designating read-out of the 2N sample values for the arbitrary amplitude/frequency characteristic. These switches can be set by the user. The requisite address data, from either switches 78 (if the linear phase transform method is to be used) or switches 79 (if the Hilbert transform method is to be used) are then selected by the user to be applied to the memory 81, to produce read-out of either the N sample values or the 2N sample values from storage in the memory 81, by means of a changeover switch 80 which is controlled by a control signal applied as shown. The decision made in step A1 of the flow chart of FIG. 35 will of course be based upon the status of the latter control signal.

Although the above embodiment has been described for the case of transferring the input audio signal through only two FIR filter channels, by dividing the audio signal into two frequency bands, it would of course be equally possible to divide the audio signal into a greater number of frequency bands which are processed by corresponding FIR filter channels.

Figure 37:
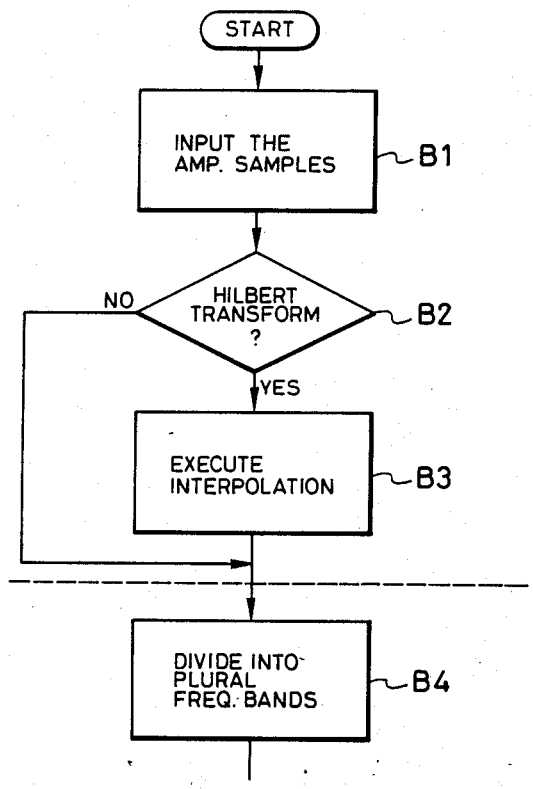
FIG. 37 is a flow chart for describing a 23rd embodiment of the present invention.

FIG. 37 is a flow chart to illustrate the operation of a 23rd embodiment of the present invention. This is almost identical in configuration to the 22nd embodiment described above, so that the system block diagram of this embodiment is omitted. This embodiment differs from the 23rd embodiment in the following points:

(a) Only a single set of N sample values for corresponding sample frequencies are stored in the memory 81 shown in FIG. 36. Thus, the setting switches 79 and changeover switch 80 of FIG. 36 are not required.

(b) To obtain the requisite number of amplitude/frequency characteristic sample values for the case of Hilbert transform operation being selected, i.e. 2N values, interpolation is performed using the N values that are read out from the memory 81, to obtain additional N values.

Thus with this embodiment as shown in FIG. 37, the N sample values of the arbitrary amplitude/frequency characteristic are inputted in an initial step B1, then a decision is made in step B2 as to whether or not the linear phase transform or the Hilbert transform method is to be utilized to derive filter coefficient values to be set for the FIR filters 76a, 76b. If the linear phase method is to be used, then the N sample values are transferred directly to the transfer function operational section 72, after having been divided into the two subsets in accordance with the two frequency bands as described for the previous embodiment, and sets of filter coefficients for the FIR filter 76a and 76b respectively derived and established. If on the other hand the Hilbert transform method is to be used, then the N sample values read out from memory 81 are used to derive a set of N interpolated sample values, for sample frequencies which are intermediate between those of the sample values read out from memory 81.

Figure 38A:
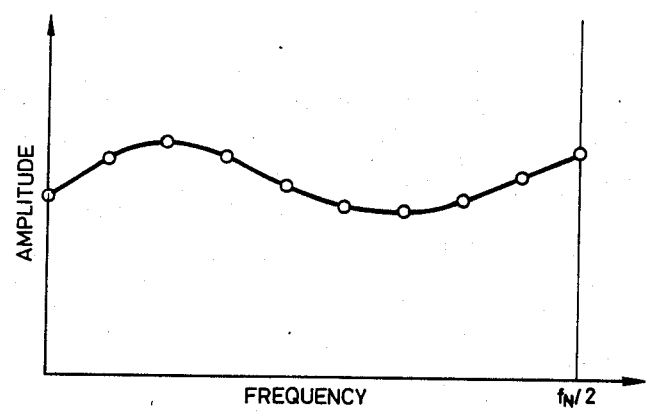
FIGS. 38(A) and (B) are characteristic diagrams for describing an interpolation operation of the 23rd embodiment.
Figure 38B:
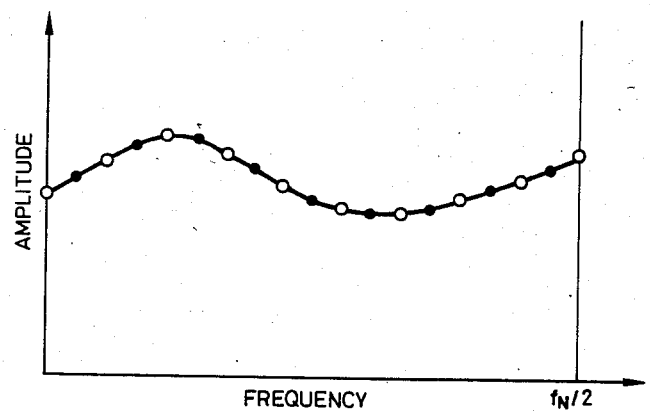

This process is illustrated in FIG. 38, in which FIG. 38(A) shows an example of an amplitude/frequency characteristic which is read out from the memory 81 as a set of sample values of amplitude (indicated by the small circles). If the Hilbert transform method is to be used to derive the filter coefficients, then interpolated values are derived as shown by the black dots in the characteristic of FIG. 38(B). As shown, the sample frequency of each of these interpolated values is between two adjacent sample frequencies of the set of values read out from memory 81.

Various methods of interpolation can be utilized, including linear interpolation, high-order interpolation, etc.

As for the 22nd embodiment of FIG. 34, compensation is provided by delay units for differences in signal delay through the FIR filters 76a, 76b.

Also as for the embodiment of FIG. 34, this embodiment enables either the linear phase method or the Hilbert transform method to be selected for deriving the filter coefficients of the FIR filters, with the choice being determined by the relative advantages and disadvantages of each of these methods.

With each of the 22nd and 23rd embodiments described above, the difference between the respective signal transfer delays of the FIR filters 76a, 76b may vary in accordance with whether the linear phase transform or Hilbert transform method is utilized, so that it may be desirable to arrange that the degree of delay time compensation applied by the delay units 77a, 77b is automatically adjusted in accordance with the transform operation method that is selected.

From the above it can be understood that the 22nd and 23rd embodiments of the invention each provide a single apparatus which enables either the linear phase transform method or the Hilbert transform method to be utilized in computing the filter coefficients, to thereby determine the amplitude/frequency characteristic and phase/frequency characteristic of each of a plurality of FIR filters used to process an audio signal divided into a plurality of frequency bands.

Figure 39:
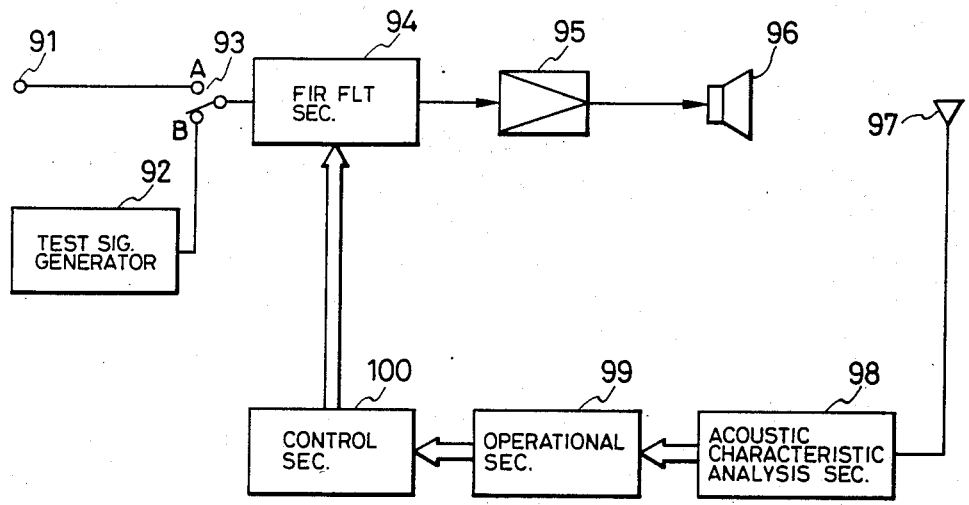
FIG. 39 is a system block diagram of a 24th embodiment of the present invention, enabling the acoustic characteristics of a sound field to be analyzed and corresponding equalization implemented.

FIG. 39 is a system block diagram of a 24th embodiment of the present invention, which is a digital equalizer having a sound field compensation function. This embodiment will be described referring to the flow chart of FIG. 40 and the graphs of FIG. 41. This embodiment also includes means for inputting a desired amplitude/frequency characteristic and phase/frequency characteristic to modify the frequency characteristic of the FIR filter, as described for previous embodiments, which are omitted from the drawings.

In FIG. 39, numeral 91 denotes an input terminal from which is applied an input audio signal. An input switch 93 is operable for selecting either this audio signal or a test signal produced from a test signal generating section 92 to be supplied to the input of a FIR filter section 94. The test signal can be an impulse signal, pink noise signal, wobble tone, etc. The FIR filter section 94 consists of a combination of an A/D converter for converting the input signal from switch 93 to digital samples, a FIR filter through which this digital signal is transferred, and a D/A converter for converting the output signal from the FIR filter to analog form, to be supplied through an amplifier 95 to drive a loudspeaker 96. A microphone 97 is positioned to receive sound emitted from the loudspeaker 96 to produce a detected signal that is applied to an acoustic characteristic analysis section 98. The amplitude/frequency characteristic and phase/frequency characteristic of the detected signal are measured by the acoustic characteristic analysis section 98, and the results supplied to an operational section 99. The operational section 99 functions to produce filter coefficients for the FIR filter of the FIR filter section 94, in a similar manner to that described for the previous embodiments, and these filter coefficients are then set into the FIR filter by a setting section 100.

To measure the acoustic characteristic of a sound field, i.e. a room in which the loudspeaker 96 is positioned, the input switch 93 is set to its B position, to thereby transfer the test signal produced from the test signal generating section 92 to the input of the FIR filter section 94, and to be transferred through the FIR filter section 94 and amplifier 95 to be emitted by the loudspeaker 96. The resultant sound is converted into a detection signal by the microphone 97, which is then analyzed by the acoustic characteristic measuring section 98 to derive a sound pressure/frequency characteristic. The method of deriving a compensation characteristic with this embodiment is as follows, referring to the processing sequence shown in FIG. 40. The transfer frequency characteristic of the measured sound field can be expressed as $|H(e^j)|$, and an example of this is shown in FIG. 41(A). Designating the desired sound pressure/frequency characteristic at the listening point (i.e. the position of microphone 97) as $|F(e^j)|$, the compensation characteristic is the absolute value $|G(e^j)|$, which is obtained as:

$$|G(e^j)| = |F(e^j)| \div |H(e^j)|$$

Figure 40:
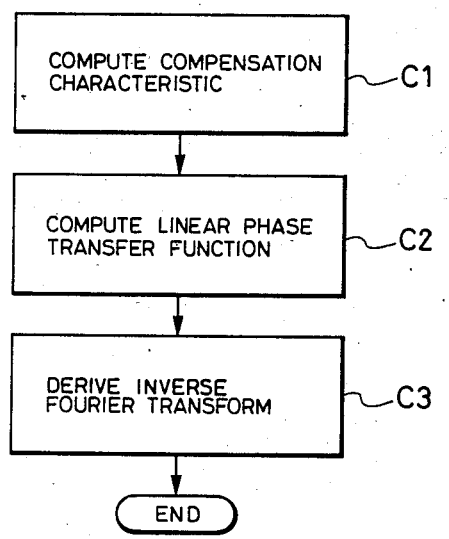
FIG. 40 is a flow chart for describing the operation of the 24th embodiment.
Figure 41A:
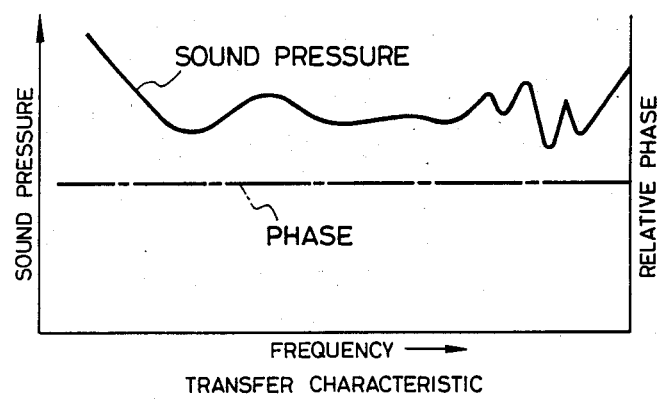
FIGS. 41(A) and (B) respectively show a transfer characteristic with respect to a listening position, and an impulse response characteristic which determines filter coefficient values for a FIR filter, for the 24th embodiment.
Figure 41B:
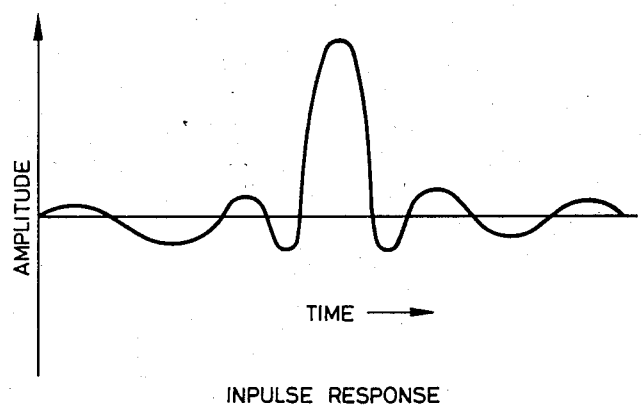

This compensation characteristic is computed in step C1 of FIG. 40. Step C2 is then executed, whereby a linear phase transform of the compensation characteristic is computed. The inverse Fourier transform of this linear phase transform is then derived, in step C3. The results of this inverse Fourier transform are graphically illustrated in FIG. 41(C). This is an impulse response characteristic, and the respective values of the filter coefficients of the FIR filter in the FIR filter section 94 are defined by this characteristic. These filter coefficient values are then set into the FIR filter by the setting section 100, to thereby determine the amplitude/frequency characteristic and phase/frequency characteristic of the FIR filter.

Upon completion of setting the filter coefficients in this way, the input switch 93 is set to its A position, whereby an input audio signal is supplied to the input of the FIR filter section 94. A flat sound pressure/frequency characteristic (or other form of characteristic, by inputting a desired amplitude/frequency characteristic and/or phase frequency characteristic as described for previous embodiments) can thereby be obtained at the listening position.

Figure 42:
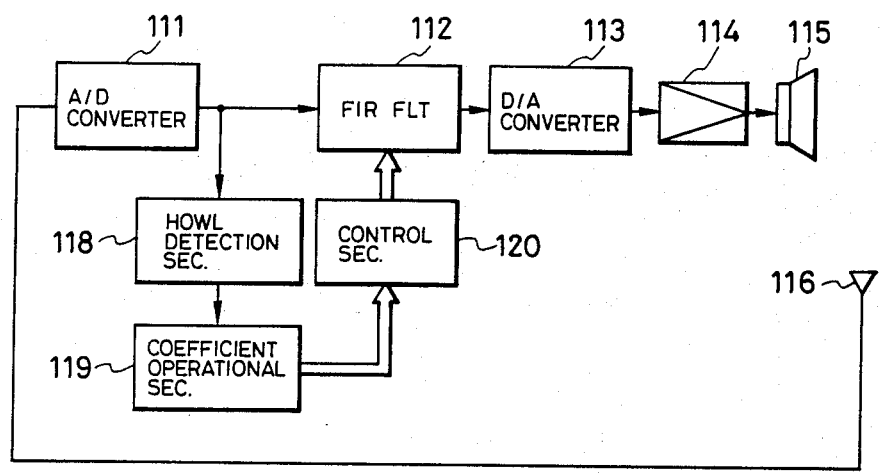
FIG. 42 is a system block diagram of a 24th embodiment, having a microphone howl suppression capability.

FIG. 42 is a system block diagram of a 25th embodiment of a digital equalizer according to the present invention. This has a function for suppressing "microphone howl" caused by acoustic feedback between a loudspeaker which is driven by an amplifier and a microphone which supplied an input signal to that amplifier. In FIG. 42 numeral 111 denotes an A/D converter, 112 a FIR filter, 113 a D/A converter, 114 an audio amplifier whose gain can be adjusted by a control section 120, 115 a loudspeaker, 116 a microphone, 118 a howl detection circuit, 119 a filter coefficient computation section for computing filter coefficients to be established for the FIR filter 112 such as to shape the frequency characteristic of the filter to suppress any microphone howl that is detected by the detection circuit 118, and a control section 120 which produces control signals for setting the computed filter coefficients into the FIR filter 112. The computed filter coefficients are then set into the FIR filter 112. The apparatus of the present invention consists of the combination of the A/D converter 111, FIR filter 112, D/A converter 113, howl detection section 118, the filter coefficient computation section 119, and the control section 120.

The operation of this embodiment is as follows. Such microphone howl is produced by a feedback path which extends from the loudspeaker 115 through the microphone 116, the audio amplifier 114, and back to the loudspeaker 115. If the loop gain of this feedback loop is gradually increased (e.g. from an initial value of zero), microphone howl will eventually begin, at a frequency which is such that the loop gain is unity and the loop phase shift is zero. Thus, as the gain of the audio amplifier 114 is gradually increased, microphone howl will begin to occur at some audio frequency, and this condition is detected by the howl detection section 118.

In addition, the howl detection section 118 measures the howl frequency, by counting the zero crossings of the output signal from the A/D converter 111. Based on the howl frequency thus obtained, a linear phase transfer function is computed for the FIR filter 112 by the operational section 119 such that the amplitude/frequency characteristic of the filter will be adjusted to reduce the loop gain at the frequency where microphone howl occurs, and thereby suppress the howl. The inverse Fourier transform of that transfer function is then computed, to obtain a set of filter coefficients for the FIR filter 112 to realize the computed transfer function. The filter coefficients thus derived are then set into the FIR filter 112 by the control section 120, to establish the requisite filter characteristic and suppress the howl.

When this process has been completed, the gain of the audio amplifier 114 is increased further, until microphone howl again occurs and is detected. The howl frequency is again measured, and the operations described above are repeated to suppress the howl.

The above process is successively repeated until the gain of the audio amplifier 114 has been raised to a level whereby a sufficient degree of sound volume is attained from the loudspeaker 115. Operation of the howl detection section 118 is then halted, and thereafter the loudspeaker 115 can be used to amplify the output signal from the microphone 116 with the danger of microphone howl having been eliminated.

Figure 43A:
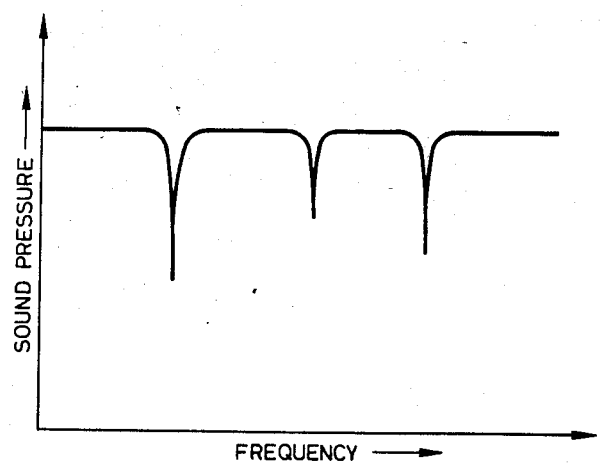
FIG. 43(A) shows an example of a sound pressure/frequency characteristic obtained with the 24th embodiment.
Figure 43B:
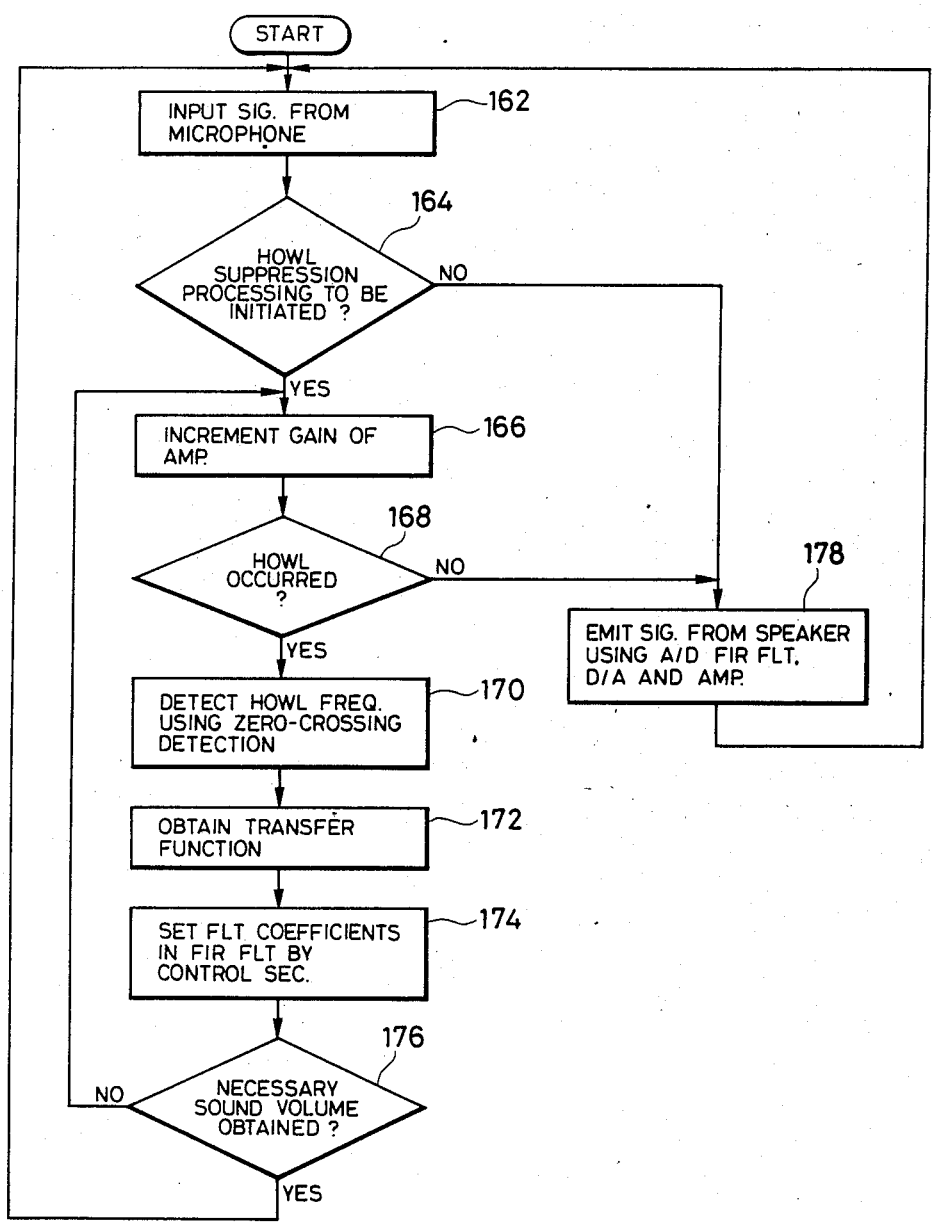
FIG. 43(B) is a flow chart for describing the operation of the 24th embodiment.

FIG. 43(B) is a flow chart of an operating sequence for implementing the process of adjusting the frequency response of the FIR filter to provide howl suppression as described above.

FIG. 43(A) is a graph showing an example of the sound pressure/frequency characteristic that is thereby established by the FIR filter 112 of this embodiment.

It can be understood from the above that this embodiment enables a satisfactory degree of margin against microphone howl to be established. In addition, due to the fact that a sharply varying amplitude characteristic and a gradually varying phase characteristic can be realized by the FIR filter, high fidelity sound reproduction can be attained which imparts a very natural impression to the listener.

Although in the above description, zero-crossing counting is used to detect microphone howl and to measure the howl frequency, it would be equally possible to utilize various other methods, such as a method which detects the occurrence of a sudden large increase in the amplitude/frequency characteristic of the system, and to thereby detect the corresponding frequency as being a howl frequency. Alternatively, a number of band pass filters for various different regions of the audio frequency range could be utilized, with a howl frequency being detected as a frequency at which a particularly large level of output is produced from one of these band pass filters. Whichever method is utilized to detect microphone howl and the howl frequency, similar results to those described above can be obtained.

Figure 44:
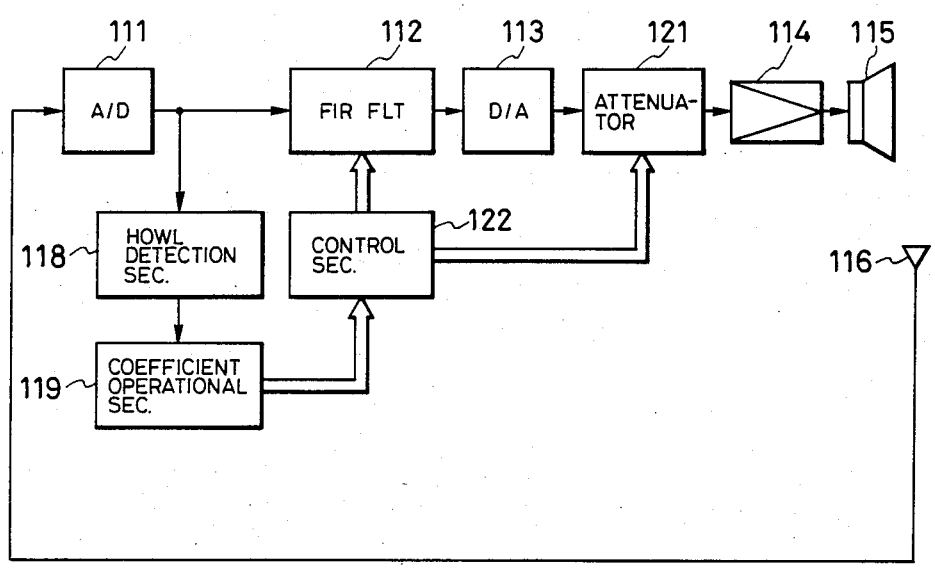
FIG. 44 is a system block diagram of a 25th embodiment of the present invention, having an automatic microphone howl suppression capability.

FIG. 44 shows a system block diagram of a 26th embodiment of the present invention. This is a digital equalizer having a microphone howl suppression function, as for the preceding embodiment. The configuration is similar to that of the preceding embodiment, but differs by further including an attenuator 121 coupled between the output from D/A converter 113 and the input of the audio amplifier 114, and in that a control section 122 produces control signals for controlling the degree of attenuation of the attenuator 121, in addition to setting the computed filter coefficients into the FIR filter 112.

The operation of this embodiment is as follows. Initially, the attenuator 121 is set to its maximum attenuation value, then the attenuation is gradually reduced under the control of control signals from the control section 122, until microphone howl begins to occur. This howl is detected, and the frequency measured, as in the preceding embodiment. Appropriate filter coefficients are then computed and set into the FIR filter 112 to produce sufficient attenuation by the filter at the howl frequency to suppress the howl. The value of attenuation is then gradually further reduced until howl again occurs, and the above process repeated to derive and set new values of filter coefficients. These operations are successively repeated automatically until a predetermined sound level is produced from the loudspeaker 115.

The 26th embodiment thereby enables microphone howl suppression to be rapidly and automatically executed, by setting appropriate frequency characteristic of the FIR filter 112 for compensation at the various audio frequencies where howl can occur.

Figure 45:
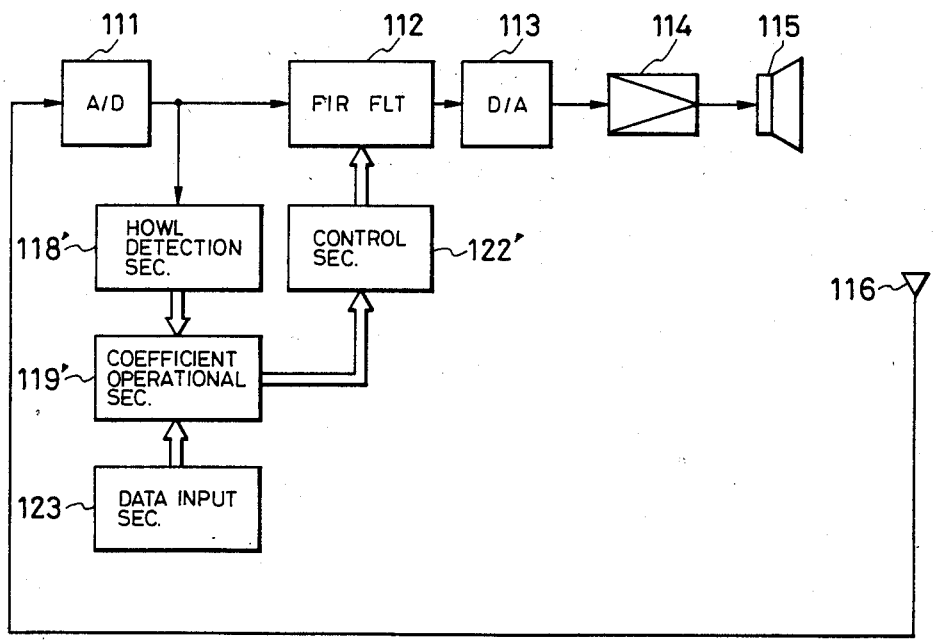
FIG. 45 is a system block diagram of a 27th embodiment of the present invention, enabling establishment of arbitrary amplitude/frequency characteristic and phase/frequency characteristic for a FIR filter, in combination with a microphone howl suppression capability.

FIG. 45 shows a 27th embodiment of a digital equalizer according to the present invention, which has a microphone howl suppression function as for the preceding two embodiments. The configuration is similar to the 25th embodiment, so that only those portions which are different from that embodiment will be described. In the 27th embodiment, an input section 123 can be utilized to input a desired amplitude/frequency characteristic and phase/frequency characteristic for realizing frequency response compensation by the FIR filter 112, as described hereinabove for various other embodiments. Data representing these input characteristics are supplied to a filter coefficient computation section 119', together with data derived by a howl detection section 118', whose operation is similar to that of the howl detection section 118 of the two preceding embodiments. The filter coefficient values computed by section 119' are transferred to a control section 122', to be set into the FIR filter 112.

The operation of this embodiment is as follows. Assuming that frequency characteristic data are inputted from the input section 123, the howl detection section 118 is set in operation. The embodiment then functions in the same manner as the preceding embodiment, to automatically adjust the frequency characteristic of the FIR filter 112 such as to reduce the gain at each frequency where howl will occur, to a sufficient degree. However in this case the FIR filter frequency characteristics are determined (by the filter coefficients that are computed by the computation section 119'), as a combination of the desired frequency characteristic defined by the input data from the input section 123 and the alterations thereof which are necessary to suppress microphone howl.

Figure 46A:
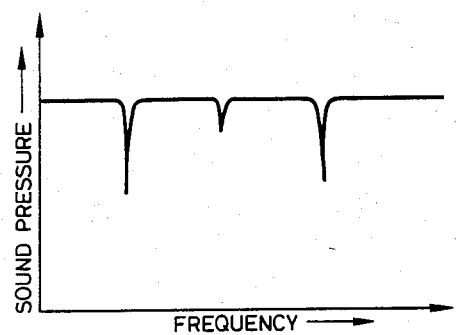
FIGS. 46(A) to (C) are diagrams for describing the operation of the 27th embodiment.
Figure 46B:
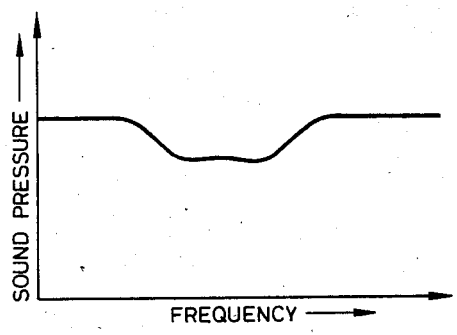
Figure 46C:
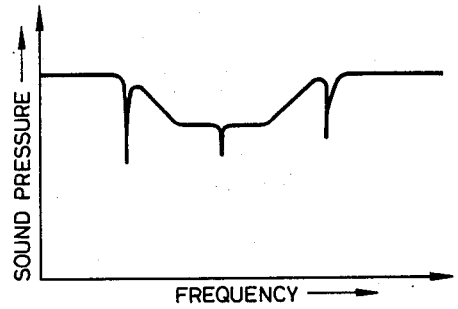

This can be understood from the examples of FIGS. 46(A) to 46(C). FIG. 46(A) shows the sound pressure/frequency characteristic which would be realized by the system without combining this input data from input section 123. FIG. 46(B) shows the desired characteristic defined by the input data from input section 123. FIG. 46(C) shows the sound pressure/frequency characteristic that is actually established, for realizing the desired characteristic and also implementing microphone howl suppression.

Figure 47:
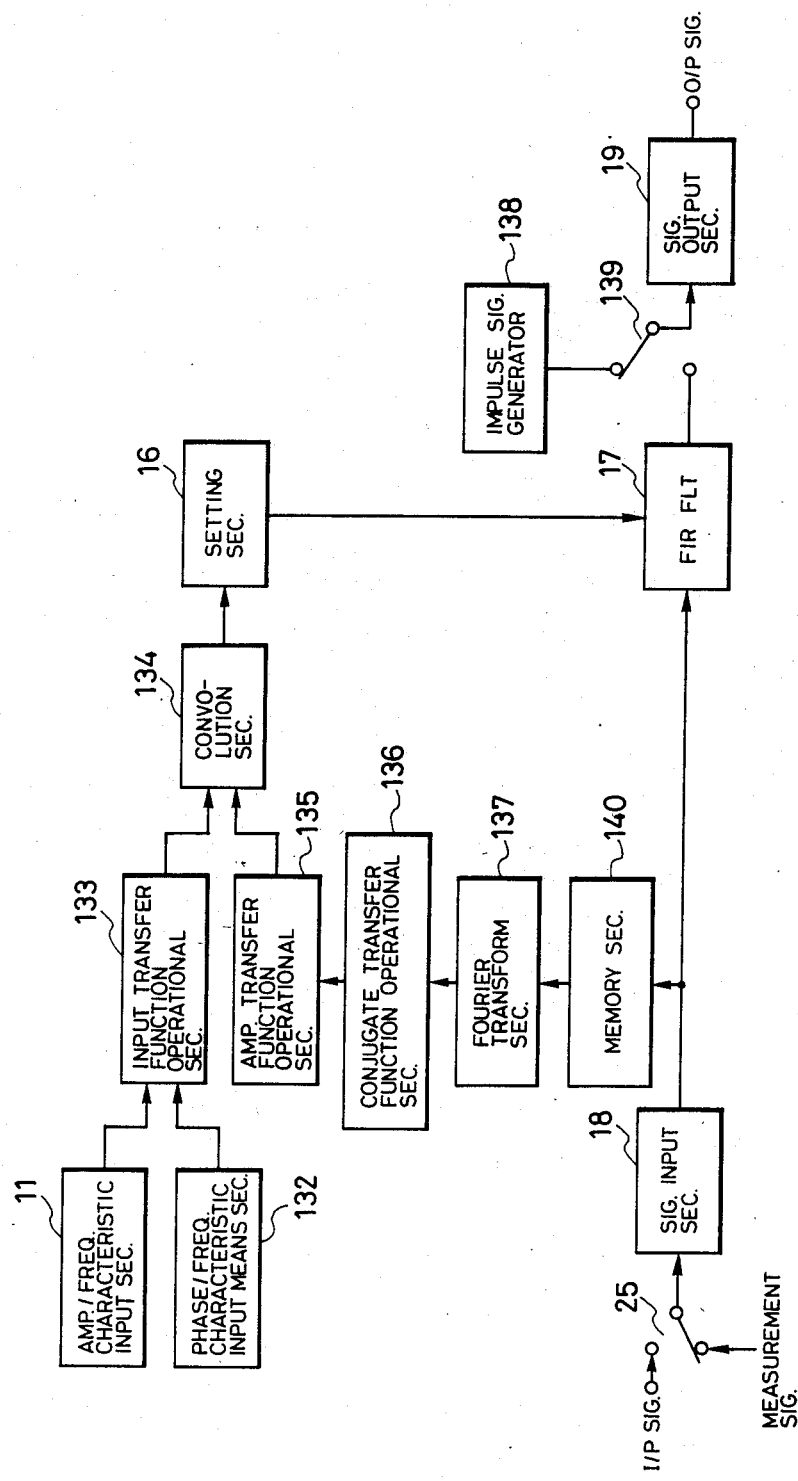
FIGS. 47 and 55 are system block diagrams of 28th and 29th embodiments of the present invention, in which the convolution is derived of a desired transfer function and a measured transfer function of an audio system, with filter coefficients being determined by the convolution results.

FIG. 47 is a system block diagram of a 28th embodiment of a digital equalizer according to the present invention. In FIG. 47, numeral 11 denotes an amplitude/frequency characteristic input section (referred to in the following simply as an amplitude input section) for inputting data representing an arbitrary amplitude/frequency characteristic, 132 denotes a phase input section for inputting data representing an arbitrary phase/frequency characteristic, 133 denotes an input transfer function operational section for computing a transfer function in accordance with the input amplitude/frequency characteristic and phase/frequency characteristic which are respectively supplied from the amplitude input section 11 and phase input section 132. An input switch 25 can be set to supply to an input section 18 an analog or digital type of audio signal from external apparatus, or a measurement signal representing an impulse response of an external apparatus or sound field, as described hereinafter. The input section 18 executes analog/digital conversion of the measurement signal or the audio signal (if necessary) to produce a train or digital samples which are supplied to the input of a FIR filter 17. 140 denotes a memory section for storing an impulse response waveform of an input signal supplied from the input section 18, 137 denotes a Fourier transform section for transforming the impulse response waveform stored in the amplitude memory section 140 into a transfer function, the transform being executed along the frequency axis. Numeral 136 denotes a conjugate transfer function operational section for deriving the conjugate transfer function of the transfer function that is derived by the Fourier transform section 137, numeral 135 denotes an inverse amplitude transfer function operational section for deriving a transfer function in which each amplitude value at each frequency is the inverse of an amplitude value of the transfer function derived by the conjugate transfer function operational section, at that frequency, and in which each phase value at each frequency is unchanged from a phase value of the transfer function derived by the conjugate transfer function operational section, at that frequency. Numeral 134 denotes a convolution section for computing the convolution of the transfer function that is derived by the input transfer function operational section and the transfer function that is derived by the inverse amplitude transfer function operational section, with the convolution being computed along the frequency axis or along the time axis. The convolution section 134 thereby produces a set of filter coefficient values respectively determined by an impulse response characteristic that is obtained as a result of this convolution operation, i.e. an impulse response characteristic corresponding to a transfer function obtained as the convolution of the two transfer functions supplied to section 134. 16 denotes a setting section for establishing for the FIR filter 17 the value of filter coefficients obtained from the convolution section 134. Numeral 138 denotes an impulse generating section for generating a test signal which is an impulse signal, to be applied to an external apparatus, or to acoustically drive an external sound field for obtaining a signal having an impulse response waveform to be applied as an input to the signal input section 18. Numeral 139 denotes a switch for selecting either the output from the FIR filter 17 or the test signal from the impulses generating section 138, to be supplied to a signal output section 19.

Figure 48:
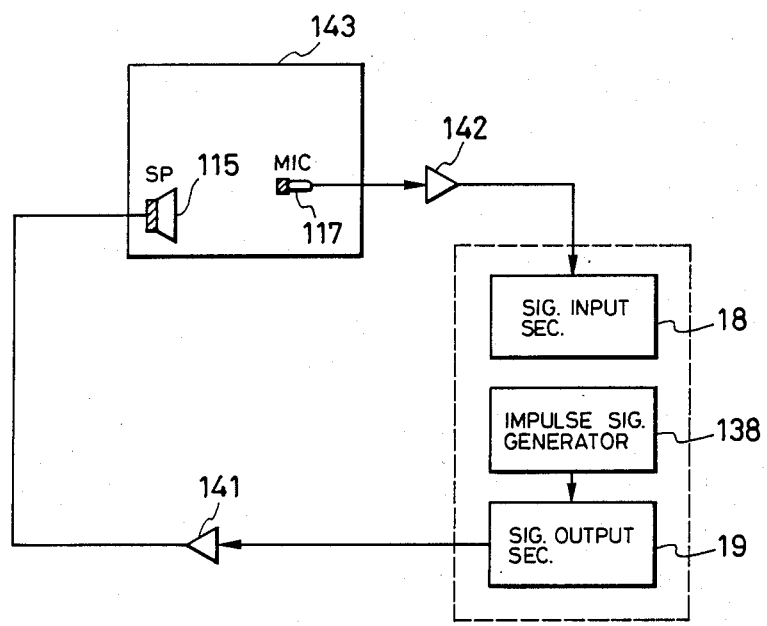
FIG. 48 illustrates an arrangement for measuring the transfer function of a specific audio system, for the 28th embodiment.

The operation of this embodiment is as follows, referring to FIGS. 48 to 51 of the drawings, FIG. 48 shows an arrangement for utilizing this embodiment, whereby a transfer function is established for the FIR filter 17 such that the phase/frequency characteristic and amplitude/frequency characteristic obtained at a specific listening position with respect to a loudspeaker, within a sound field, can be mutually independently set to desired shapes. The embodiment enables the frequency characteristic of the loudspeaker, the sound field, audio amplifiers, etc, to be compensated such as to achieve these desired shapes for the phase and frequency characteristic at the listening point. The operation is as follows. First, the switch 139 shown in FIG. 47 is set to the position for supplying to the output section 19 the test signal, while switch 25 is set to apply the measurement signal to the signal input section 18. The test signal is transferred through the output section 19 which includes a D/A converter, to produce an impulse signal in analog form which is transferred through a power amplifier 141 to drive a loudspeaker 115. A microphone 117, which has been set at a desired listening position, thereby receives input pulses having an impulse response waveform that is the convolution of the respective frequency characteristics of the loudspeaker 115 and the sound field 143. This impulse response waveform signal, constituting the measurement signal, is transferred through an amplifier 142 to the signal input section 18, to be converted to a train of digital samples and supplied to the memory section 140.

Figure 49A:
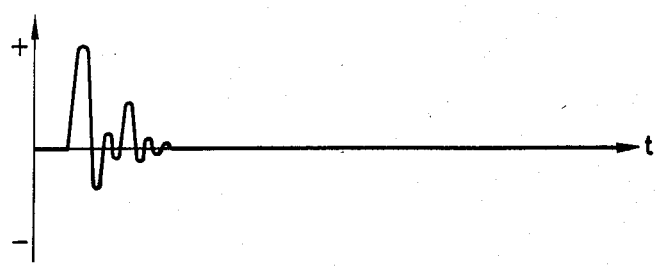
FIGS. 49(A) to 52(C) are impulse response and transfer function diagrams for assistance in describing the 28th embodiment.
Figure 49B:
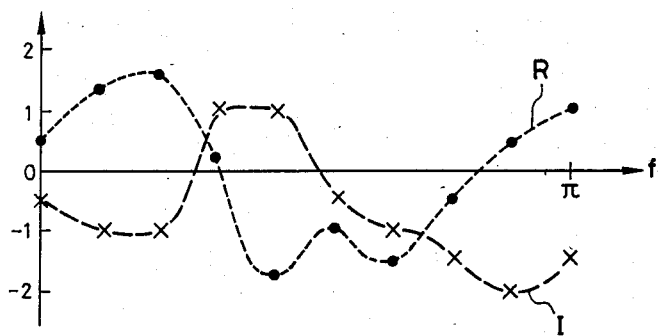
Figure 49C:
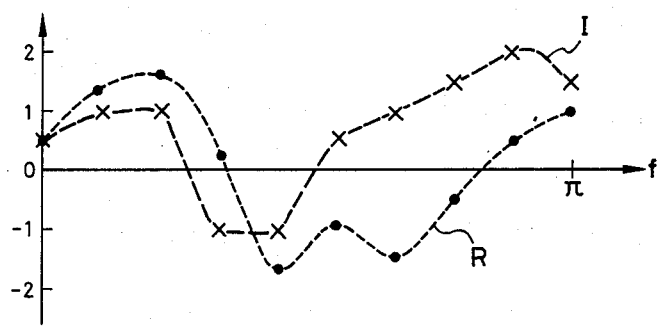

A digital signal representing an impulse response waveform is thereby supplied to the memory section 140, which stores therein data representing this impulse response waveform. FIG. 49(a) shows an example of such an impulse response waveform. The Fourier transform of this impulse response waveform (produced from the Fourier transform section 137) is shown in FIG. 49(b) in the form of the real and imaginary components of a transfer function, in which R denotes the real component of the transfer function and I denotes the imaginary component. The black dots and the cross symbols indicate the sample frequencies at which Fourier transform computations are performed. The frequency indicated as $\pi$ is the Nyquist frequency (as defined in sampling theory), such that the transfer function is defined within the frequency range 0 to $\pi$. After deriving the Fourier transform in the range 0 to $\pi$ the real part of transfer function in the range $\pi$ to $\pi$ to $2\pi$ can be readily derived as described hereinabove with reference to FIGS. 2(A), 2(B). The transfer function thus derived is then passed through the conjugate transfer function operational section 136, to obtain the conjugate transfer function shown in FIG. 49(c). This is shown expressed in the form of an amplitude/frequency characteristic A and a phase/frequency characteristic $\phi$ in FIG. 50(a). By processing this conjugate transfer function in the inverse amplitude transfer function operational section 135, the transfer function shown in FIG. 50(b) is obtained. The value of phase $\phi$ at each frequency, in the transfer function of FIG. 50(b), is identical to the corresponding phase value of the transfer function of FIG. 50(a), whereas the value of amplitude A at each frequency, for the transfer function of FIG. 50(b) is the inverse (i.e. 1/A) of the corresponding amplitude value in the transfer function of FIG. 50(a).

Figure 51:
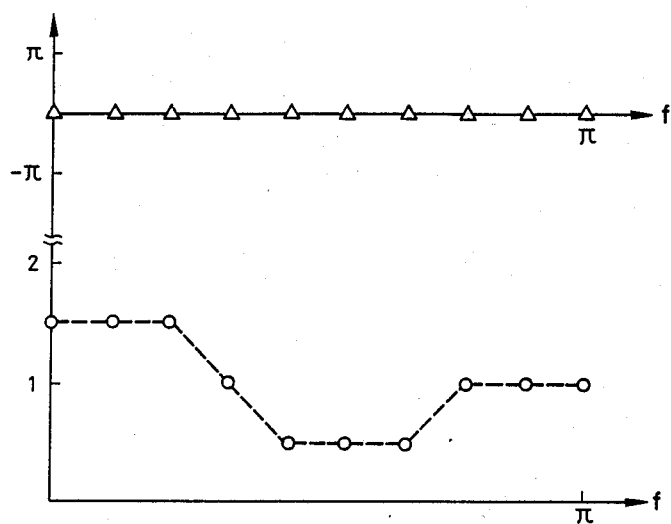
Figure 52A:
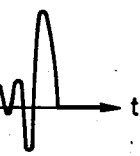
Figure 52B:
Figure 52C:

FIG. 51 shows an example of the phase/frequency characteristic and amplitude/frequency characteristic of a transfer function derived by the input transfer function operational section 133 based on the amplitude/frequency characteristic and phase/frequency characteristic data supplied from the amplitude input section 11 and phase input section 132 respectively. For simplicity of description, the phase is assumed to be zero at all frequencies.

If it is assumed that the amplitude and phase/frequency characteristics of FIG. 51 have been supplied to derive the input transfer function produced from section 133 during generation of the test signal and derivation of filter coefficients from the convolution of the transfer functions produced from sections 133 and 135 as described above, then the impulse response characteristic of the FIR filter 17 that has thus been established will for example be as shown in FIG. 6(A). This has been established based on the impulse response characteristic of the combination of loudspeaker 115 and sound field 143, shown in FIG. 6(B). If switch 139 is now set to its position for supplying the output signal from the FIR filter 17 to the signal output section 19, then the overall impulse response characteristic of the system will be as shown in FIG. 6(C), i.e. resulting from the convolution of the transfer function of the loudspeaker/sound field combination with respect to the microphone position and the transfer function established for the FIR filter 17.

It can thus be understood that a linear phase/frequency characteristic with respect to a specific listening position (i.e. the microphone position) can be realized, with phase distortion of the transfer function as shown in FIG. 49(B) being compensated.

Of course if the desired input phase/frequency characteristic is other than flat as shown in FIG. 51, an accordingly different phase/frequency characteristic can be realized for the digital equalizer.

Figure 50A:
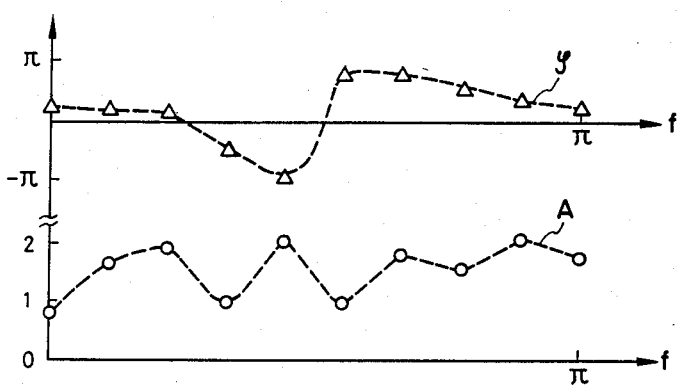
Figure 50B:
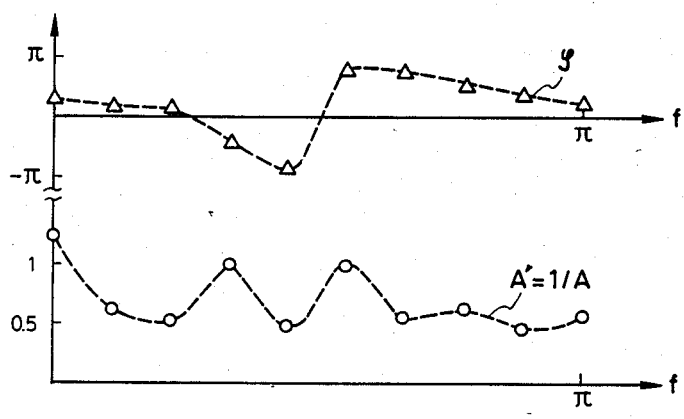

It can thus be understood that unwanted variations with respect to frequency of the amplitude/frequency characteristic and phase/frequency characteristic (e.g. as shown in FIG. 50(a) at a desired listening position can be fully corrected by this embodiment, and that a desired amplitude/frequency characteristic and phase/frequency characteristic at that listening position can be independently established (as data supplied to the amplitude and phase input sections 11 and 132). The desired amplitude/frequency characteristic and phase/frequency characteristic (e.g. as shown in FIG. 51) becomes the overall frequency characteristic of the system containing the digital equalizer, with respect to the desired listening position, i.e. this embodiment enables the overall amplitude/frequency characteristic and phase/frequency characteristic of the system formed of the digital equalizer, the loudspeaker 117 and the sound field 143 (as monitored at the position of the microphone 117) to be made identical to desired characteristics such as are shown in FIG. 51.

Figure 53:
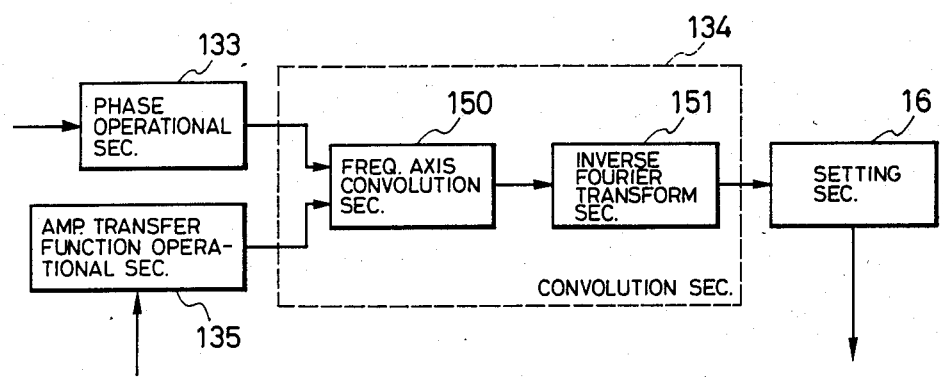
FIGS. 53 and 54 show specific configurations for a convolution section in the 28th embodiment; and, FIGS. 56(A) to (C) are diagrams for describing a window function operation of the 29th embodiment.

FIG. 53 shows a specific embodiment of the convolution section 134, designated by numeral 134. In FIG. 53 numeral 150 denotes a frequency domain convolution section for executing convolution in the frequency domain, numeral 151 denotes inverse Fourier transform section for deriving the inverse Fourier transform of a transfer function that is derived by the frequency domain convolution section 150. Operational processing executed by the frequency domain convolution section 150 consists primarily of complex number multiplication at a number of different frequency points.

Figure 54:
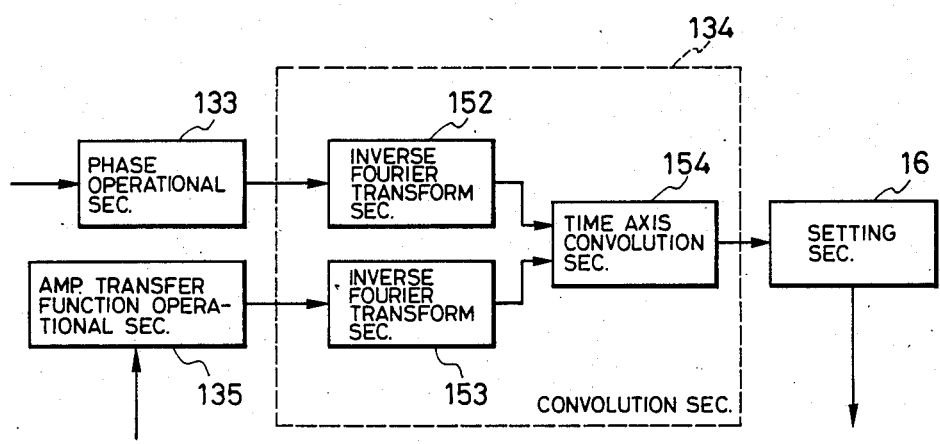

FIG. 54 shows a second embodiment of the convolution section 134, designated by numeral 134, in which 152 and 153 denote respective inverse Fourier transform section, for each deriving a Fourier transform, numeral 154 denotes time domain convolution section for executing convolution of respective real components of impulse response characteristic derived by the inverse Fourier transform sections 152 and 153 respectively, in the time domain.

Figure 55:
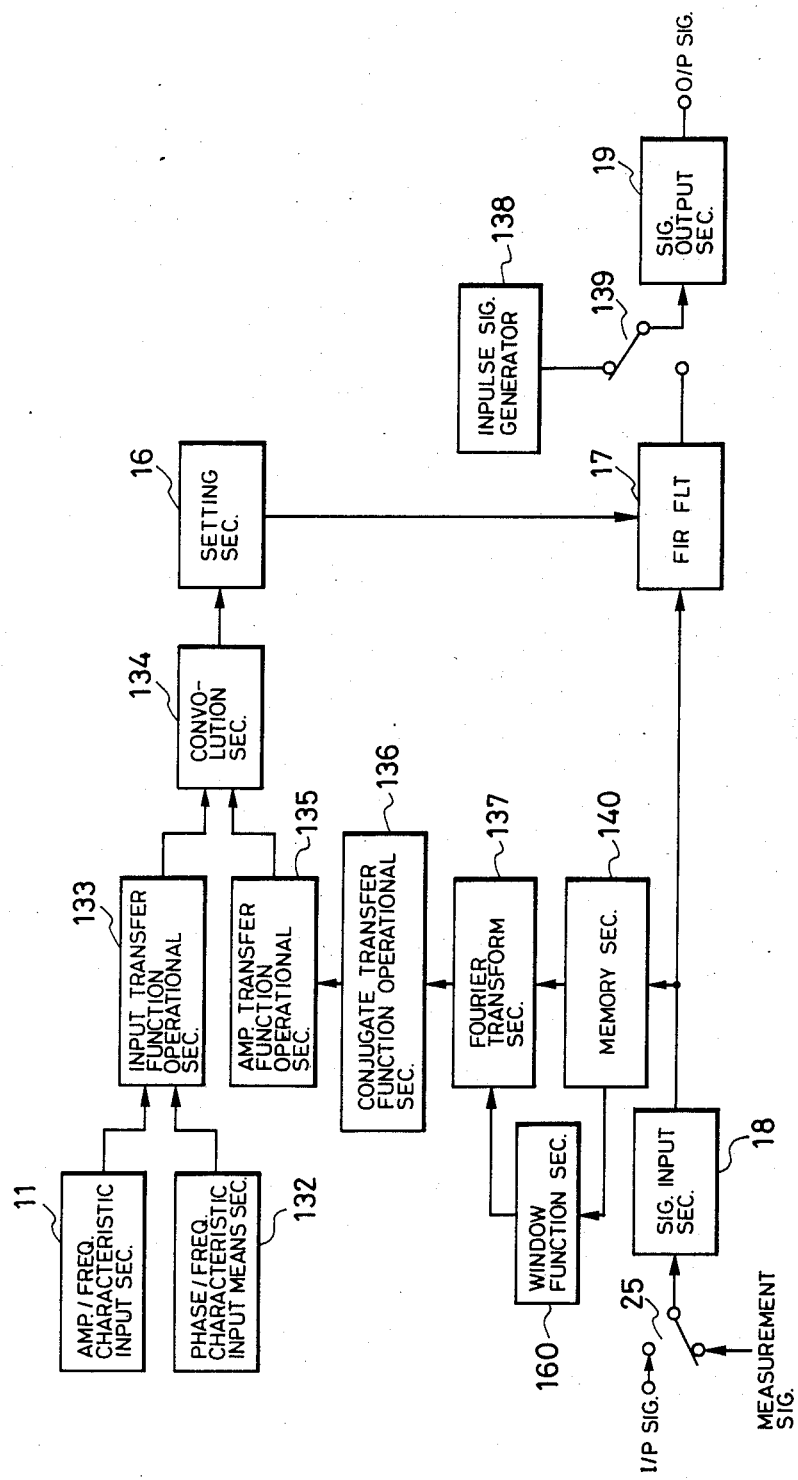
Figure 56A:
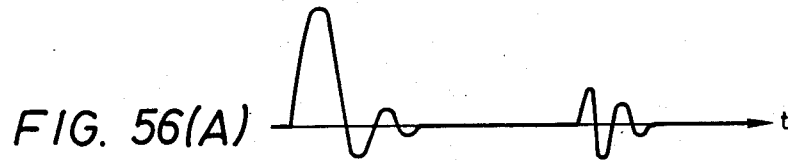
Figure 56B:
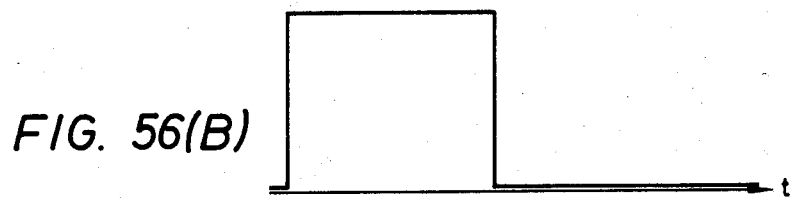
Figure 56C:
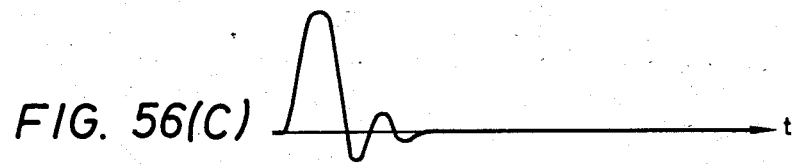

FIG. 55 shows a second embodiment of a digital equalizer according to the present invention. In FIG. 55, numeral 160 denotes window function section for multiplying an impulse response waveform that is stored in a memory section 140 by a window function such as a Hamming window, a Hanning window, etc. If the impulse response waveform includes a sound field characteristic, then the waveform may include reflected waves which have been delayed by substantial amounts. In some cases it may be possible to accurately compensate the sound field characteristic which contains such reflected waves. However in many cases, superior results with respect to sound quality can be obtained if compensation is executed with such extremely delayed reflected waves being ignored. FIG. 57a shows an example of an impulse response waveform that is stored in the memory section 140 and which contains such delayed reflected waves as shown. FIG. 57b shows a suitable window function for multiplying the impulse response waveform of FIG. 57a, and FIG. 57c shows the resultant output waveform that is produced form the window section 160 and which is supplied to the Fourier transform section 137.

The embodiments described above enable a digital equalizer to be implemented whereby an amplitude/frequency characteristic and a phase/frequency characteristic of an apparatus or a sound field coupled to the digital equalizer can be compensated to produce respectively flat characteristics. In addition, the phase/frequency characteristic and amplitude/frequency characteristic of an output signal produced from an apparatus or a sound field coupled to the digital equalizer can be made to correspond to a desired phase/frequency characteristic and amplitude/frequency characteristic that are supplied to the phase input section and amplitude input section respectively.

What is claimed is:

1. A digital equalizer apparatus comprising:
   amplitude/frequency input means for providing amplitude/frequency characteristic data representing an arbitrary amplitude/frequency characteristic;
   phase data input means for providing data for establishing a phase/frequency characteristic, said data being in a category selected from a group of categories of data which includes phase/frequency characteristic data, group delay characteristic data, amplitude/frequency characteristic data, and data expressing a resonance condition of a predetermined type of electrical circuit;
   phase/frequency operational means for computing phase/frequency characteristic data based upon said data from said phase data input means;
   transfer function operational means for operating on said amplitude/frequency characteristic and phase/frequency characteristic data to derive transfer function data representing a transfer function;
   inverse Fourier transform means for operating on said transfer function data to derive impulse response characteristic data representing an impulse response characteristic determined by said transfer function;
   finite impulse response filter means;
   signal input means for transferring to said finite impulse response filter means an input audio signal as a train of digital samples;
   signal output means for receiving said audio signal after frequency characteristic modification of said audio signal by said finite impulse response filter means, and for transferring the modified audio signal to an external system; and,
   setting means operable for establishing a set of filter coefficients for said finite impulse response filter means having respective values determined by said impulse response characteristic.

2. A digital equalizer apparatus according to claim 1, in which said data from said phase data input means represent a group delay characteristic, and in which said phase/frequency operational means comprises integrator means for integrating said group delay characteristic data with respect to frequency, for deriving said phase/frequency characteristic to be supplied to said transfer function operational means.

3. A digital equalizer apparatus according to claim 1, in which said data from said phase data input means represent a group delay characteristic, and in which said phase/frequency operational means comprises means for deriving an average value of group delay over a predetermined frequency range and for redefining said group delay characteristic as an amended group delay characteristic representing deviations from said average value, and integrator means for integrating said amended group delay characteristic data with respect to frequency, thereby deriving said phase/frequency characteristic to be supplied to said transfer function operational means.

4. A digital equalizer apparatus according to claim 1, in which said data from said phase data input means represent an amplitude/frequency characteristic, and in which said phase/frequency operational means comprises means for computing the Hilbert transform of said amplitude/frequency characteristic from the phase data input means to thereby derive said phase/frequency characteristic to be supplied to said transfer function operational means.

5. A digital equalizer apparatus according to claim 1, in which said finite impulse response filter means comprises a plurality of finite impulse response filters, and further comprising:
   a plurality of digital band-pass filters for dividing said digital sample signal from said signal input means into a plurality of frequency bands; and
   a plurality of down-sampling sections for receiving respective band-divided output signals from said band-pass filters for reducing the sampling frequency of said band-divided output signals by respectively differing reduction factors, and supplying resultant digital sample signals to respective ones of said plurality of finite impulse response filters.

6. A digital equalizer apparatus according to claim 5, and further wherein said transfer function operational means derives, based on said amplitude/frequency characteristic and phase/frequency characteristic data supplied thereto, respectively different transfer functions for each of said plurality of finite impulse response filters, and wherein each of said transfer functions is defined within a frequency range having an upper frequency limit which is lower than the sampling frequency of the digital sample signal supplied from the corresponding one of said down-sampling sections to the corresponding one of said finite impulse response filters, with impulse response characteristics respectively corresponding to said plurality of transfer functions being derived by said inverse Fourier transform means and with sets of filter coefficients in accordance with respective ones of said impulse response characteristics being established for respectively corresponding ones of said finite impulse response filters by said setting means.

7. A digital equalizer apparatus according to claim 6, in which said signal output means comprises a plurality of output means respectively coupled to receive output signals from corresponding ones of said finite impulse response filters.

8. A digital equalizer apparatus according to claim 5, and further comprising:
a plurality of up-sampling sections coupled to receive output signals for respective ones of said finite impulse response filters, for restoring the sampling frequencies of said output signals to that of said digital sample signal from said signal input means; and,
addition means for combining respective output signals produced from said up-sampling sections, for producing an output signal to be supplied to said signal output means.

9. A digital equalizer apparatus according to claim 5, and further comprising phase compensation means for executing phase compensation of said phase/frequency characteristic data from said phase/frequency operational means such that phase values of said phase/frequency characteristic at respective ones of guard band frequencies, each separating an upper limit frequency of one of said transfer functions from a higher frequency within the frequency range of another one of said transfer functions, are made mutually identical.

10. A digital equalizer apparatus according to claim 1, and further comprising:
amplitude and phase characteristic analysis means for analyzing the frequency characteristics of a measurement signal produced from a microphone in response to an acoustic signal generated within a sound field, to derive an amplitude deviation/frequency characteristic and a phase/frequency deviation characteristic of said measurement signal;
amplitude/frequency characteristic compensation means for operating on said amplitude/frequency characteristic data from said amplitude/frequency characteristic input means and said amplitude deviation/frequency characteristic in combination, to derive compensated amplitude/frequency characteristic data to be supplied to said transfer function operational means for use in computing said transfer function; and,
phase/frequency characteristic compensation means for operating on said phase/frequency characteristic data from said phase/frequency operational means and said phase/frequency deviation characteristic in combination, to derive compensated phase/frequency characteristic data to be supplied to said transfer function operational means for use in computing said transfer function;
said digital equalizer apparatus being selectively operable in a measurement condition in which said measurement signal is supplied to said signal input means to be transferred to said amplitude and phase characteristic analysis section, a transfer function is computed from said compensated amplitude/frequency characteristic and phase/frequency characteristic data, and filter coefficients corresponding to said transfer function are established for said finite impulse response filter means by said setting means, and a normal condition in which an audio signal is supplied to said signal input means to be transferred by said signal input means to said finite impulse response filter means.

11. A digital equalizer apparatus according to claim 10, in which said acoustic signal is an impulse signal.

12. A digital equalizer apparatus according to claim 1, further comprising:
test signal generating means for generating a test signal to be transferred by said signal output means to an external audio system including a loudspeaker, for producing a corresponding measurement signal by a microphone disposed within a sound field together with said loudspeaker;
amplitude and phase characteristic analysis means for analyzing the frequency characteristics of said measurement signal, to derive an amplitude deviation/frequency characteristic and a phase/frequency deviation characteristic of said measurement signal;
amplitude/frequency characteristic compensation means for operating on said amplitude/frequency characteristic data from said amplitude/frequency characteristic input means and said amplitude deviation/frequency characteristic in combination, to derive compensated amplitude/frequency characteristic data to be supplied to said transfer function operational means for use in computing said transfer function; and,
phase/frequency characteristic compensation means for operating on said phase/frequency characteristic data from said phase/frequency operational means and said phase/frequency deviation characteristic in combination, to derive compensated phase/frequency characteristic data to be supplied to said transfer function operational means for use in computing said transfer function;
said digital equalizer apparatus being selectively operable in a measurement condition in which said test signal is supplied to said signal output means while said measurement signal is supplied to said signal input means to be transferred to said amplitude and phase characteristic analysis section, and in which a transfer function is computed from said compensated amplitude/frequency characteristic and phase/frequency characteristic data, and filter coefficients corresponding to said transfer function are established for said finite impulse response filter means by said setting means, and a normal condition in which an audio signal is supplied to said signal input means for transfer to said finite impulse response filter means.

13. A digital equalizer apparatus according to claim 12, and further comprising memory means for sequentially storing successive ones of said digital samples transferred from said signal input means while said measurement signal is being produced, and for supplying data thus stored to said amplitude and phase characteristic analysis means for deriving said amplitude deviation/frequency characteristic and phase/frequency deviation characteristic.

14. A digital equalizer apparatus according to claim 13, and further comprising decision means for detecting when an amplitude of said measurement signal exceeds a predetermined value and functioning, when said detection occurs, to control said memory means to initiate said sequential storage of digital samples.

15. A digital equalizer apparatus according to claim 14, and further comprising synchronized addition means controlled by said decision means, each time that said measurement signal amplitude is detected as having exceeded said predetermined value thereof, for executing a process of sequential read-out of stored digital samples from said memory means in synchronism with outputs of successive digital samples form said signal input means, addition of said read-out samples to corresponding digital samples transferred from said signal input means, and storage of results obtained from said addition in said memory means.

16. A digital equalizer apparatus according to claim 15 in which output signals produced from said signal output means of the digital equalizer apparatus are applied to an audio system which includes a loudspeaker located within said sound field, and in which said digital equalizer apparatus further comprises:
   test signal generating means functioning during said measurement condition to sequentially generate test signals during successive time intervals, said test signals being transferred by said signal output means to said audio system for producing corresponding successive acoustic signals from said loudspeaker; and,
   time measurement and control means operable when said measurement condition is entered for measuring a time interval which elapses between initiation of a first one of said test signals and a time at which said predetermined value is subsequently detected by said decision means, and for thereafter initiating operation of said synchronized addition means after said measured time interval has elapsed, following each initiation of subsequent ones of said test signals.

17. A digital equalizer apparatus according to claim 15 in which an output signal produced from said signal output means of the digital equalizer apparatus are applied to an audio system which includes a loudspeaker located within said sound field, and in which said digital equalizer apparatus further comprises:
   test signal generating means functioning during said measurement condition to sequentially generate test signals during successive time intervals, said test signals being transferred by said signal output means to said audio system for producing corresponding successive acoustic signals from said loudspeaker; and,
   time measurement and control means operable when said measurement condition is entered for measuring a time interval which elapses between initiation of a first one of said test signals and a time at which said predetermined value is subsequently detected by said decision means, and for thereafter initiating operation of said synchronized addition means after a fixed time interval which is shorter than said measured time interval has elapsed, following each initiation of subsequent ones of said test signals.

18. A digital equalizer apparatus according to claim 13, further comprising window function means for multiplying measurement signal data that has been stored in said memory means by a predetermined window function, and for storing the results obtained in said memory means, and in which said results are then supplied to said amplitude and phase characteristic analysis means for deriving said amplitude deviation/frequency characteristic and phase/frequency deviation characteristic.

19. A digital equalizer apparatus according to claim 18, in which said window means functions to multiply said stored measurement signal data by a plurality of mutually different window functions which correspond to respectively different time intervals, and in which the respective results of multiplications by these window functions are utilized by said amplitude and phase characteristic analysis means to derive respective amplitude deviation/frequency characteristics which cover mutually different frequency bands, and respective phase/frequency deviation characteristics which cover said mutually different frequency bands.

20. A digital equalizer apparatus according to claim 13, and further comprising sampling frequency reduction means for eliminating a proportion of said digital samples of said measurement signal from said signal input means and for supplying the remaining digital samples to be stored in said memory means.

21. A digital equalizer apparatus according to claim 19, and further comprising phase equalizing means for adding or subtracting fixed values of phase to or from said respective results obtained by multiplication by said respectively different window functions, said fixed values being selected such as to equalize mutually adjacent portions, respectively obtained utilizing different ones of said amplitude deviation/frequency characteristic derived by said amplitude and phase characteristic analysis means, and to equalize mutually adjacent portions, respectively obtained utilizing different ones of said window functions, of said phase deviation/frequency characteristic derived by said amplitude and phase characteristic analysis means.

22. A digital equalizer apparatus according to claim 1, and further comprising:
   memory means for storing phase data representing a predetermined phase/frequency characteristic or group delay characteristic together with amplitude data representing a predetermined amplitude deviation/frequency characteristic;
   amplitude/frequency characteristic compensation means for operating on said amplitude/frequency characteristic data from said amplitude/frequency characteristic input means and said amplitude data from said memory means, in combination, to derive compensated amplitude/frequency characteristic data to be supplied to said transfer function operational means for use in computing said transfer function; and,
   phase/frequency characteristic compensation means for operating on said phase/frequency characteristic data from said phase/frequency operational means and said phase data from said memory means, in combination, to derive compensated phase/frequency characteristic data to be supplied to said transfer function operational means for use in computing said transfer function.

23. A digital equalizer apparatus according to claim 1, and further comprising means for multiplying said impulse response characteristic derived by said inverse Fourier transform means by a predetermined window function, said filter coefficients being respectively established in accordance with results obtained from said window function multiplication operation.

24. A digital equalizer apparatus according to claim 1, in which an output signal produced from said signal output means is applied to an audio system to drive a loudspeaker, and in which said apparatus is operable in a measurement condition in which a measurement signal representing a phase deviation/frequency characteristic and an amplitude deviation/frequency characteristic of said loudspeaker is supplied to said signal input means and a normal condition in which an audio signal is supplied to said signal input means, said apparatus further comprising:

test signal generating means for generating a predetermined form of test signal to be transferred by said signal output means to said audio system for driving said loudspeaker and thereby producing said measurement signal;

loudspeaker phase characteristic analysis means for analyzing said measurement signal for deriving a phase deviation/frequency characteristic and amplitude deviation/frequency characteristic of said loudspeaker;

amplitude/frequency characteristic compensation means for operating on said amplitude/frequency characteristic data from said amplitude/frequency characteristic input means and said amplitude deviation/frequency characteristic in combination, to derive compensated amplitude/frequency characteristic data to be supplied to said transfer function operational means for use in computing said transfer function; and, phase/frequency characteristic compensation means for operating on said phase/frequency characteristic data from said phase/frequency operational means and said phase deviation/frequency characteristic in combination, to derive compensated phase/frequency characteristic data to be supplied to said transfer function operational means for use in computing said transfer function;

and whereby after derivation of said transfer function in said measurement condition, said filter coefficients are established in accordance with said impulse response characteristic, and said digital equalization apparatus is then set in said normal condition whereby an audio signal is transferred by said signal input means to said finite impulse response filter means.

25. A digital equalizer apparatus comprising:
input means for fixedly supplying data representing an amplitude/frequency characteristic
transform operational means for computing from said amplitude/frequency characteristic data first and second transfer functions respectively corresponding to a low-frequency band and a high-frequency band of a frequency band-separated input audio signal, said transform operational means being operable for selectively computing said first and second transfer functions by a linear phase transform computation method or by a Hilbert transform computation method;
inverse Fourier transform means for deriving first and second impulse response characteristics from said first and second transfer functions respectively;
a first finite impulse response filter coupled to receive said low-frequency band of said frequency band-separated input signal as a train of digital samples;
a second finite impulse response filter coupled to receive said high-frequency band of said frequency band-separated input signal as a train of digital samples;

setting means for establishing first and second sets of filter coefficients for said first and second finite impulse response filters respectively, in accordance with said first and second impulse response characteristics respectively;
first and second controllable delay means coupled to receive output signals produced from said first and second finite impulse response filters respectively; and,
delay time setting means for adjusting respective amounts of delay produced by said first and second controllable delay means such as to compensate for differences in respective signal transfer delay times of said first and second finite impulse response filters.

26. A digital equalizer apparatus according to claim 25, in which said amplitude/frequency characteristic is supplied from said input means as a set of amplitude values corresponding to respective sample frequencies within a predetermined frequency range, and in which the number of said amplitude values supplied to said transform operational means when said Hilbert phase transform operation is selected is twice the number of said amplitude values supplied when said linear phase transform operation is selected.

27. A digital equalizer apparatus according to claim 25, and further comprising interpolation means, in which said amplitude/frequency characteristic is supplied from said input means as a set of amplitude values corresponding to respective sample frequencies within a predetermined frequency range and in which when said Hilbert transform operation is selected, interpolation of said amplitude values from said input means is executed and amplitude values thereby derived are combined with said amplitude values from said input means to thereby double the number of amplitude values supplied to said transform operational means for computing said transfer functions.

28. A digital equalizer apparatus comprising:
finite impulse response filter means;
impulse signal generating means for generating an impulse test signal;
signal output means;
signal input means for transferring an input signal to said finite impulse response filter means as a train of digital samples;
selector means operable for selectively transferring an output signal from said filter means and said impulse test signal to said signal output means to be supplied to an external system, and selectively transferring an input audio signal and a measurement signal produced by applying said test signal to said external system to be inputted to said signal input means;
amplitude input means for inputting data representing an arbitrary amplitude/frequency characteristic;
phase input means for inputting data representing an arbitrary phase/frequency characteristic;
input transfer function operational means for computing a transfer function corresponding to said input amplitude/frequency characteristic and phase/frequency characteristic;
memory means for storing an impulse response waveform of said measurement signal, supplied from said signal input means;
Fourier transform means for deriving the Fourier transform of said impulse response waveform stored in said memory means;

conjugate transfer function operation means for computing the conjugate transfer function of said transfer function derived by said Fourier transform means;

inverse amplitude transfer function operational means for deriving a transfer function in which each amplitude value at each frequency within a frequency range of said transfer function is the inverse of an amplitude value of said transfer function derived by said conjugate transfer function operational means, at that frequency, and in which each phase value at each frequency in said range is unchanged from a phase value of said transfer function derived by said conjugate transfer function operational means, at that frequency;

convolution means for computing the convolution of said transfer function derived by said input transfer function operational means and said transfer function derived by said inverse amplitude transfer function operational means, to derive a set of filter coefficient values in accordance with an impulse response characteristic obtained as a result of said convolution operation; and, setting means for setting into said finite impulse response filter means respective filter coefficients having said coefficient values.

29. A digital equalizer apparatus according to claim 28, in which said convolution means derives the inverse Fourier transform of a transfer function that is derived as the convolution in the time domain of said transfer function obtained by said inverse amplitude transfer function operational means and said transfer function obtained by said input transfer function operational means.

30. A digital equalizer apparatus according to claim 28, in which said convolution means derives the inverse Fourier transforms of both said transfer function that is obtained by said inverse amplitude transfer function operational means and said transfer function obtained by said input transfer function operational means, and derives the convolution of the real components of the resultant inverse Fourier transforms in the time domain.

31. A digital equalizer apparatus according to claim 28, and further comprising window function means for multiplying data stored in said memory means by a predetermined window function, with the Fourier transform of a resultant output from said window function means being derived by said Fourier transform means.

* * * * *

UNITED STATES PATENT AND TRADEMARK OFFICE
CERTIFICATE OF CORRECTION

PATENT NO. : 4,888,808
DATED : December 19, 1989
INVENTOR(S) : Seiichi Ishikawa, et al.

It is certified that error appears in the above-identified patent and that said Letters Patent is hereby corrected as shown below:

Column 10, line 52, should be:

$$Pw_r = -\tan^{-1}\omega C_2(R_1+R_2)/(1-\omega^2 C_1 C_2 R_1 R_2) \quad (5)$$

Column 10, line 56, "w" should be $--\omega--$.

Signed and Sealed this

Fifth Day of May, 1992

Attest:

DOUGLAS B. COMER

*Attesting Officer*     Acting Commissioner of Patents and Trademarks